United States Patent
Akiyama et al.

(10) Patent No.: US 8,679,973 B2
(45) Date of Patent: Mar. 25, 2014

(54) METHOD OF MANUFACTURING SEMICONDUCTOR DEVICE

(75) Inventors: Shinichi Akiyama, Kawasaki (JP); Kazuo Kawamura, Kawasaki (JP); Masanori Uchida, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 257 days.

(21) Appl. No.: 11/870,852

(22) Filed: Oct. 11, 2007

(65) Prior Publication Data

US 2008/0090369 A1 Apr. 17, 2008

(30) Foreign Application Priority Data

Oct. 11, 2006 (JP) ................................ 2006-277424
Mar. 14, 2007 (JP) ................................ 2007-065402

(51) Int. Cl.
*H01L 21/44* (2006.01)

(52) U.S. Cl.
USPC .......................................... 438/664; 438/755

(58) Field of Classification Search
USPC ......... 438/581, 583, 652, 630, 649, 651, 682, 438/683, 664, 755; 257/377, 382, 384, 388, 257/412, 413, 455, 486, 768–770, 757, 257/E21.199
See application file for complete search history.

(56) References Cited

U.S. PATENT DOCUMENTS

| | | | |
|---|---|---|---|
| 6,017,818 A | 1/2000 | Lu | |
| 6,022,805 A | 2/2000 | Sumi | |
| 6,410,430 B1 | 6/2002 | Lee et al. | |
| 6,432,836 B1 | 8/2002 | Watanabe | |
| 6,531,396 B1 * | 3/2003 | Chi et al. | 438/682 |
| 6,586,321 B2 * | 7/2003 | Tai | 438/592 |
| 7,405,131 B2 * | 7/2008 | Chong et al. | 438/300 |
| 2002/0172768 A1 | 11/2002 | Endo et al. | |
| 2003/0080352 A1 * | 5/2003 | Chang et al. | 257/200 |
| 2003/0082880 A1 * | 5/2003 | Yu et al. | 438/299 |
| 2003/0132486 A1 * | 7/2003 | Hsieh et al. | 257/377 |
| 2004/0082167 A1 | 4/2004 | Seo et al. | |
| 2004/0113209 A1 | 6/2004 | Izuha et al. | |
| 2006/0084263 A1 | 4/2006 | Lee et al. | |
| 2006/0266737 A1 * | 11/2006 | Hanestad et al. | 216/96 |
| 2009/0127594 A1 * | 5/2009 | Arunachalam et al. | 257/288 |

FOREIGN PATENT DOCUMENTS

| | | |
|---|---|---|
| JP | 5-500735 A | 2/1993 |
| JP | 06-097111 | 4/1994 |
| JP | 06-56839 B2 | 7/1994 |
| JP | 7-70498 B2 | 7/1995 |

(Continued)

OTHER PUBLICATIONS

Kim, "A Study on the High Temperature Platinum Etching" 1998, IEEE.*

(Continued)

*Primary Examiner* — Leonard Chang
(74) *Attorney, Agent, or Firm* — Fujitsu Patent Center

(57) ABSTRACT

The method of manufacturing the semiconductor device comprises forming a transistor including a gate electrode and a source/drain diffused layer over a semiconductor substrate, forming a nickel platinum film over the semiconductor substrate, covering the gate electrode and the source/drain diffused layer, making a first thermal processing to react the nickel platinum film with the source/drain diffused layer to form a nickel platinum silicide film, and removing an unreacted part of the nickel platinum film using a chemical liquid of 71° C. or more containing hydrogen peroxide.

7 Claims, 57 Drawing Sheets

(56) References Cited

FOREIGN PATENT DOCUMENTS

| JP | 8-78373 A | 3/1996 |
|---|---|---|
| JP | 08-213343 A | 8/1996 |
| JP | 09-139358 | 5/1997 |
| JP | 09-205070 A | 8/1997 |
| JP | 2000-031092 | 1/2000 |
| JP | 2000-100765 A | 4/2000 |
| JP | 2002-118078 A | 4/2002 |
| JP | 2002-124487 A | 4/2002 |
| JP | 2002-124487 A | 4/2002 |
| JP | 2002-141504 | 5/2002 |
| JP | 2002-151428 A | 5/2002 |
| JP | 2002-246328 A | 8/2002 |
| JP | 2002-343790 | 11/2002 |
| JP | 2002-367929 A | 12/2002 |
| JP | 2003-168652 | 6/2003 |
| JP | 2004-356431 A | 12/2004 |
| JP | 2005-011891 A | 1/2005 |
| JP | 2005-019515 A | 1/2005 |
| JP | 2005-019943 A | 1/2005 |
| JP | 2005-129831 A | 5/2005 |
| JP | 2006-013284 A | 1/2006 |

OTHER PUBLICATIONS

Mangelinck et al., "Effect of Co, Pt, and Au additions on the stability and epitaxy of $NiSi_2$ films on (111)Si", Journal of Applied Physics, vol. 84, No. 5, pp. 2583-2590, Sep. 1, 1998 American Institute of Physics.

Teodorescu et al., "In situ transmission electron microscopy study of Ni Silicide phases formed on (001) Si active lines", Journal of Applied Physics, vol. 90, No. 1, pp. 167-174, Jul. 1, 2001, American Institute of Physics.

Sullivan et al., "Control of interfacial morphology: $NiSi_2/Si(100)$", Journal of Applied Physics, vol. 72, No. 2, pp. 478-489, Jul. 15, 1992 American Institute of Physics.

Yu-Jeng Chang et al., "Diffusion layers and the Schottky-barrier height in nickel silicide-silicon interfaces", Physical Review B, vol. 28, No. 10, pp. 5766-5773, Nov. 15, 1983 The American Physical Society.

Grimaldi et al., "Epitaxial $NiSi_2$ formation by pulsed laser irradiation of thin Ni layers deposited on Si substrates", Appl. Phys. Lett. vol. 43, No. 3, pp. 244-246, Aug. 1, 1983.

Ok et al. "Field emission from Ni-disilicide nanorods formed by using implantation of Ni in Si coupled with laser annealing", Applied Physics Letters, vol. 88, No. 043106 (2006) American Institute of Physics.

Boyanov et al., Growth of epitaxial $CoSi_2$ on SiGe(001), Journal of Applied Physics, vol. 86, No. 3, pp. 1355-1362, Aug. 1, 1999 American Institute of Physics.

Baeri et al., "Epitaxial NiSi layers on (111)-oriented Si obtained by pulsed laser irradiation", J. Appl. Phys. vol. 66, No. 5, pp. 861-866, 1989 American Institute of Physics.

Chow et al., "Pulsed laser-induced silicidation on TiN-capped Co/Si bilayers" Journal of Applied Physics, vol. 99, No. 044902-1-044902-6, 2006 American Institute of Physics.

K. Kawamura et al., "Dependence of $CoSi_2$ Sheet on Cobalt Thickness for Gate Lengths of 50 nm or Less", Japanese Journal of Applied Physics, vol. 45, No. 5A, 2006, pp. 3972-3975.

USPTO, (Chang) Final Rejection, Jul. 15, 2013, in child U.S. Appl. No. 13/419,775 [pending].

USPTO, (Chang) Non-Final Rejection, Feb. 5, 2013, in the child U.S. Appl. No. 13/419,775 [pending].

Japanese Office Action mailed Jun. 5, 2012 for corresponding Japanese Application No. 2007-065402, with Partial English-language Translation.

USPTO, [Chang] Non-Final Rejection mailed Oct. 12, 2012, in child U.S. Appl. No. 13/149,775 [pending].

Japanese Office Action mailed Oct. 30, 2012 for corresponding Japanese Application No. 2007-065402, with Partial English-language Translation.

Japanese Office Action mailed Sep. 10, 2013 for corresponding Japanese Application No. 2012-171691, with English-language translation.

Japanese Office Action mailed Sep. 10, 2013 for corresponding Japanese Application No. 2012-171699, with English-language translation.

* cited by examiner

METHOD OF MANUFACTURING SEMICONDUCTOR DEVICE

CROSS REFERENCE TO RELATED APPLICATIONS

This application is based upon and claims the benefit of priorities from the prior Japanese Patent Application No. 2006-277424, filed on Oct. 11, 2006 and the prior Japanese Patent Application No. 2007-065402, filed on Mar. 14, 2007, the entire contents of which are incorporated herein by reference.

BACKGROUND OF THE INVENTION

The present invention relates to a method of manufacturing a semiconductor device, more specifically, a method of manufacturing a semiconductor device in which silicidation is made, and a method of manufacturing a semiconductor device in which a contact plug is formed, connected to a metal silicide film.

As art of making a gate electrode and source/drain diffused layers with low resistivity, the process of forming metal silicide films on the surfaces of them by self-alignment, the so-called salicide (Self-Aligned Silicide) process is known. As metal materials to be reacted with silicon in the salicide process, cobalt (Co), titanium (Ti), nickel (Ni), etc. are known. Among them, nickel silicide is much noted for its advantages of stabilizing the resistance of the gate electrode even when the gate electrode is downsized, etc.

Furthermore, as for nickel silicide, Non-Patent Reference 1 reports that platinum (Pt) is added to nickel silicide to thereby improve the thermal stability.

The nickel silicide with a metal improving the thermal stability such as Pt or others added is formed by silicidation process using a Ni alloy film of an alloy of Ni and a metal such as Pt or others.

In the silicidation process using the Ni alloy film, a Ni alloy film is deposited on a gate electrode and source/drain diffused layers. Then, as required, a protective film of a titanium nitride (TiN) film or others, is deposited on the Ni alloy film.

Then, as the first thermal processing for the silicidation, thermal processing of a relatively low temperature of below 300° C. including 300° C. is made to form silicide films of 2:1 composition ratio of Ni alloy vs. Si ((Ni alloy)$_2$Si films) on the gate electrode and the source/drain diffused layers.

Then, the protective film, and the unreacted part of the Ni alloy film are selectively removed by wet etching.

Then, as the second thermal processing for the silicidation, thermal processing of a relatively high temperature of 300-400° C. is made to thereby form nickel alloy monosilicide films of low resistance on the gate electrodes and the source/drain diffused layers.

On a transistor with the metal silicide films formed on the gate electrode and the source/drain diffused layers by salicide process, an inter-layer insulating film is formed. In the inter-layer insulating film, contact holes are formed down to the metal silicide films. In the contact holes, contact plugs are buried, connected to the metal silicide films. Interconnections formed on the interlayer insulating film are connected, via the contact plugs, to the metal silicide films formed on the gate electrode and the source/drain diffused layers.

Generally, the contact plug is formed of a barrier metal formed in the contact hole, and a buried metal of tungsten or others, buried in the contact hole with the barrier metal formed in (refer to, e.g., Patent References 12 to 14). The barrier metal is formed for stabilizing the contact resistance with respect to the metal silicide film and suppressing the reaction between the metal silicide film and the buried metal and the diffusion of the buried metal. The barrier metal functions also as the adhesion layer for improving the adhesion to the metal silicide film.

Related arts are disclosed in, e.g., Patent References 1 to 14 and Non-Patent References 1 to 10 as listed below.

Patent Reference 1: Japanese published unexamined patent application No. 2002-124487
Patent Reference 2: Japanese published unexamined patent application No. 2005-19943
Patent Reference 3: Japanese published unexamined patent application No. 2005-19515
Patent Reference 4: Japanese translation of PCT international application No. Hei 5-500735
Patent Reference 5: Japanese published unexamined patent application No. 2002-118078
Patent Reference 6: Japanese examined patent application publication No. Hei 7-70498
Patent Reference 7: Japanese published unexamined patent application No. 2004-356431
Patent Reference 8: Japanese published unexamined patent application No. 2002-367929
Patent Reference 9: Japanese published unexamined patent application No. 2006-13284
Patent Reference 10: Japanese published unexamined patent application No. 2002-151428
Patent Reference 11: Japanese published unexamined patent application No. 2005-11891
Patent Reference 12: Japanese published unexamined patent application No. 2005-129831
Patent Reference 13: Japanese published unexamined patent application No. Hei 9-205070
Patent Reference 14: Japanese published unexamined patent application No. Hei 8-213343
Non-Patent Reference 1: D. Mangelinck et al., "Effect of Co, Pt, and Au additions on the stability and epitaxy of NiSi$_2$ films on (111)Si", J. Appl. Phys., Vol. 84, No. 5, pp. 2583-2590 (1998)
Non-Patent Reference 2: V. Teodorescu et al., "In situ transmission electron microscopy study of Ni silicide phases formed on (001) Si active lines", J. Appl. Phys., Vol. 90, No. 1, pp. 167-174 (2001)
Non-Patent Reference 3: J. P. Sullivan et al., "Control of interfacial morphology: NiSi$_2$/Si(100)", J. Appl. Phys., Vol. 72, No. 2, pp. 478-489 (1992)
Non-Patent Reference 4: Y.-J. Chang et al., "Diffusion layers and the Schottky-barrier height in nickel silicide-silicon interfaces", Phys. Rev. B, vol. 28, No. 10, pp. 5766-5773 (1983)
Non-Patent Reference 5: M. G. Grimaldi et al., "Epitaxial NiSi$_2$ formation by pulsed laser irradiation of thin Ni layers deposited on Si substrates", Appl. Phys. Lett., Vol. 43, No. 3, pp. 244-246 (1983)
Non-Patent Reference 6: Y.-W. Ok et al., "Field emission from Ni-disilicide nanorods formed by using implantation of Ni in Si coupled with laser annealing", Appl. Phys. Lett., Vol. 88, 043106 (2006)
Non-Patent Reference 7: B. I. Boyanov et al., "Growth of epitaxial CoSi$_2$ on SiGe(001)", J. Appl. Phys., Vol. 86, No. 3, pp. 1355-1362 (1999)
Non-Patent Reference 8: P. Baeri et al., "Epitaxial NiSi layers on <111>-oriented Si obtained by pulsed laser irradiation", J. Appl. Phys., Vol. 66, No. 2, pp. 861-866 (1989)
Non-Patent Reference 9: F. L. Chow et al., "Pulsed laser-induced silicidation on TiN-capped Co/Si bilayers", J. Appl. Phys., Vol. 99, 044902 (2006)

Non-Patent Reference 10: K. Kawamura et al., "Dependence of $CoSi_2$ Sheet Resistance on Cobalt Thickness for Gate Lengths of 50 nm or Less", Jpn. J. Appl. Phys., Vol. 45, No. 5A, pp. 3972-3975 (2006)

However, platinum is solved generally only in aqua regia, which is a solution of concentrated hydrochloric acid and concentrated nitric acid mixed by about 3:1 volume ratio. Accordingly, when a nickel platinum film used in the silicidation is removed by the same process as a nickel film without platinum added, the platinum resides on the substrate. The platinum residue affects the characteristics of MOS transistors, etc. formed on the substrate.

When the nickel platinum film is removed with aqua regia, which is very corrosive, a chemical liquid treating apparatus and a waste liquid treating apparatus specialized for aqua regia are necessary.

In forming the nickel silicide film on the source/drain diffused layer of a transistor, when the gate width W of the transistor is as small as, e.g., below 1 μm including 1 μm, nickel disilicide ($NiSi_2$) crystals grow in spikes below the silicide film down near the junction part of the source/drain diffused layer, and the junction leak current is often increased. Even in using a Ni alloy film, such as a NiPt film or others, for the silicidation, it is often difficult to suppress the growth of the $NiSi_2$ crystals in spikes.

When the silicidation using a Ni film or a Ni alloy film is made, low-temperature process must be used so as to suppress the agglomeration of the silicide film. However, when the barrier metal forming the contact plugs are formed by the conventional deposition process, the contact resistance is increased, and the scatter of the contact resistance is often increased.

SUMMARY OF THE INVENTION

According to one aspect of the present invention, there is provided a method of manufacturing a semiconductor device comprising the steps of: forming a transistor including a gate electrode and a source/drain diffused layer over a semiconductor substrate; forming a nickel platinum film over the semiconductor substrate, covering the gate electrode and the source/drain diffused layer; making a first thermal processing to react the nickel platinum film with the source/drain diffused layer to form a nickel platinum silicide film; and removing an unreacted part of the nickel platinum film using a chemical liquid of above 71° C. including 71° C. containing hydrogen peroxide.

According to further another aspect of the present invention, there is provided a method of manufacturing a semiconductor device comprising the steps of: forming a transistor including a gate electrode and a source/drain diffused layer over a semiconductor substrate; forming a nickel alloy film over the semiconductor substrate, covering the gate electrode and the source/drain diffused layer; making a flash lamp annealing or a laser annealing to react the nickel alloy film with the source/drain diffused layer to form a nickel alloy silicide film; and removing an unreacted part of the nickel alloy film.

According to further another aspect of the present invention, there is provided a method of manufacturing a semiconductor device comprising the steps of: forming a transistor including a gate electrode and a source/drain diffused layer over a semiconductor substrate; forming a nickel alloy film over the semiconductor substrate, covering the gate electrode and the source/drain diffused layer; making a thermal processing to react the nickel alloy film with the source/drain diffused layer to form a nickel alloy silicide film; removing an unreacted part of the nickel alloy film; and making a flash lamp annealing or a laser annealing on the nickel alloy silicide film.

According to further another aspect of the present invention, there is provided a method of manufacturing a semiconductor device comprising the steps of: forming a transistor including a gate electrode and a source/drain diffused layer on a semiconductor substrate; forming a metal layer film of a nickel film and a metal film laid on each other over the semiconductor substrate, covering the gate electrode and the source/drain diffused layer; making a flash lamp annealing or a laser annealing to alloy the metal layer film to form a nickel alloy film; and making a thermal processing to react the nickel alloy film with the source/drain diffused layer to form a nickel alloy silicide film.

According to further another aspect of the present invention, there is provided a method of manufacturing a semiconductor device comprising the steps of: forming a metal silicide film over a semiconductor substrate; forming an inter-layer insulating film over the semiconductor substrate with the metal silicide film formed over; forming an opening in the inter-layer insulating film down to the metal silicide film; forming a Ti film in the opening by CVD using $TiCl_4$ gas as a raw material gas; forming a TiN film on the Ti film by MOCVD; and burying a contact plug in the opening with a barrier metal formed of the Ti film and the TiN film formed in.

BRIEF DESCRIPTION OF THE DRAWINGS

FIG. 52 is diagrammatic plan views showing the gate, the source and the drain of the PMOS transistor the $I_{on}$-$I_{off}$ curved was measured on.

DETAILED DESCRIPTION OF THE PREFERRED EMBODIMENTS

A First Embodiment

Before the method of manufacturing the semiconductor device according to the present invention is explained, the silicidation process using a nickel platinum (NiPt) film will be explained with reference to FIGS. 47A-47C, 48A-48B and 49A-49C.

FIGS. 47A-48C and 48A-48B are sectional views showing the steps of a proposed method of manufacturing a semiconductor device (Part 1).

First, on a silicon substrate 200, a MOS transistor 216 including a gate electrode 206 and source/drain diffused layers 214 is formed by the usual MOS transistor manufacturing method.

Figure 47A:
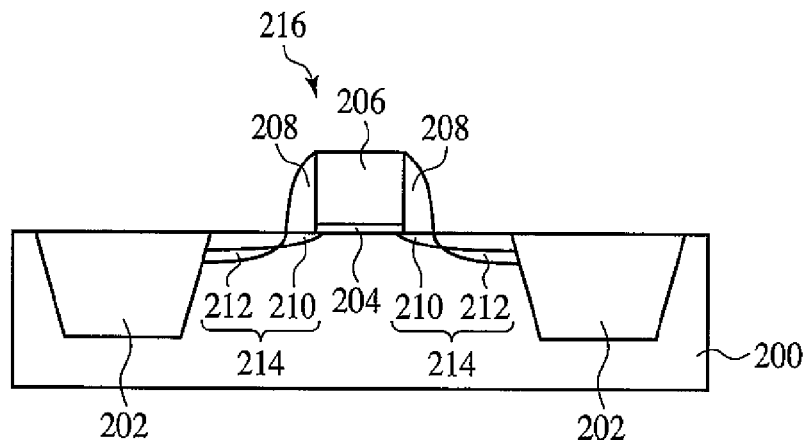
FIGS. 47A-47C and 48A-48B are sectional views showing the steps of the silicidation process using the nickel platinum film in which one-step thermal processing is made.

FIG. 47A illustrates the MOS transistor formed on the silicon substrate 200. As illustrated, a device region is defined by a device isolation region 202 on the semiconductor substrate 200. On the silicon substrate 200 with the device region defined, the gate electrode 206 of a polysilicon film is formed with a gate insulating film 204 formed therebetween. A sidewall insulating film 208 is formed on the side walls of the gate electrode 206. In the silicon substrate 200 on both sides of the gate electrode 206, the source/drain diffused layers 214 each formed of a shallow impurity diffused region 210 forming the extension region of the extension source/drain structure, and a deep impurity diffused region 212 are formed. Thus, the MOS transistor 216 including the gate electrode 206 and the source/drain diffused layer 214 is formed on the silicon substrate 200.

Figure 47B:
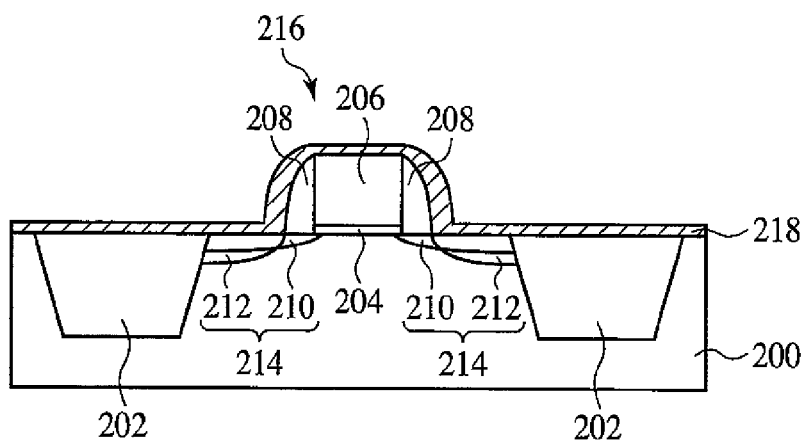

Then, a NiPt film 218 is formed on the entire surface by, e.g., sputtering (see FIG. 47B).

Figure 47C:
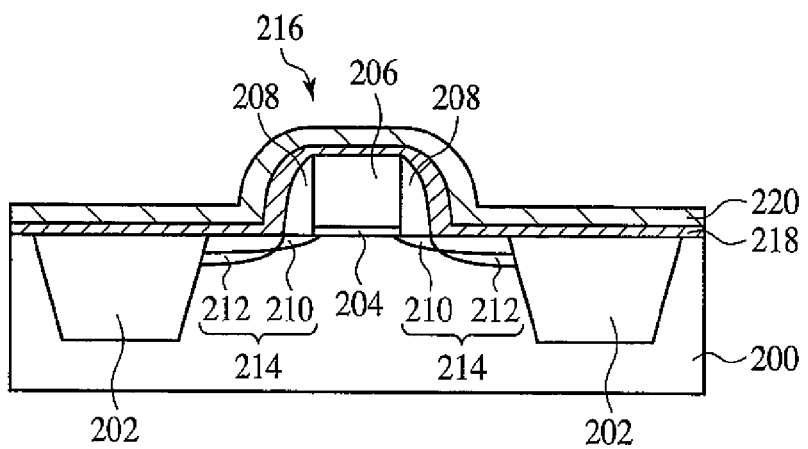

Next, on the NiPt film 218, a protective film 220 of a titanium nitride (TiN) film, a titanium (Ti) film or others is formed on the NiPt film 218 by, e.g., sputtering (see FIG. 47C). The formation of the protective film is not essential to form the silicide and is made as required.

Then, the thermal processing for the silicidation is made by, e.g., RTA (Rapid Thermal Annealing). This thermal processing reacts the NiPt in the lower part of the NiPt film 218 with the Si in the upper part of the gate electrode 206 and reacts the NiPt in the lower part of the NiPt film 218 with the Si in the upper parts of the source/drain diffused layers 214.

In this silicidation reaction, on the initial stage of the thermal processing, a nickel platinum silicide film of dinickel platinum silicide ($Ni_2$(Pt)Si) phase is formed, and finally a nickel platinum silicide film of nickel platinum monosilicide (Ni(Pt)Si) phase is formed.

Figure 48A:
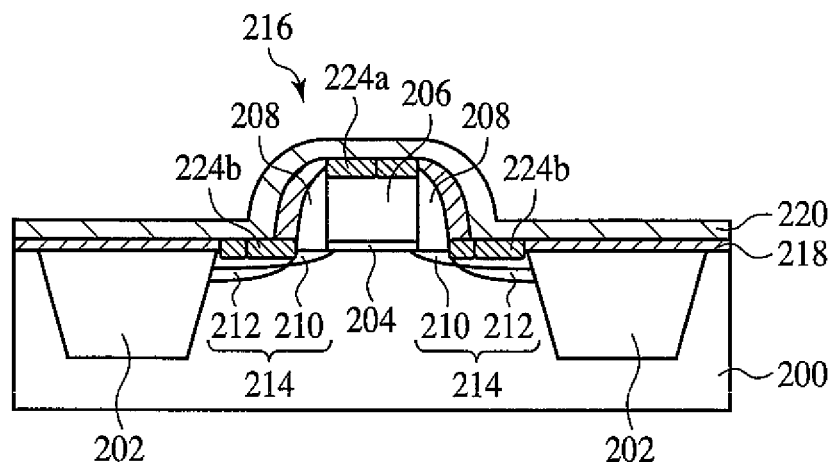

Here, the conditions for the thermal processing for the silicidation are suitably set to thereby form the Ni(Pt)Si film 224a on the gate electrode 206, and the Ni(Pt)Si films 224b on the source/drain diffused layers 214 (see FIG. 48A).

Figure 48B:
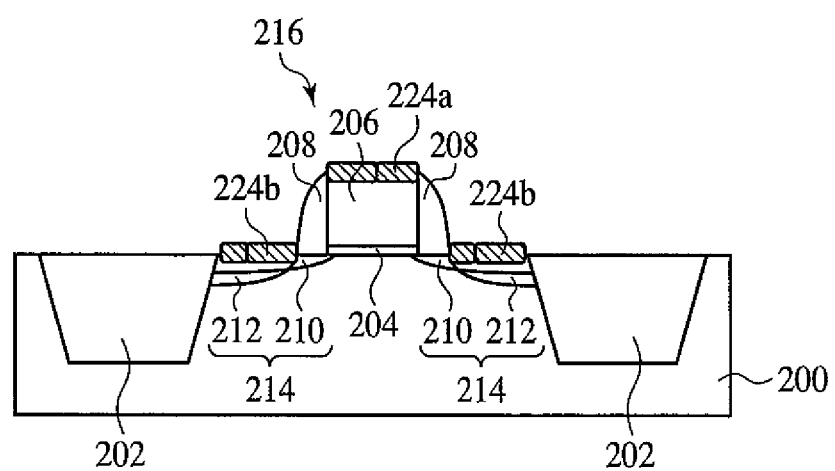

Then, by wet etching using aqua regia, the protective film 220 and the unreacted part of the NiPt film 218 are respectively selectively removed (see FIG. 48B).

Thus, the Ni(Pt)Si film 224a is formed on the gate electrode 206, and the Ni(Pt)Si films 224b are formed on the source/drain diffused layers 214.

Figure 49A:
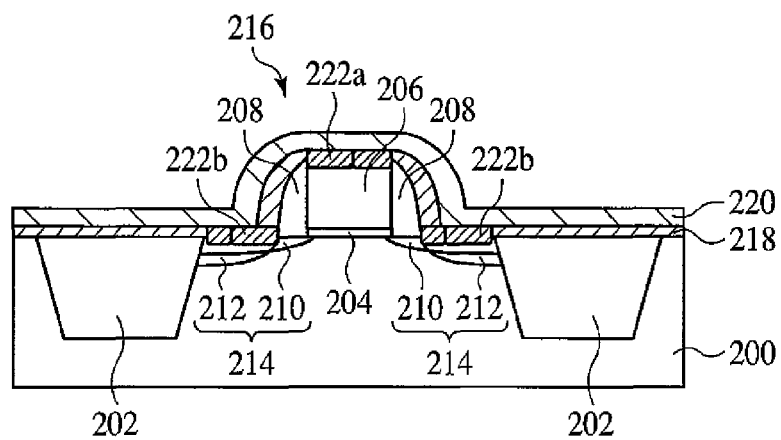
FIGS. 49A-49C are sectional views showing the steps of the silicidation process using the nickel platinum film in which two-step thermal processing is made.
Figure 49B:
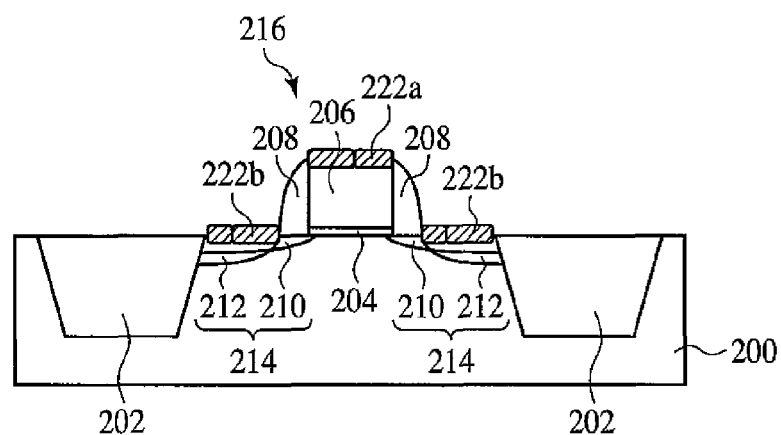
Figure 49C:
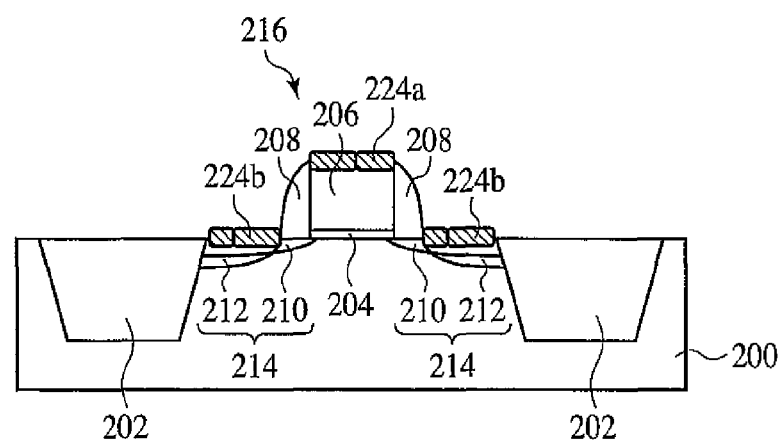

It is also proposed to make the silicidation by two-step thermal processing in the silicidation process using NiPt film. FIGS. 49A-49C are sectional views showing the steps of a proposed method of manufacturing a semiconductor device (Part 2).

First, in the same way as in the steps of FIGS. 47A to 47C, the NiPt film 218 and the protective film 220 are respectively formed on the silicon substrate 200 with the MOS transistor 216 formed on.

Then, as the first thermal processing for the silicidation, thermal processing is made by, e.g., RTA. This thermal processing reacts the NiPt in the lower part of the NiPt film 218 with the Si in the upper part of the gate electrode 206 and reacts the NiPt in the lower part of the NiPt layer 218 with the Si in the upper parts of the source/drain diffused layers 214.

Here, the conditions for the first thermal processing are suitably set to thereby form a $Ni_2(Pt)Si$ film 222a on the gate electrode 206 and a $Ni_2(Pt)Si$ films 222b on the source/drain diffused layers 214 (see FIG. 49A).

Then, by wet etching using aqua regia, the protective film 220 and the unreacted part of the NiPt film 218 are respectively selectively removed (see FIG. 49B).

Then, as the second thermal processing for the silicidation, thermal processing by, e.g., RTA is made. This thermal processing reacts the $Ni_2(Pt)Si$ in the $Ni_2(Pt)Si$ film 222a and the Si in the upper part of the gate electrode 206 and reacts the $Ni_2(Pt)Si$ in the $Ni_2(Pt)Si$ film 222b with the Si in the upper parts of the source/drain diffused layers 214. Thus, the Ni(Pt) Si film 224a is formed on the gate electrode 206, and the Ni(Pt)Si films 224b are formed on the source/drain diffused layers 214 (see FIG. 49C).

As described above, in the two-step thermal processing, the $Ni_2(Pt)Si$ films 222a, 222b are formed by the first thermal processing, and the Ni(Pt)Si films 224a, 224b are formed by the second thermal processing made after the unreacted part of the NiPt film 218 has been removed.

As described above, in the proposed methods of manufacturing semiconductor devices, aqua regia is used to remove the unreacted part of the nickel platinum film. However, aqua regia is very corrosive, and when the unreacted nickel platinum film is removed with aqua regia, a chemical liquid treating apparatus and a waste liquid treating apparatus specialized for aqua regia is necessary.

The inventors of the present application made earnest studies and have invented a method of manufacturing a semiconductor device which can selectively remove the unreacted part of the nickel platinum film without using aqua regia. In a first to a third embodiments, the method of manufacturing the semiconductor device according to the present invention which can selectively remove the unreacted part of the nickel platinum film without using aqua regia will be detailed.

Figure 6:
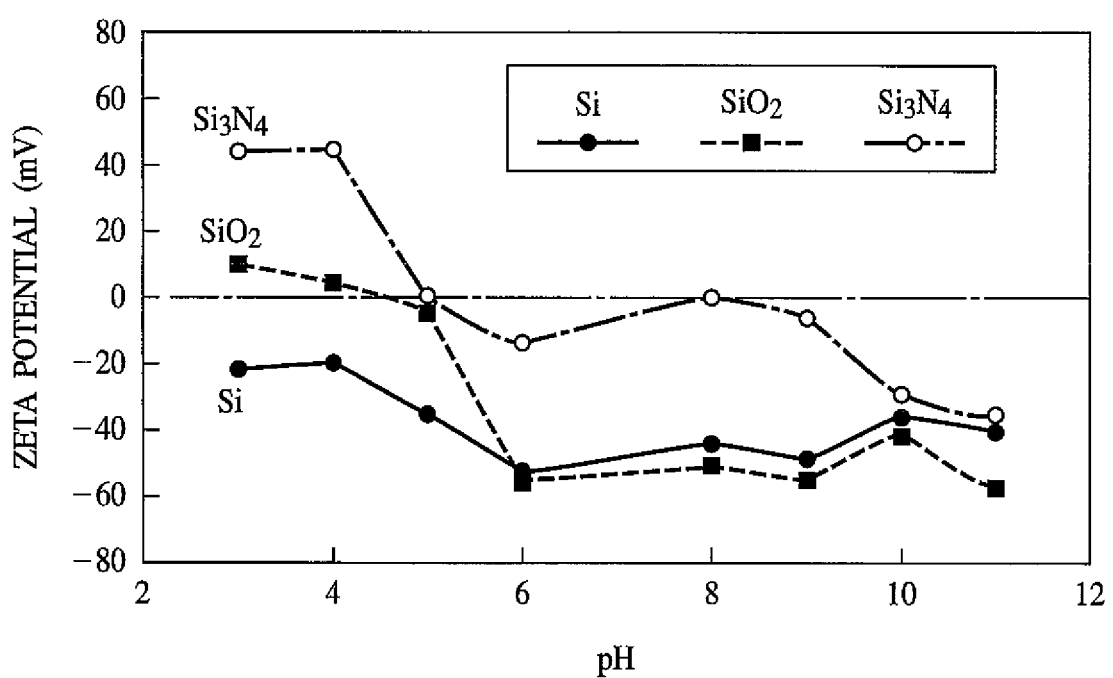
FIG. 6 is a graph of the relationships between the zeta potential of the materials such as Si, etc. in the solution with the pH of the solution.
Figure 7:
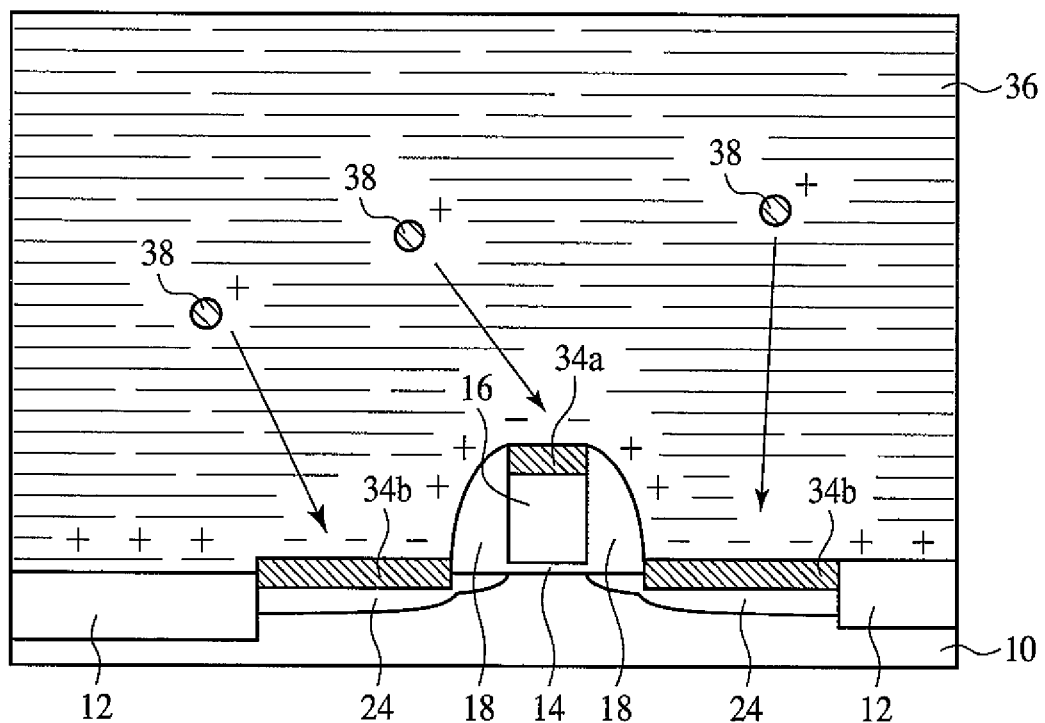
FIG. 7 is a diagrammatic sectional view showing the mechanism of the adhesion of residues of the Pt.
Figure 8:
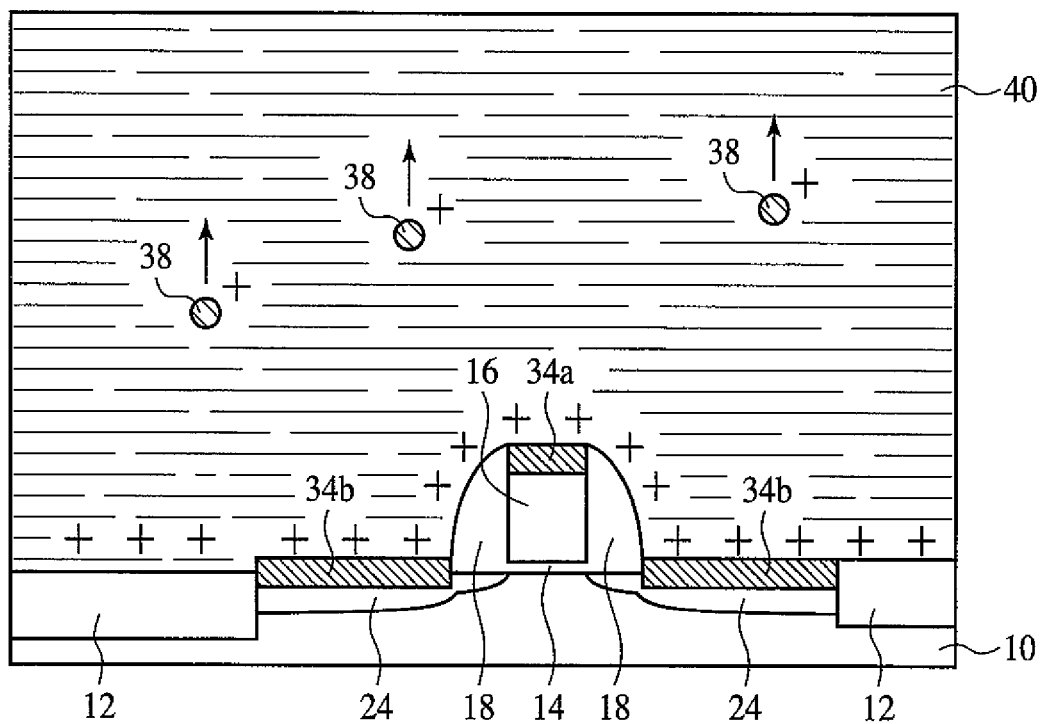
FIG. 8 is a diagrammatic sectional view showing the principle of the present invention.
Figure 9:
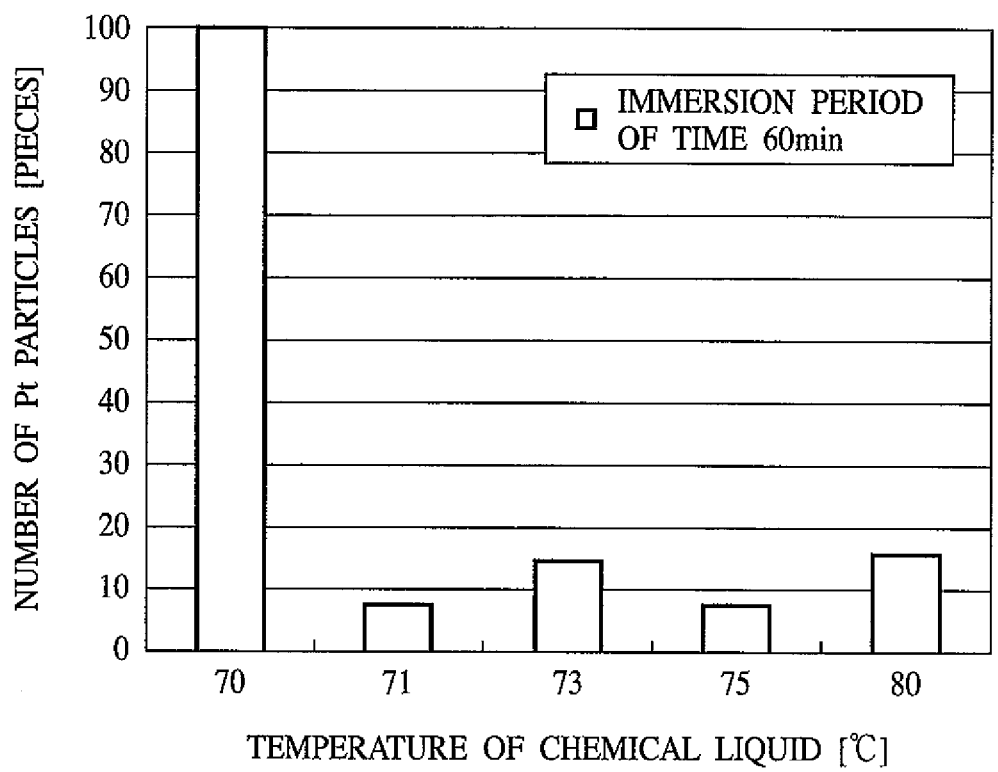
FIG. 9 is a graph of the relationship between the temperature of the chemical liquid containing hydrogen peroxide and the number of the Pt particles adhering to the substrate surface.
Figure 10:
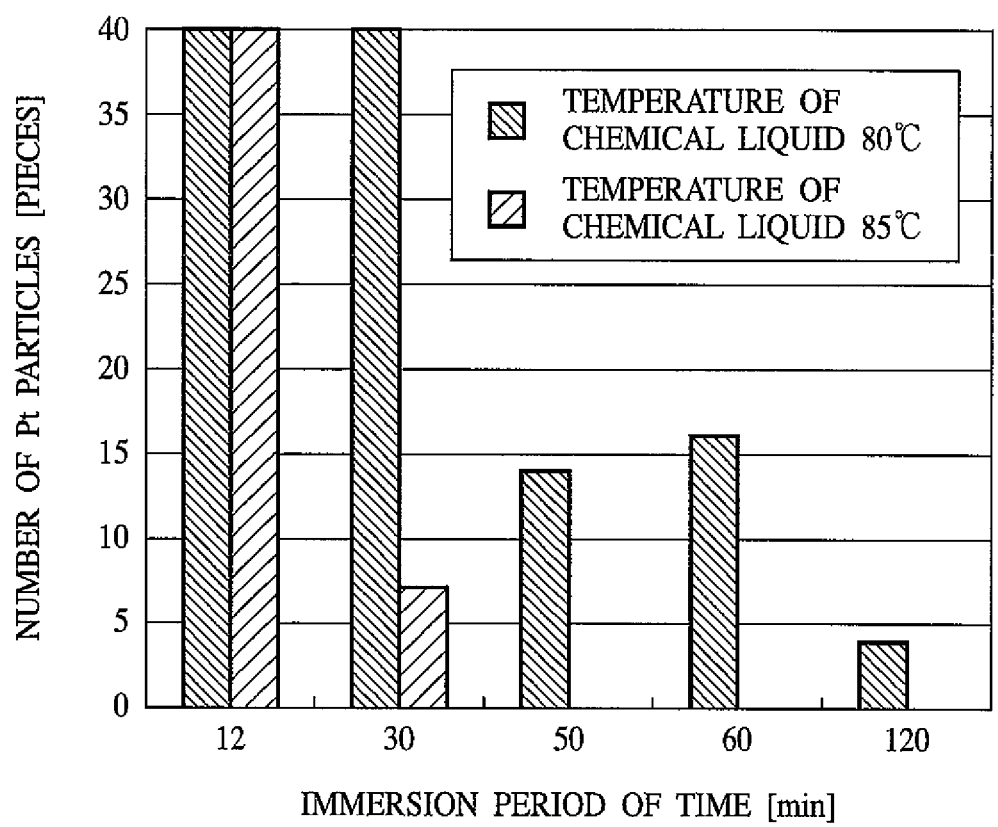
FIG. 10 is a graph of the relationship between the period of time for which the substrate is immersed in the chemical liquid containing hydrogen peroxide and the number of the Pt particles adhering to the substrate surface.
Figure 11:
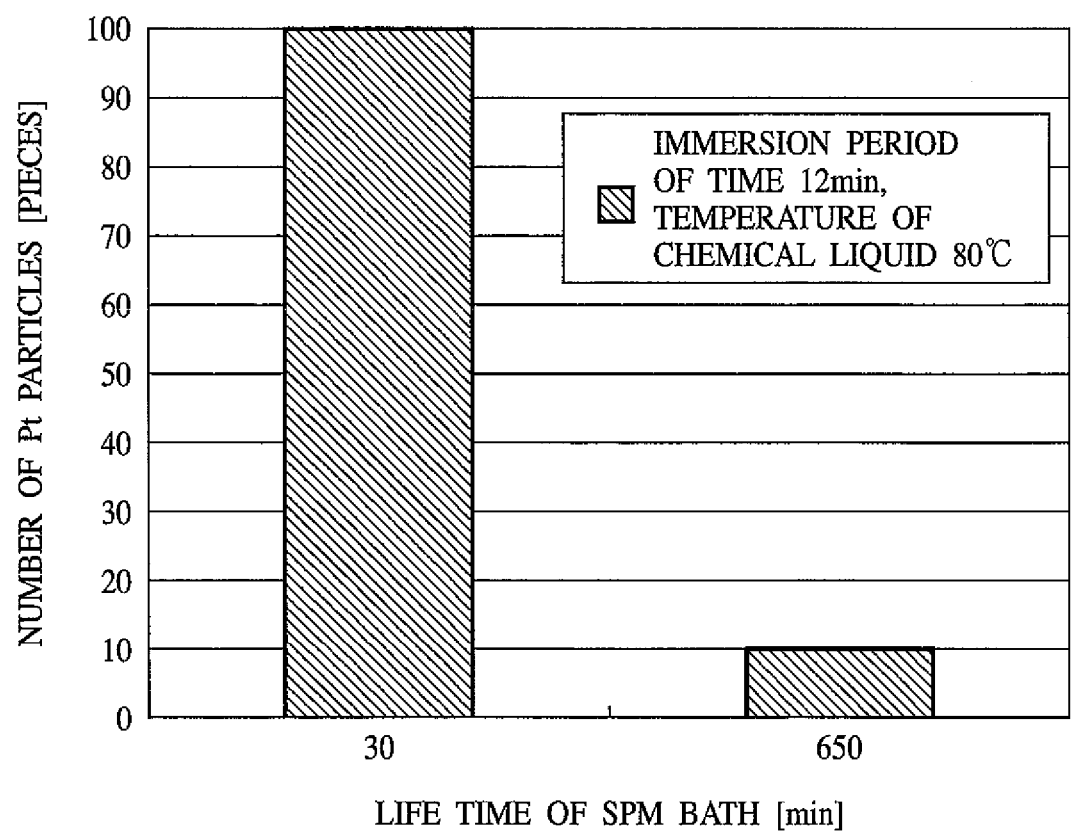
FIG. 11 is a graph of the relationship between the lifetime of the SPM bath and the number of the Pt particles adhering to the substrate surface.

First, the method of manufacturing the semiconductor device according to a first embodiment of the present invention will be explained with reference to FIGS. 1A to 13. FIGS. 1A-1C, 2A-2C, 3A-3C and 12A-12C are sectional views showing the steps of the method of manufacturing the semiconductor device according to the present embodiment. FIGS. 4A-4C are plan views showing SEM (Scanning Electron Microscope) images of the Ni(Pt)Si film after the unreacted part of the NiPt film has been removed in the method of manufacturing the semiconductor device according to the present embodiment. FIGS. 5A-5G are plan view showing SEM images of the Ni(Pt)Si film after the unreacted part of the NiPt film has been removed by wet etching using relatively low-temperature HPM liquid. FIG. 6 is a graph of the relationships between the zeta potential of the materials such as Si, etc. in the solution with the pH of the solution. FIG. 7 is a diagrammatic sectional view showing the mechanism of the adhesion of residues of the Pt. FIG. 8 is a diagrammatic sectional view showing the principle of the present invention. FIG. 9 is a graph of the relationship between the temperature of the chemical liquid containing hydrogen peroxide and the Pt particle number adhering to the substrate surface. FIG. 10 is a graph of the relationship between the period of time during which the substrate is immersed in the chemical liquid containing hydrogen peroxide and the number of the Pt particles adhering to the substrate surface. FIG. 11 is a graph of the relationship between the lifetime of the SPM bath and the number of the Pt particles adhering to the substrate surface. FIG. 13 is a graph of the result of the evaluation of the method of manufacturing the semiconductor device according to the present embodiment.

First, on a silicon substrate 10 with a prescribed conduction-type well (not illustrated) formed in, a device isolation region 12 of silicon oxide film is formed by, e.g. STI (Shallow Trench Isolation). The device isolation region 12 defines a device region where a MOS transistor is to be formed.

Then, on the silicon substrate 10, a gate insulating film 14 of a silicon oxide film of, e.g., a 2 nm-thickness is formed by, e.g., thermal oxidation. The gate insulating film 14 is formed of a silicon oxide film but is not formed essentially of a silicon oxide film. The gate insulating film 14 can be formed of suitably of any other insulating film.

Next, a polysilicon film 16 of, e.g., a 100 nm-thickness is formed on the entire surface by, e.g., CVD (Chemical Vapor Deposition).

Next, a dopant impurity is implanted into the polysilicon film 16 by, e.g., ion implantation. When an NMOS transistor is formed, the n-type dopant impurity is, e.g., phosphorus, the conditions for the ion implantation are, e.g., a 10 keV acceleration voltage and a $1\times10^{16}$ $cm^{-2}$ dose. When a PMOS transistor is formed, the p-type dopant impurity is, e.g., boron, and the conditions for the ion implantation are a 5 keV acceleration voltage and a $5\times10^{15}$ $cm^{-2}$ dose.

Figure 1A:
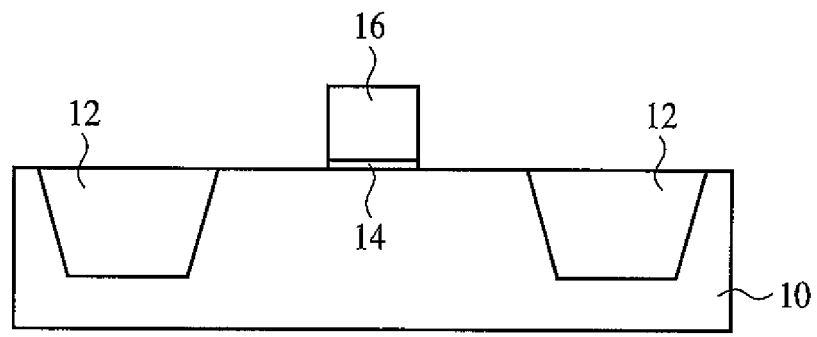
FIGS. 1A-1C, 2A-2C, 3A-3C and 12A-12C are sectional views showing the steps of the method of manufacturing the semiconductor device according to a first embodiment of the present invention.

Next, the polysilicon film 16 is patterned by photolithography and dry etching to form a gate electrode 16 of the polysilicon film (see FIG. 1A).

Then, with the gate electrode 16 as the mask, a dopant impurity is implanted into the silicon substrate 10 on both sides of the gate electrode 16 by, e.g., ion implantation. When an NMOS transistor is formed, the n-type dopant impurity is, e.g., arsenic, and the conditions for the ion implantation are, e.g., a 1 keV acceleration voltage and a $1\times10^{15}$ $cm^{-2}$ dose. When a PMOS transistor is formed, the p-type dopant impurity is, e.g., boron, and the conditions for the ion implantation are, e.g., a 0.5 keV and a $1\times10^{15}$ $cm^{-2}$. Thus, shallow impurity diffused regions 20 forming the extension regions of the extension source/drain structure are formed (see FIG. 1B).

Next, a silicon oxide film 18 of, e.g., a 100 nm-thickness is formed on the entire surface by, e.g., CVD.

Then, the silicon oxide film 18 is anisotropically etched by, e.g., RIE (Reactive Ion Etching). Thus, a sidewall insulating film 18 of the silicon oxide film is formed on the side walls of the gate electrode 16 (see FIG. 1C). The sidewall insulating film 18 is formed of a silicon oxide film but is not essentially a silicon oxide film. The sidewall insulating film 18 can be formed suitably of any other insulating film.

Then, with the gate electrode 16 and the sidewall insulating film 18 as the mask, a dopant impurity is implanted into the silicon substrate 10 on both sides of the gate electrode 16 and the sidewall insulating film 18 by, e.g., ion implantation. When an NMOS transistor is formed, the n-type dopant impurity is, e.g., phosphorus, and the conditions for the ion implantation are, e.g., an 8 keV acceleration voltage and a $1\times10^{16}$ $cm^{-2}$ dose. When a PMOS transistor is formed, the p-type dopant impurity is, e.g., boron, and the conditions for the ion implantation are, e.g., a 5 keV acceleration voltage and a $5×10^{15}$ cm$^{-2}$ dose. Thus, impurity diffused regions 22 forming the deep regions of source/drain diffused layers are formed.

Then, the dopant impurities implanted into the impurity diffused regions 20, 22 are activated by prescribed thermal processing.

Figure 2A:
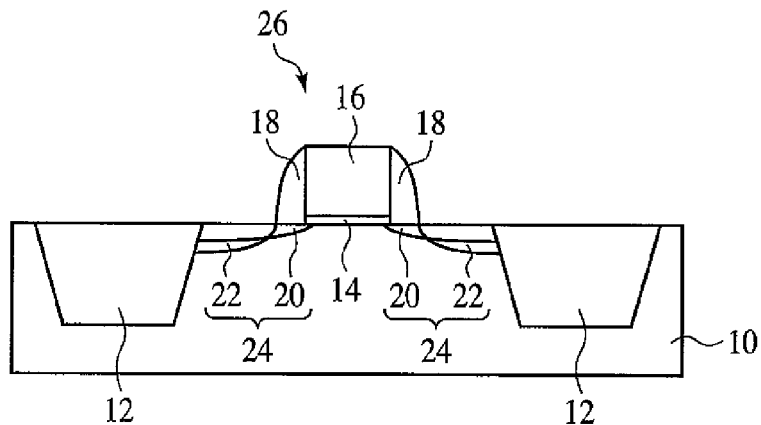

Thus, in the silicon substrate 10 on both sides of the gate electrode 16, source/drain diffused layers 24 each formed of the extension region, i.e. the shallow impurity diffused region 20 and the deep impurity diffused region 22 are formed (see FIG. 2A).

Thus, on the silicon substrate 10, a MOS transistor 26 including the gate electrode 16 and the source/drain diffused layers 24 is formed.

Next, the natural oxide film formed on the surface of the gate electrode 16 and the surface of the source/drain diffused layers 24 is removed by, e.g., dilute hydrofluoric acid processing.

Figure 2B:
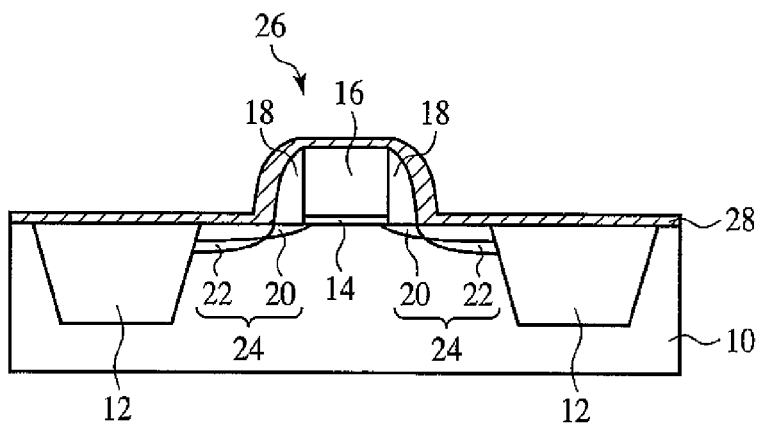

Then, a NiPt film 28 of, e.g., a 5-30 nm-thickness is formed on the entire surface by sputtering using, e.g., a nickel (Ni) target with platinum (Pt) added (see FIG. 2B). The composition ratio of the Pt in the target is, e.g., 1-10 atom %. When the NiPt film 28 is formed by using such target, the composition ratio of the Pt in the NiPt film 28 is, e.g., about 1-10 atom %.

Figure 2C:
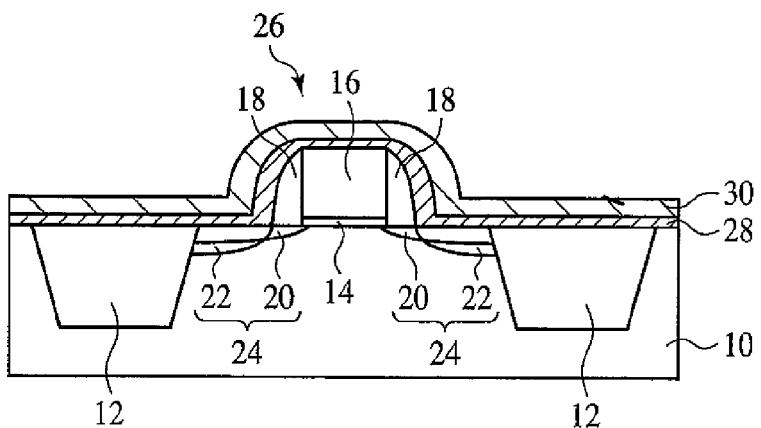

Then, on the NiPt film 28, a protective film 30 of a TiN film of, e.g., a 5-30 nm-thickness is formed by, e.g., sputtering (see FIG. 2C). The protective film 30 is for preventing the oxidation of the NiPt film 28. The protective film 30 also prevents the oxidation of a nickel platinum silicide film which will be formed in a later step. The protective film 30 is not essentially a TiN film and can be a Ti film of, e.g., a 5-30 nm-thickness.

Next, as the thermal processing for the silicidation, thermal processing is made by, e.g., RTA. This thermal processing reacts the NiPt in the NiPt film 28 with the Si in the upper part of the gate electrode 16 and reacts the NiPt in the NiPt film 28 with the Si in the upper part of the source/drain diffused layers 24.

In this silicidation reaction, on the initial stage of the thermal processing, a nickel platinum silicide film of Ni$_2$(Pt)Si phase is formed, and finally a nickel platinum silicide film of Ni(Pt)Si phase is formed.

Figure 3A:
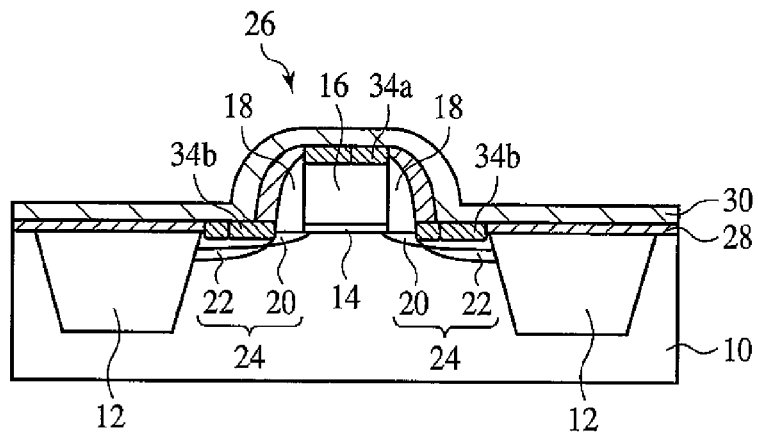
Figure 4A:
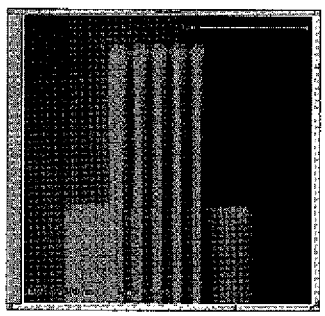
FIGS. 4A-4C are plan views showing SEM images of the Ni(Pt)Si film after the unreacted part of the NiPt film has been removed in the method of manufacturing the semiconductor device according to the first embodiment of the present invention.
Figure 4B:
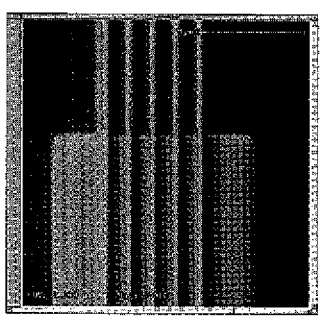
Figure 4C:
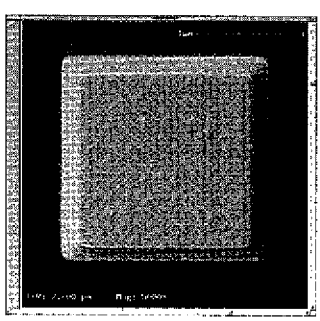

Here, the conditions for the thermal processing for the silicidation reaction are suitably set to thereby form the Ni(Pt)Si film 34a on the gate electrode 16 and the Ni(Pt)Si films 34b on the source/drain diffused layers 24 (see FIG. 3A). The thermal processing conditions are, e.g., 300-500° C. and 30 seconds.

Figure 3B:
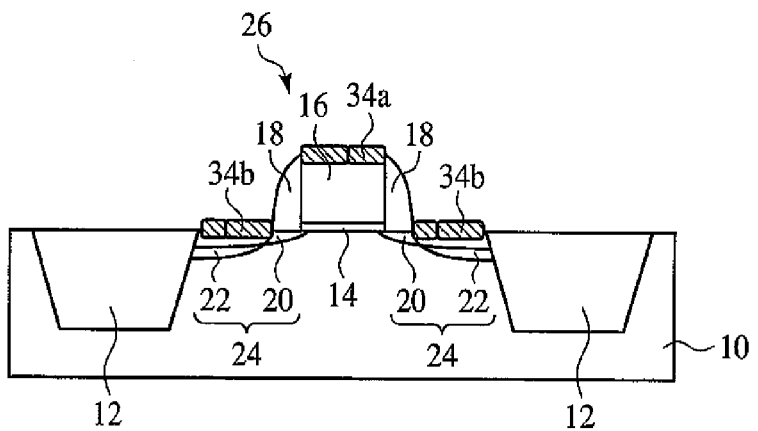

Then, by wet etching using a relatively high-temperature chemical liquid containing hydrogen peroxide, the protective film 30 and the unreacted part of the NiPt film 28 are respectively selectively removed (see FIG. 3B). In the present embodiment, the relatively high-temperature chemical liquid containing hydrogen peroxide is used, whereby the oxide film of Si will be formed on the surface of the Ni(Pt)Si films 34a, 34b. The oxide film of Si formed on the surface of the Ni(Pt)Si films 34a, 34b in the present embodiment will be detailed later.

The chemical liquid containing hydrogen peroxide is, e.g., SPM (Sulfuric acid-Hydrogen Peroxide Mixture) liquid, which is a mixed chemical liquid of sulfuric acid and hydrogen peroxide. The weight % concentration of the sulfuric acid of the SPM liquid is, e.g., 50-95%, and the weight % concentration of the hydrogen peroxide of the SPM liquid is, e.g., 5-50%.

In place of SPM liquid, HPM (Hydrochloric acid-Hydrogen Peroxide Mixture) liquid, which is a mixed chemical liquid of hydrochloric acid, hydrogen peroxide and water, may be used. The weight % concentration of the hydrochloric acid of the HPM liquid is, e.g., 0.1-25%, the weight % concentration of the hydrogen peroxide of the HPM liquid is, e.g., 0.1-25%, and the weight % concentration of water of the HPM liquid is, e.g., 50-99.8%.

In place of SPM liquid, APM (Ammonia-Hydrogen Peroxide Mixture) liquid, which is a mixed chemical liquid of ammonia, hydrogen peroxide and water, may be used. The weight % concentration of the ammonia (NH$_4$OH) of the APM liquid is, e.g., 0.1-25%, the weight % concentration of the hydrogen peroxide of the APM liquid is, e.g., 0.1-25%, and the weight % concentration of the water of the APM liquid is, e.g., 50-99.8%.

The temperature of the chemical liquid is set at a relatively high temperature of, e.g., 71-150° C. The reason for setting the temperature of the chemical liquid at 71-150° C. will be detailed later. The period of time for which the substrate is immersed in the chemical liquid for etching off the NiPt film 28 is set at, e.g., 12-60 minutes.

As described above, the method of manufacturing the semiconductor device according to the present embodiment is characterized mainly in that the unreacted part of the NiPt film 28 is removed with a relatively high-temperature chemical liquid containing hydrogen peroxide.

FIGS. 4A to 4C are plan views showing SEM images of the Ni(Pt)Si film after the unreacted part of the NiPt film has been removed in the method of manufacturing the semiconductor device according to the present embodiment. To remove the NiPt film, SPM liquid of 80° C. is used. In FIGS. 4A to 4C, the region of the dark color tone is the device isolation region of silicon oxide film, and the region of the light color tone is the gate electrode of polysilicon film or the silicon substrate in the device region with Ni(Pt)Si film formed on.

As evident from the SEM images shown in FIGS. 4A to 4C, the method of manufacturing the semiconductor device according to the present embodiment removes the unreacted part of the NiPt film without Pt residues on the silicon substrate and the gate electrode.

FIGS. 5A to 5G are plan view showing SEM images of the Ni(Pt)Si film after the unreacted part of the NiPt film has been removed by wet etching using relatively low-temperature HPM liquid. To remove the NiPt film, HPM liquid of 65° C. is used. In FIGS. 5A to 5G, the region of the dark color tone is the device isolation region of silicon oxide film, and the region of the light color tone is the gate electrode of polysilicon film or the silicon substrate in the device region with Ni(Pt)Si film formed.

Figure 5A:
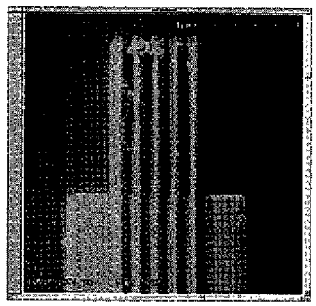
FIGS. 5A-5G are plan views showing SEM images of the Ni(Pt)Si film after the unreacted part of the NiPt film has been removed by wet etching using relatively low-temperature HPM liquid.
Figure 5B:
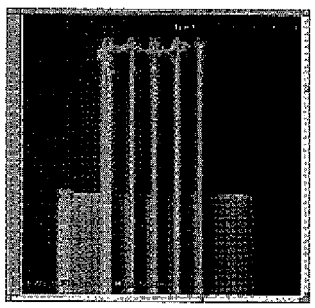
Figure 5C:
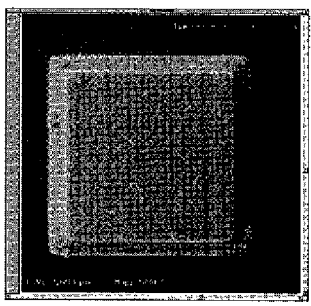
Figure 5D:
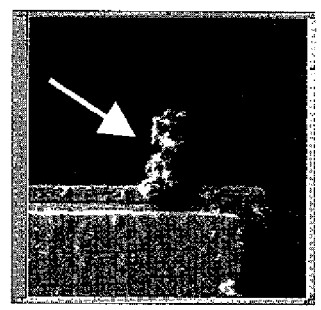
Figure 5E:
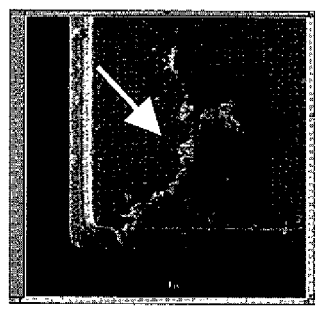
Figure 5F:
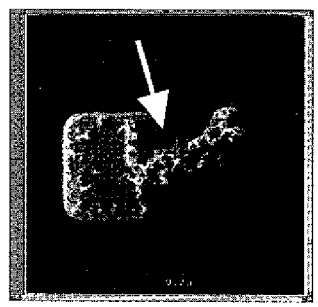
Figure 5G:
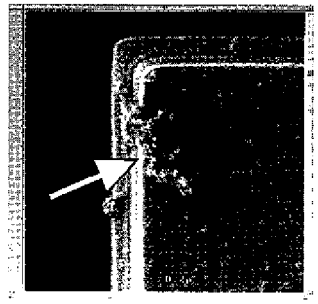

FIGS. 5A to 5C show the SEM images of the regions corresponding to the regions of the present embodiment shown in FIGS. 4A to 4C. As evident from the comparison between FIGS. 5A to 5C and FIGS. 4A to 4C, when the HPM liquid of 65° C. was used to remove the NiPt film, the Pt residues, which did not generated in the present embodiment, were generated.

FIGS. 5D to 5G show the SEM images of the enlarged Pt residues. As indicated by the arrows in these SEM images, the Pt residues were generated on the gate electrode and the silicon substrate in the device region with the Ni(Pt)Si film formed on.

Here, the mechanism of the Pt residues adhering as shown in FIGS. 5A-5G will be explained and the principle of the present invention, which can remove the NiPt film without generating such Pt residues will be explained with reference to FIGS. 6 to 8.

On the surface of the silicon substrate having the unreacted part of the NiPt film removed, silicon oxide film, silicon nitride film, polysilicon film, silicon substrate, Ni(Pt)Si film, etc. are mixedly present.

FIG. 6 is a graph of the relationships between the zeta potential of materials, such as Si, etc., in the solutions, and the pH of the solutions. This was reported by M. Itano et al. (refer to M. Itano et al., J. Electrochem. Soc., Vol. 142, Issue 3, pp. 971-978 (1995)).

The pHs of the SPM liquid and the HPM liquid of the above-described composition ratios are below 4 including 4. As evident from the graph of FIG. 6, in the SPM liquid and the HPM liquid, $SiO_2$ and $Si_3N_4$ have plus zeta potentials, but Si has minus zeta potential. The silicide, which is formed on the Si, has minus zeta potential, as does the Si.

On the other hand, when the NiPt film has been removed with an acid chemical liquid, the Pt particles present in the acid chemical liquid are charged plus.

FIG. 7 illustrates the charged state of the surface of the silicon substrate in a low-temperature acid chemical liquid when the NiPt film has been removed with the acid chemical liquid.

As illustrated, the surface of the device isolation region 12 of $SiO_2$, the surface of the sidewall insulating film 18 of $SiO_2$ are charged respectively plus. In contrast to this, the surface of the Ni(Pt)Si film 34a, the surface of the Ni(Pt)Si film 34b are charged respectively minus. The Pt particles present in the acid chemical liquid 36 are charged plus.

Accordingly, the Pt particles 38 charged plus are attracted to the Ni(Pt)Si film 34a, 34b charged minus due to the Coulomb attractive force. Thus, the Pt residues adhere to the Ni(Pt)Si film 34a, 34b. In the SEM images of FIGS. 5A-5G, more Pt residues are observed on the gate electrode and the silicon substrate in the device region with the Ni(Pt)Si film formed on in comparison with the Pt residues in the device isolation region of silicon oxide film, because Pt residues adhere due to the Coulomb attractive force.

In the present embodiment, the unreacted part of the NiPt film 28 is removed with a relatively high-temperature chemical liquid containing hydrogen peroxide.

FIG. 8 illustrates the charged state of the surface of the silicon substrate in a relatively high-temperature acid chemical liquid containing hydrogen peroxide when the unreacted part of the NiPt film has been removed with the acid chemical liquid.

As illustrated, the surface of the device isolation region of $SiO_2$ and the surface of the sidewall insulating film 18 of $SiO_2$ are charged respectively plus in the acid chemical liquid 40.

In the present embodiment, the acid chemical liquid 40 used in removing the unreacted part of the NiPt film is of relatively high temperature, and the hydrogen peroxide contained in the acid chemical liquid 40 will form an oxide film of Si on the surface of the Ni(Pt)Si film 34a, 34b. The oxide film of Si formed on the surface of the Ni(Pt)Si film 34a, 34b is charged plus in the acid chemical liquid 40.

Thus, in the present embodiment, the oxide film of Si, which is charged plus as is the Pt particles 38, will be formed on the surface of the Ni(Pt)Si film 34a, 34b. Accordingly, the adhesion of Pt particles 38 to the surface of the Ni(Pt)Si film 34a, 34b is hindered by the Coulomb repulsive force.

The acid chemical liquid 40 is set at a relatively high temperature, which increases the heat diffusion of the Pt particles 38. Such increase of the heat diffusion of the Pt particles 38 also hinders the adhesion of the Pt particles 38 to the surface of the Ni(Pt)Si film 34a, 34b.

When relatively high-temperature APM liquid is used as the chemical liquid containing hydrogen peroxide, the adhesion of the Pt particles to the surface of the Ni(Pt)Si film 34a, 34b is hindered by a mechanism which is different from that for using SPM liquid and HPM liquid. That is, in APM liquid, which is alkaline, the potentials of the silicon oxide film, the silicon nitride film, the polysilicon film, the silicon substrate and the Ni(Pt)Si film are minus. The Pt particles present in APM liquid are also charged minus. The Coulomb repulsive force generated in such charged state hinders the adhesion of the Pt particles to the surface of the Ni(Pt)Si film.

In comparison between HPM liquid and SPM liquid, HPM liquid is abler to remove NiPt film than SPM liquid.

As described above, in the present embodiment, the unreacted part of the NiPt film 28 is removed with the relatively high-temperature chemical liquid containing hydrogen peroxide, whereby the adhesion of the Pt residues to the Ni(Pt)Si film 34a, 34b is hindered.

Then, conditions for the chemical liquid processing for removing the unreacted part of the NiPt film will be explained with reference to FIGS. 9, 10 and 11.

First, the temperature of the chemical liquid containing hydrogen peroxide will be explained with reference to FIG. 9.

FIG. 9 is a graph of the relationship between the temperature of the chemical liquid containing hydrogen peroxide and the number of the Pt particles adhering to the substrate surface. In FIG. 9, as the sample, a NiPt film deposited on a thermal oxide film formed on a silicon substrate was used. The NiPt film of the sample was removed with SPM liquid as the chemical liquid containing hydrogen peroxide, and the numbers of the Pt particles adhering to the substrate surface were measured. The period of time for which the substrate was immersed in the chemical liquid was 60 minutes, and the weight % concentration of the sulfuric acid was about 80%. The weight % concentration of the sulfuric acid will be detailed later.

As evident from the graph of FIG. 9, the temperature of the chemical liquid containing hydrogen peroxide is set at above 71° C. including 71° C., whereby the adhesion of Pt particles to the substrate surface can be sufficiently suppressed. In the graph, for 70° C. of the chemical liquid, the number of Pt particles is indicated up to 100 pieces, but actually, tens of thousands of Pt particles adhered to the substrate surface.

It is preferable to set the temperature of the chemical liquid containing hydrogen peroxide at below 150° C. including 150° C. This is so as to prevent the hydrogen peroxide, whose boiling point is 151.4° C., contained in the chemical liquid from being boiled and lost from the chemical liquid.

Then, the period of time for which the substrate is immersed in the chemical liquid containing hydrogen peroxide to remove the NiPt film will be explained with reference to FIG. 10.

FIG. 10 is a graph of the relationship between the period of time for which the substrate is immersed in the chemical liquid containing hydrogen peroxide and the number of the Pt particles adhering to the substrate surface. In FIG. 10, as the sample, a NiPt film deposited on a thermal oxide film formed on a silicon substrate was used as in FIG. 9. For this sample, the NiPt film was removed with SPM liquid as the chemical liquid containing hydrogen peroxide, and the numbers of the Pt particles adhering to the substrate surface were measured. The measurements were made with the chemical liquid temperature set at 80° C. and the immersion period of time set at 12 minutes, 30 minutes, 50 minutes and 60 minutes, and the chemical liquid temperature set at 85° C. and the immersion period of time set at 12 minutes and 30 minutes. The weight % concentration of the sulfuric acid was about 80%.

As evident from the graph of FIG. 10, when the immersion period of time is relatively as short as 12 minutes, many Pt particles adhered to the substrate surface both with the chemical liquid temperature set at 80° C. and 85° C. In the graph, the Pt particle number is indicated up to 40 pieces for 12 minutes of immersion period of time. Both with the chemical liquid temperature set at 80° C. and 85° C., actually tens of thousands of Pt particles adhered to the substrate.

In contrast to this, when the immersion period of time was set at 30 minutes, with the chemical liquid temperature set at 80° C., many Pt particles adhered to the substrate surface, but with the chemical liquid temperature set at 85° C., the adhesion of the Pt particles to the substrate surface was sufficiently suppressed. Thus, it is evident that when the chemical liquid temperature is set at 85° C., with 50 minutes or more immersion period of time, the adhesion of the Pt particles to the substrate surface is sufficiently suppressed, and no measurement was made.

Furthermore, when the chemical liquid temperature is set at 80° C., and the immersion period of time is more than 50 minutes including 50 minutes, the adhesion of the Pt particles to the substrate surface is sufficiently suppressed. Thus, the period of time for which the substrate is immersed in the chemical liquid is suitably set at, e.g., more than 30 minutes including 30 minutes, corresponding to a temperature of the chemical liquid containing hydrogen peroxide, whereby the adhesion of the Pt particles to the substrate surface can be sufficiently suppressed.

FIGS. 9 and 10 show the cases that the NiPt film was removed with SPM liquid, but when the NiPt film is removed with RPM liquid and APM liquid, the chemical liquid temperature is set at above 71° C. including 71° C., as with SPM liquid, whereby the adhesion of the Pt particles to the substrate surface can be sufficiently suppressed.

Then, the relationships among the lifetime of the SPM bath, the sulfuric acid weight % concentration and the number of the Pt particles adhering to the substrate surface will be explained with reference to FIG. 11.

When the SPM bath is let to stand at high temperatures, the sulfuric acid weight % concentration gradually decreases due to evaporation, etc. Hydrogen peroxide, which is volatile, is periodically supplied to the vessel. The sulfuric acid concentration was measured by titration after about 30 minutes of standing period of time, i.e., immediately after the liquid mixture, and about 700 minutes of standing period of time, and the respective sulfuric acid weight % concentrations were 80.1% and 70.4%. Here, when the hydrogen peroxide weight % concentration of the SPM liquid, which is a mixed liquid of sulfuric acid and hydrogen peroxide, is calculated simply based on the sulfuric acid weight % concentrations given by the titration, the hydrogen peroxide weight % concentration for about 80% sulfuric acid weight % concentration can be approximated to about 20% and the hydrogen peroxide weight % concentration for about 70% sulfuric acid weight % concentration can be approximated to about 30%.

Next, the numbers of the Pt particles measured with the chemical liquid temperature set at 80° C., the immersion period of time at 12 minutes and the chemical liquid standing period of time at 30 minutes and at 650 minutes, i.e., about 70% sulfuric acid weight % concentration and 80% sulfuric acid weight % concentration measured by the above-described titration are shown in FIG. 11. In the 30 minutes chemical liquid standing period of time, many Pt particles adhered to the substrate surface, but in the 650 minutes chemical liquid standing period of time, the adhesion of the Pt particles to the substrate surface is sufficiently suppressed. That is, the measurement result by the titration shows that as the hydrogen peroxide weight % concentration is higher, the particle suppression is more effective. Thus, for example, the sulfuric acid weight % concentration of the sulfuric acid hydrogen peroxide mixture liquid is set suitably at below 80% including 80% corresponding to the temperature of the chemical liquid containing hydrogen peroxide and the period of time for which the substrate is immersed in the chemical liquid, whereby the adhesion of the Pt particles to the substrate surface can be sufficiently suppressed.

Thus, the generation of the Pt residues is prevented while the unreacted part of the NiPt film 28 is removed (see FIG. 3B). As described above, the oxide film of Si will be formed on the surface of the Ni(Pt)Si film 34a, 34b after the NiPt film 28 has been removed.

Then, a silicon nitride film 44 of, e.g., an 80 nm-thickness is formed on the entire surface by, e.g., plasma CVD.

The oxide film, which seems to have been formed by the processing using the chemical liquid containing hydrogen peroxide, is as thin as below 1 nm including 1 nm, and is considered to be present in the interface between the Ni(Pt)Si film 34a, 34b and the silicon nitride film 44 but is difficult to be confirmed even with a transmission electron microscope.

Then, on the silicon nitride film 44, a silicon oxide film 46 of, e.g., a 600 nm-thickness is formed by, e.g., plasma CVD.

Figure 3C:
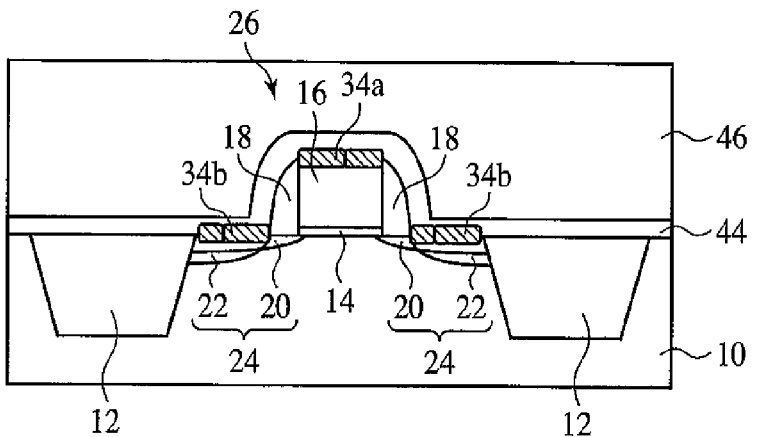

Next, the silicon oxide film 46 is planarized by, e.g., CMP (see FIG. 3C).

Figure 12A:
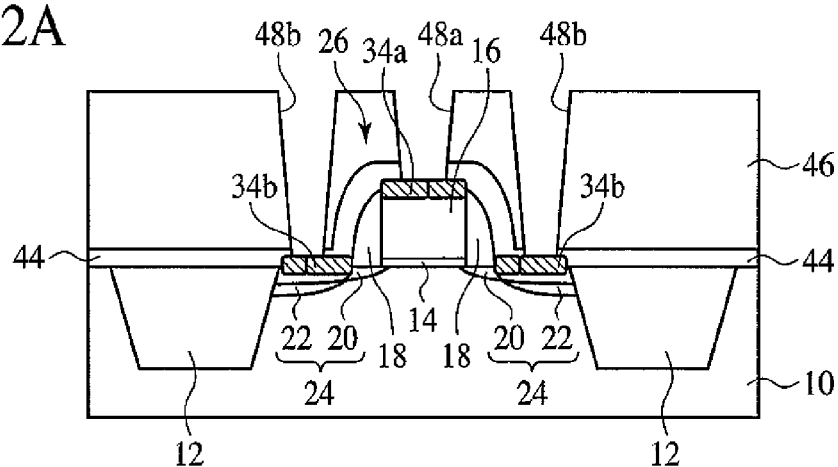
Figure 12B:
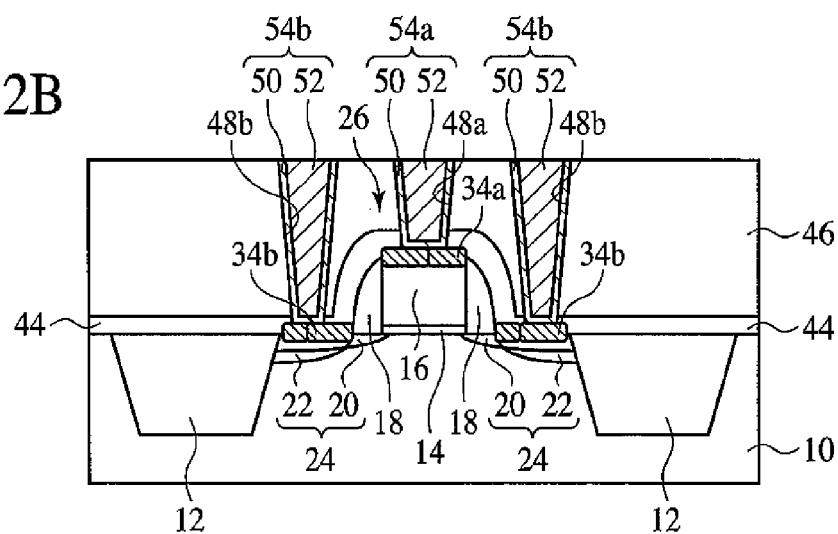
Figure 13:
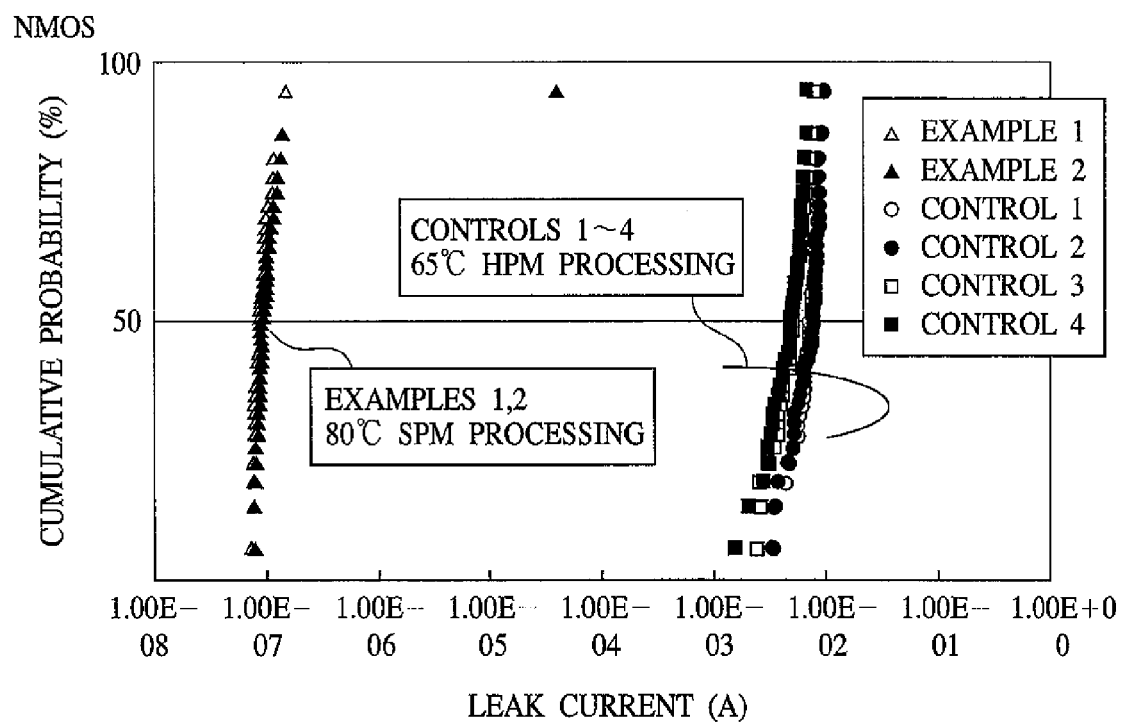
FIG. 13 is a graph of the result of the evaluation of the method of manufacturing the semiconductor device according to the first embodiment of the present invention.

Then, by photolithography and dry etching, a contact hole 48a and contact holes 48b are formed in the silicon oxide film 46 and the silicon nitride film 44 respectively down to the Ni(Pt)Si film 34a and down to the Ni(Pt)Si films 34b (see FIG. 12A).

Next, on the silicon oxide film 46 with the contact holes 48a, 48b formed in, a barrier metal 50 of, e.g., a 5 nm-thickness titanium film and, e.g., a 5 nm-thickness titanium nitride film is formed by, e.g., sputtering.

Next, on the barrier metal 50, a tungsten film 52 of, e.g., a 200 nm-thickness is formed by, e.g., CVD.

Next, the tungsten film 52 and the barrier metal 50 are polished by, e.g., CMP until the surface of the silicon oxide film 46 is exposed. Thus, contact plugs 54a, 54b of the barrier metal 50 and the tungsten film 52 are formed respectively in the contact holes 48a, 48b (see FIG. 12B).

Next, an inter-layer insulating film 56 is formed on the entire surface.

Figure 12C:
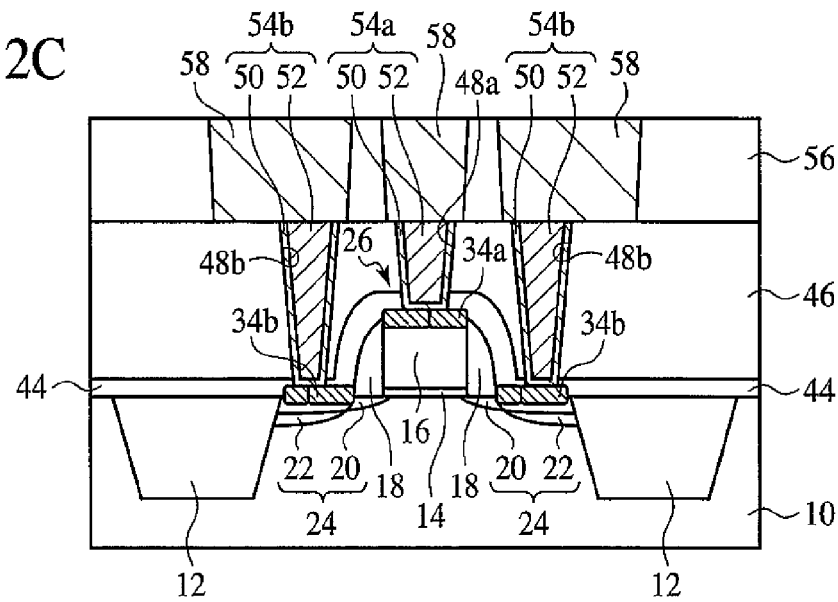

Then, by, e.g., damascene process, an interconnection layer 58 is formed, buried in the inter-layer insulating film 56 and connected to the contact plugs 54a, 54b (see FIG. 12C).

(Evaluation Result)

The evaluation result of the method of manufacturing the semiconductor device according to the present embodiment will be explained with reference to FIG. 13.

The leak current between the gate and the source was measured for MOS transistors manufactured by the method of manufacturing the semiconductor device according to the present embodiment.

FIG. 13 is a graph of the result of the measured leak current. In Examples 1 and 2 and Controls 1-4 described below, the leak current was measured on a plurality of samples, and the cumulative probabilities were plotted. The leak current is taken on the horizontal axis of the graph, and the cumulative probability is taken on the vertical axis.

In FIG. 13, the plots indicated by the Δ marks indicate the measurement result of Example 1, i.e., the semiconductor device manufactured by the method of manufacturing the semiconductor device to the present embodiment. In Example 1, the unreacted NiPt film was removed with SPM liquid of 80° C. and about 70% sulfuric acid weight % concentration and for 12 minutes immersion period of time.

In FIG. 13, the plots indicated by the ▲ marks indicate the measurement result of Example 2. In Example 2, samples were manufactured on a wafer different from that of Example 1, and the unreacted NiPt film was removed in the same way as in Example 1.

In FIG. 13, the plots indicated by the ○ marks indicate the measurement result of Control 1 in which the unreacted NiPt film was removed with HPM liquid of 65° C. and for 1 minute immersion period of time.

In FIG. 13, the plots indicated by the ● marks indicate the measurement result of Control 2. In Control 2, samples were manufactured on a wafer different from that of Control 1, and the unreacted NiPt film was removed in the same way as in Control 1.

In FIG. 13, the plots indicated by the □ marks indicate the measurement result of Control 3 in which the unreacted NiPt film was removed with HPM liquid of 65° C. and for 3 minutes immersion period of time.

In FIG. 13, the plots indicated by the ■ marks indicate the measurement result of Control 4. In Control 4, samples were manufactured on a wafer different from that of Control 3, and the unreacted NiPt film was removed in the same way as in Control 3.

As evident from the comparison among the respective plots shown in FIG. 13, Examples 1 and 2 have much smaller leak current than Controls 1 to 4. The leak current is very small in Controls 1 and 2, because the unreacted NiPt film was removed without Pt residues adhering to the substrate. In contrast to this, in Controls 1 to 4, Pt residues adhere between the source/drain, and resultantly, the leak current is large in comparison with Examples 1 and 2.

As described above, according to the present embodiment, the unreacted part of the NiPt film is removed with the relatively high-temperature chemical liquid containing hydrogen peroxide, whereby oxide film will be formed on the surface of the nickel platinum silicide film. Accordingly, in the present embodiment, in the chemical liquid, only the constituent member which is charged with the same polarity as platinum particles is exposed on the silicon substrate. The constituent member exposed on the silicon substrate and the Pt particles are charged with the same polarity in the chemical liquid, whereby, according to the present embodiment, the adhesion of the Pt residues to the silicon substrate is prevented while the unreacted part of the NiPt film can be selectively removed. As described above, the method of manufacturing the semiconductor device according to the present embodiment can selectively remove the unreacted part of the nickel platinum without using aqua regia and can prevent the adhesion of the Pt residues to the semiconductor substrate.

(A Modification)

Figure 14A:
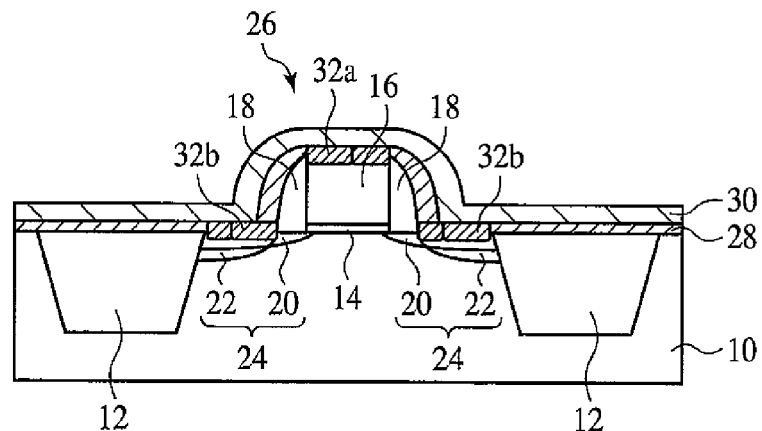
FIGS. 14A-14C are sectional views showing the steps of the method of manufacturing the semiconductor device according to a modification of the first embodiment of the present invention.
Figure 14B:
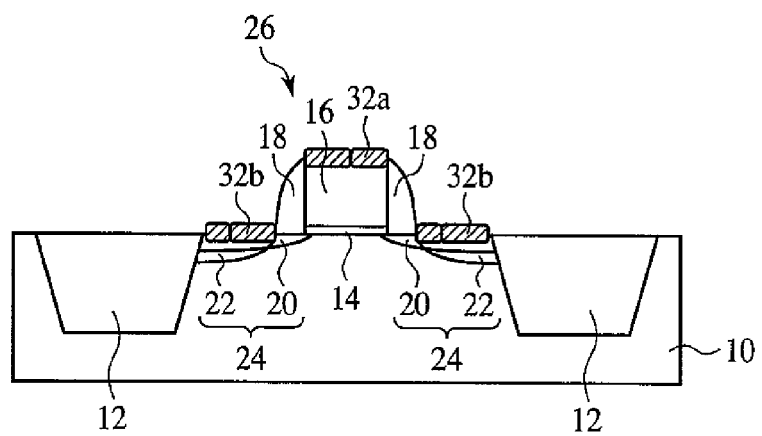
Figure 14C:
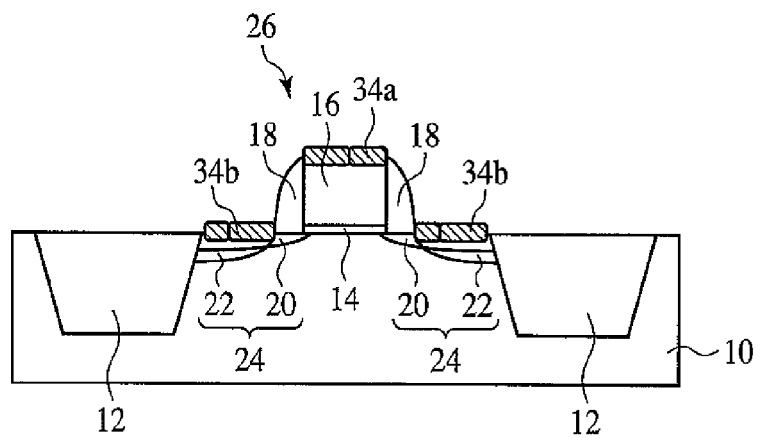

The method of manufacturing the semiconductor device according to a modification of the present embodiment will be explained with reference to FIGS. 14A-14C. FIGS. 14A-14C are sectional views showing the steps of the method of manufacturing the semiconductor device according to the present modification.

In the above, the one-step thermal processing is made by the silicidation process using NiPt film. In the method of manufacturing the semiconductor device according to the present modification, two-step thermal processing is made in the silicidation process using NiPt film.

First, in the same way as shown in FIGS. 1A to 2C, the NiPt film 28 and the protective film 30 are formed on the silicon substrate 10 with the MOS transistor 26 formed on.

Then, as the first thermal processing for the silicidation, thermal processing is made by, e.g., RTA. This thermal processing reacts the NiPt of the NiPt film 28 with the Si of the upper part of the gate electrode 16 and the NiPt of the NiPt film 28 with the Si of the upper parts of the source/drain diffused layers 24.

Here, the conditions for the first thermal processing for the silicidation are suitably set, whereby the $Ni_2(Pt)Si$ film 32a is formed on the gate electrode 16 and the $Ni_2(Pt)Si$ films 32b are formed on the source/drain diffused layers 24. (see FIG. 14A). The conditions for the first thermal processing are, e.g., 200-400° C. and 30-300 seconds.

Then, in the same way as described above, the protective film 30 and the unreacted part of the NiPt film 28 are respectively selectively removed with the relatively high-temperature chemical liquid containing hydrogen peroxide (see FIG. 14B). At this time, oxide film of Si will be formed on the surface of the $Ni_2(Pt)Si$ film 32a, 32b due to the hydrogen peroxide contained in the relatively high-temperature chemical liquid.

Then, as the second thermal processing for the silicidation, thermal processing is made by, e.g., RTA. This thermal processing reacts the $Ni_2(Pt)Si$ of the $Ni_2(Pt)Si$ film 32a with the Si of the upper part of the gate electrode 16 and the $Ni_2(Pt)Si$ of the $Ni_2(Pt)Si$ films 32b with the Si in the upper parts of the source/drain diffused layers 24.

Here, the conditions for the second thermal processing for the silicidation are suitably set, whereby the Ni(Pt)Si film 34a is formed on the gate electrode 16 and the Ni(Pt)Si films 34b are formed on the source/drain diffused layers 24 (see FIG. 14C). That is, the second thermal processing for the silicidation transforms the nickel platinum silicide film 32a, 32b of dinickel platinum silicide phase to the nickel platinum silicide film 34a, 34b of nickel platinum monosilicide phase. The conditions for the second thermal processing are, e.g., 300-500° C. and 30 seconds.

The oxide film, which seems to have been formed by the processing using the chemical liquid containing hydrogen peroxide, is as thin as below 1 nm including 1 nm, and it is difficult to discriminate the oxide film from the Ni(Pt)Si film 34a, 34b even with, e.g., a transmission electron microscope.

Thus, by the two-step thermal processing, the Ni(Pt)Si film 34a is formed on the gate electrode 16, and the Ni(Pt)Si films 34b are formed on the source/drain diffused layers 24.

The following steps are the same as described above, and their explanation will not be repeated.

As in the present modification, the two-step thermal processing may be made to form the Ni(Pt)Si films 34a, 34b in the silicidation process using NiPt film.

A Second Embodiment

The method of manufacturing the semiconductor device according to a second embodiment of the present invention will be explained with reference to FIGS. 15A to 18B. FIGS. 15A-15C, 16A-16C, 17A-17C and 18A-18B are sectional views showing the steps of the method of manufacturing the semiconductor device according to the present embodiment. The same members of the present embodiment as those of the method of manufacturing the semiconductor device according to the first embodiment are represented by the same reference numbers not to repeat or to simplify their explanation.

The method of manufacturing the semiconductor device according to the present embodiment is characterized mainly in that compressive strain is introduced into the channel region of a PMOS transistor.

Figure 1B:
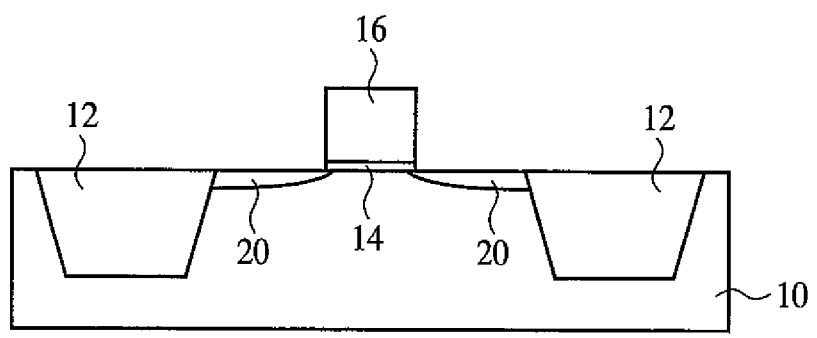
Figure 1C:
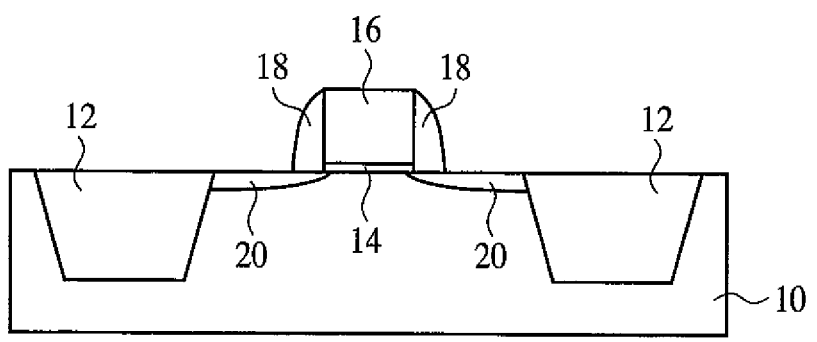

First, in the same way as in the method of manufacturing the semiconductor device according to the first embodiment shown in FIGS. 1A and 1B, in an NMOS transistor-to-be-formed region 60 defined by a device isolation region 12 formed in a silicon substrate 10, the members up to n-type shallow impurity diffused layers 20n forming the extension regions are formed. In a PMOS transistor-to-be-formed region 62 defined by the device isolation region 12, the members up to p-type shallow impurity diffused layers 20p forming the extension regions are formed.

Figure 15A:
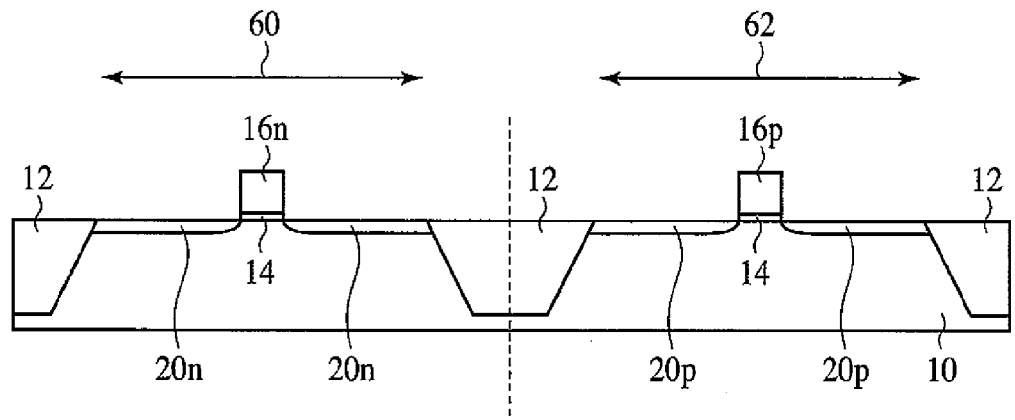
FIGS. 15A-15C, 16A-16C, 17A-17C and 18A-18B are sectional views showing the steps of the method of manufacturing the semiconductor device according to a second embodiment of the present invention.
Figure 15B:
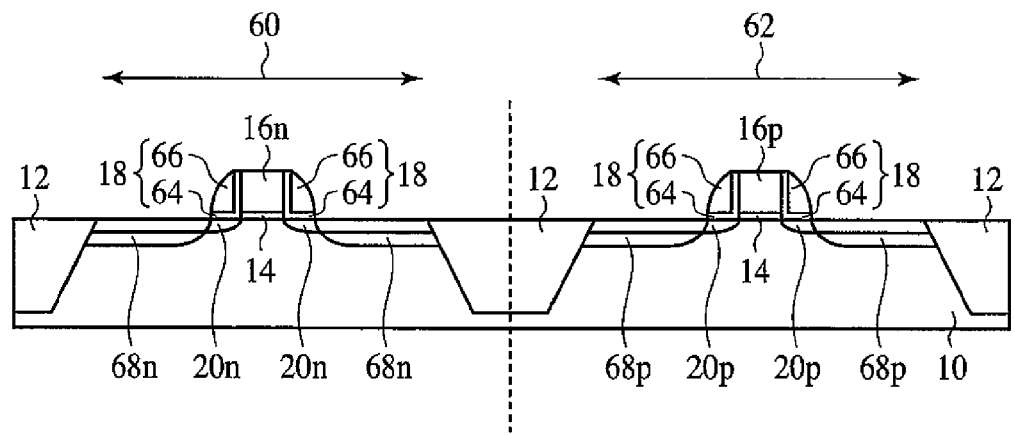

In FIG. 15A, in the NMOS transistor-to-be-formed region 60, the n-type shallow impurity diffused layers 20n forming the extension regions are formed in the silicon substrate 10 on both sides of the gate electrode 16n, and in the PMOS transistor-to-be-formed region 62, the p-type shallow impurity diffused layers 20p forming the extension regions are formed in the silicon substrate 10 on both sides of the gate electrode 16p.

Then, a silicon oxide film 64 of, e.g., a 10 nm-thickness is formed on the entire surface by, e.g., CVD.

Next, a silicon nitride film 66 of, e.g., an 80 nm-thickness is formed on the entire surface by, e.g., CVD.

Next, the silicon nitride film 66 and the silicon oxide film 64 are anisotropically etched by, e.g., RIE. Thus, a sidewall insulating film 18 of the two-layer structure of the silicon oxide film 64 and the silicon nitride film 66 is formed on the side walls of the gate electrodes 16n, 16p.

Then, with the gate electrodes 16n, 16p and the sidewall insulating film 18 as the mask, dopant impurities are implanted into the silicon substrate 10 on both sides of the gate electrodes 16n, 16p and the sidewall insulating film 18 by, e.g., ion implantation. When the NMOS transistor is formed, arsenic, for example, is used as the n-type dopant impurity. When the PMOS transistor is formed, boron, for example, is used as the p-type dopant impurity. Thus, the impurity diffused regions 68n, 68p for making the extension regions 20n, 20p with low resistivity are formed (see FIG. 15B).

Next, a silicon oxide film 70 of, e.g., a 40 nm-thickness is formed on the entire surface by, e.g., CVD.

Next, the silicon oxide film 70 is anisotropically etched by, e.g., RIE. Thus, a sidewall insulating film 70 of the silicon oxide film is further formed on the side walls of the sidewall insulating film 18.

Next, with the gate electrodes 16n, 16p and the sidewall insulating films 18, 70 as the mask, dopant impurities are implanted into the silicon substrate 10 on both sides of the gate electrodes 16n, 16p and the sidewall insulating films 18, 70 by, e.g., ion implantation. When the NMOS transistor is formed, phosphorus, for example, is used as the n-type dopant impurity. When the PMOS transistor is formed, boron, for example, is used as the p-type dopant impurity. Thus, the impurity diffused regions 22n, 22p forming the deep regions of the source/drain diffused layers are formed.

Next, prescribed thermal processing is made to thereby activate the dopant impurities implanted in the impurity diffused regions 20n, 20p, 68n, 68p, 22n, 22p.

Figure 15C:
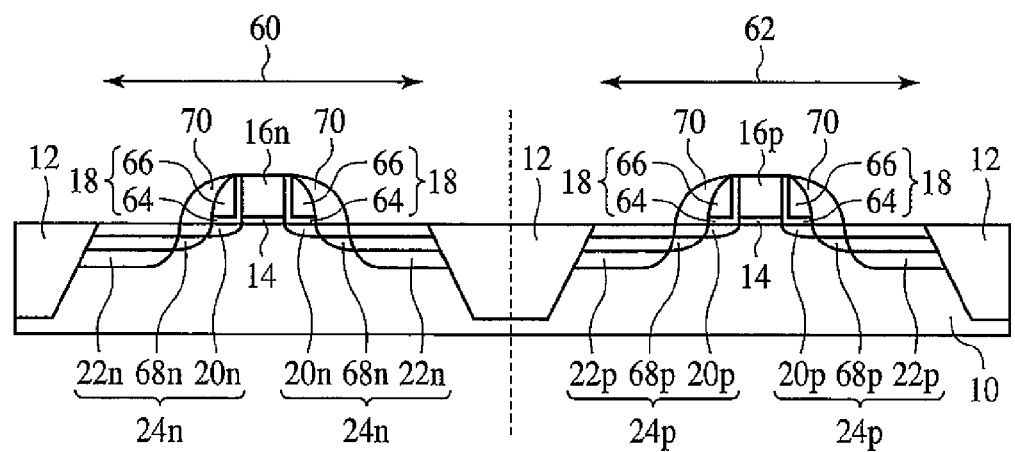

Thus, in the silicon substrate 10 on both sides of the gate electrodes 16n, 16p, source/drain diffused layers 24n, 24p formed of the extension regions, i.e., the shallow impurity diffused regions 20n, 20p, the impurity diffused regions 68n, 68p for making the extension regions 20n, 20p with low resistivity and the deep impurity diffused regions 22n, 22p are formed (see FIG. 15C).

Figure 16A:
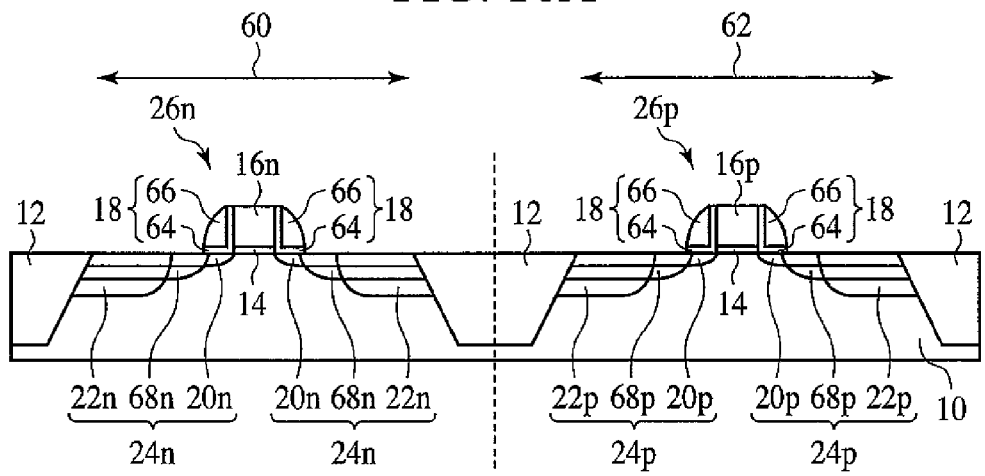
Figure 16B:
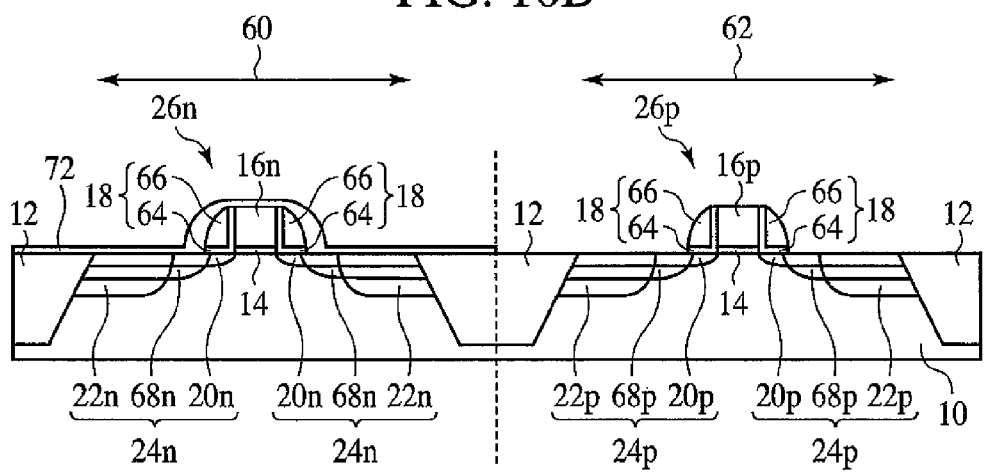
Figure 16C:
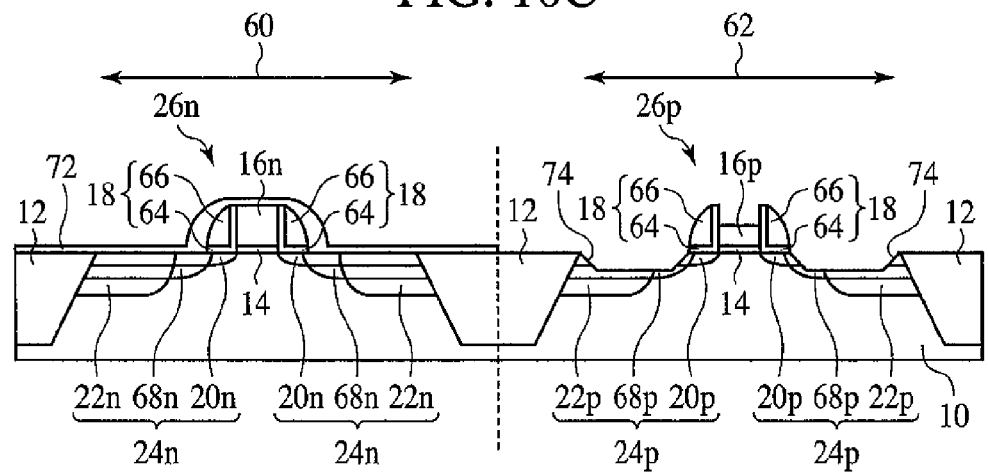

Then, the sidewall insulating film 70 formed on the outside of the sidewall insulating film 18 is etched off (see FIG. 16A).

Thus, the NMOS transistor 26n is formed in the NMOS transistor-to-be-formed region 60, and the PMOS transistor 26p is formed in the PMOS transistor-to-be-formed region 62.

Then, a silicon oxide film 72 of, e.g., a 40 nm-thickness is formed on the entire surface by, e.g., CVD.

Then, the silicon oxide film 72 is patterned by photolithography and dry etching. Thus, the silicon oxide film 72 on the PMOS transistor-to-be-formed region 62 and on the device isolation region 12 defining the PMOS transistor-to-be-formed region 62 is removed, and the silicon oxide film 72 on the NMOS transistor-to-be-formed region 60 and on the device isolation region 12 defining the NMOS transistor-to-be-formed region 60 is selectively left (see FIG. 16B).

Next, with the silicon oxide film 72 as the mask, the silicon substrate 10 is etched with a high selectivity ratio to the silicon oxide film by, e.g., RIE. Thus, recesses 74 of, e.g., a 50 nm-depth are formed in the source/drain diffused layers 24p on both sides of the gate electrode 16p and the sidewall insulating film 18. At this time, the upper part of the gate electrode 16p of polysilicon film is also etched off (see FIG. 16C).

Next, the surface of the silicon substrate 10 with the recesses 74, etc. formed in is cleaned for, e.g., 5 seconds with dilute hydrofluoric acid (e.g., $HF:H_2O=5:100$). Then, with the silicon oxide film 72 as the mask, silicon germanium films ($Si_{1-X}Ge_X$ films) 76a, 76b with a dopant impurity implanted in are selectively epitaxially grown on the gate electrode 16p and in the recesses 74 by, e.g., CVD (see FIG. 17A). As the dopant impurity, boron, for example, is used. The composition ratio X of the Ge can be suitably set in the range of $0<X<1$.

Thus, in the PMOS transistor-to-be-formed region 62, the $Si_{1-X}Ge_X$ films 76b are buried in the recesses 74 of the source/drain diffused layers 24p. The gate electrode 16p has the $Si_{1-X}Ge_X$ film 76a on the polysilicon film.

As described above, in the present embodiment, in the PMOS transistor 26p, the $Si_{1-X}Ge_X$ films 76b are buried in the source/drain regions. Because of the lattice constant of $Si_{1-X}Ge_X$, which is larger than that of Si, compressive strain is applied to the channel region of the PMOS transistor 26p. Thus, the hole mobility can be high, and the operation speed of the PMOS transistor 26p can be improved.

Next, the silicon oxide film 72 formed on the NMOS transistor-to-be-formed region 60 is etched off.

Then, the natural oxide film formed on the surface of the gate electrode 16n, the surfaces of the source/drain diffused layers 24n, the surface of the $Si_{1-X}Ge_X$ film 76a of the gate electrode 16p, the surfaces of the $Si_{1-X}Ge_X$ films 76b buried in the recesses 74 of the source/drain diffused layers 24p is removed by, e.g., hydrofluoric acid processing.

Next, a NiPt film 28 of, e.g., a 5-30 nm-thickness is formed on the entire surface by, e.g., sputtering using a Ni target with Pt added. The composition ratio of the Pt of the target is, e.g., 1-10 atom %. When the NiPt film 28 is formed by using such target, the composition ratio of the Pt of the NiPt film 28 is, e.g., about 1-10 atom %.

Figure 17A:
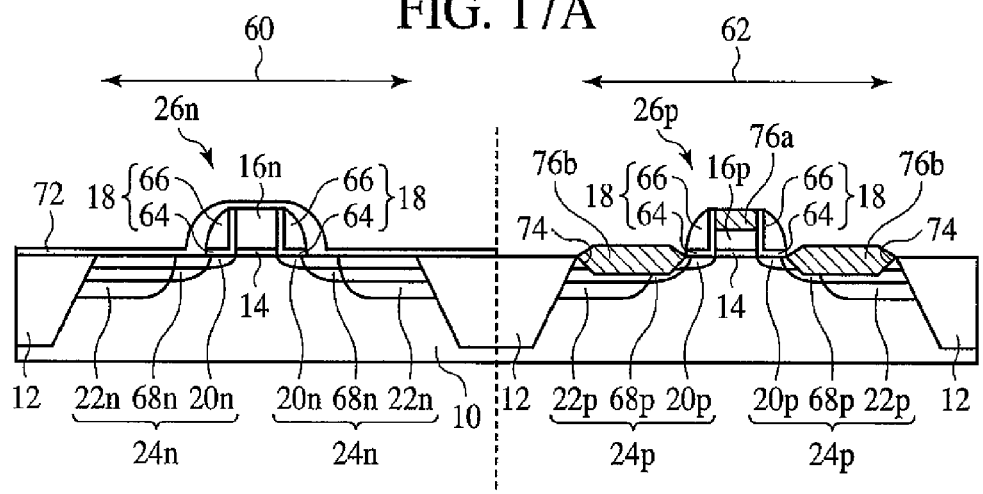
Figure 17B:
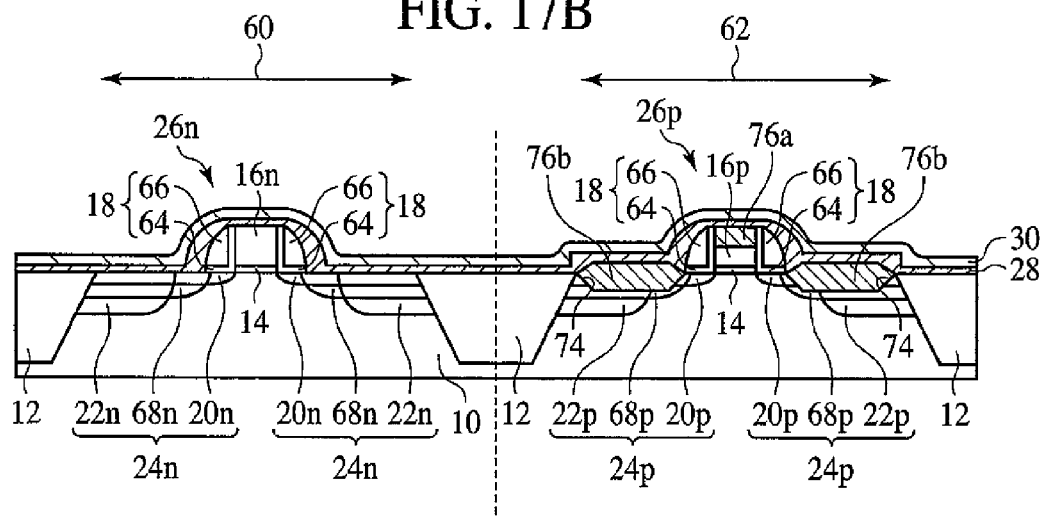
Figure 17C:
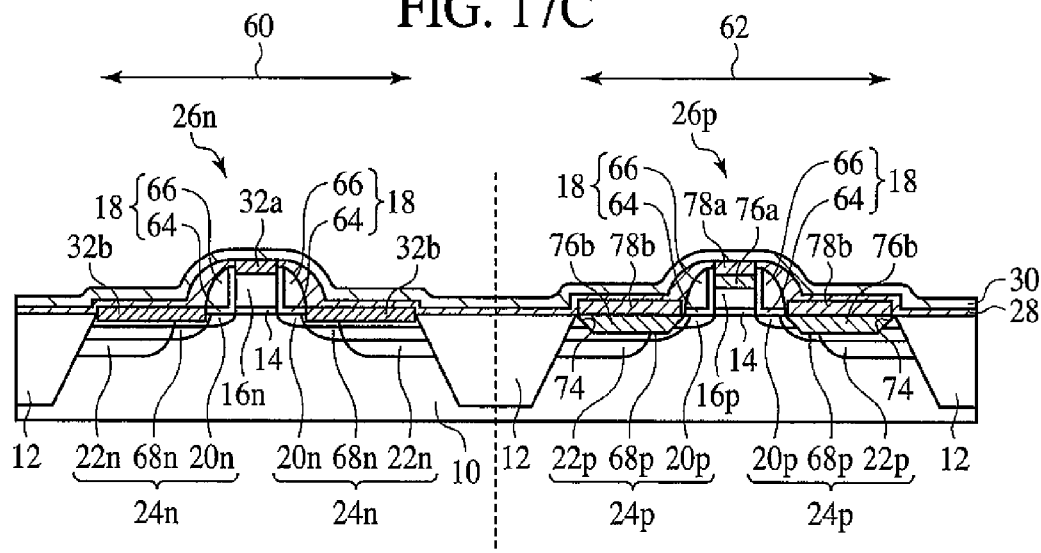

Next, a protective film 30 of a TiN film of, e.g., a 5-30 nm-thickness is formed on the NiPt film 28 by, e.g., sputtering (see FIG. 17B). The protective film 30 is for preventing the oxidation of the NiPt film 28. The protective film 30 prevents the oxidation of even a nickel platinum silicide film to be formed in a later step. The protective film 30 is not essentially a TiN film. The protective film 30 may be a Ti film of, e.g., a 5-30 nm-thickness.

Next, as the first thermal processing for the silicidation, thermal processing of, e.g., 200-400° C. and 30-300 seconds is made by, e.g., RTA.

The first thermal processing reacts, for the NMOS transistor 26n, the NiPt of the NiPt film 28 with the Si of the upper part of the gate electrode 16n and the NiPt of the NiPt film 28 with the Si of the upper parts of the source/drain diffused layers 24n, as in method of manufacturing the semiconductor device according to the modification of the first embodiment. Thus, a Ni$_2$(Pt)Si film 32a is formed on the gate electrode 16n, and Ni$_2$(Pt)Si films 32b are formed on the source/drain diffused layers 24n (see FIG. 17C).

The first thermal processing reacts, for the PMOS transistor 26p, the NiPt of the NiPt film 28 with the Si$_{1-x}$Ge$_X$ of the upper part of the Si$_{1-x}$Ge$_X$ film 76a of the gate electrode 16p and the NiPt of the NiPt film 28 with the Si$_{1-x}$Ge$_X$ of the upper parts of the Si$_{1-x}$Ge$_X$ films 76b buried in the recesses 74 of the source/drain diffused layers 24p. Thus, a Ni$_2$(Pt)Si$_{1-x}$Ge$_X$ film 78a is formed on the Si$_{1-x}$Ge$_X$ film 76a, and the Ni$_2$(Pt)Si$_{1-x}$Ge$_X$ films 78b are formed on the Si$_{1-x}$Ge$_X$ films 76b (see FIG. 17C).

Figure 18A:
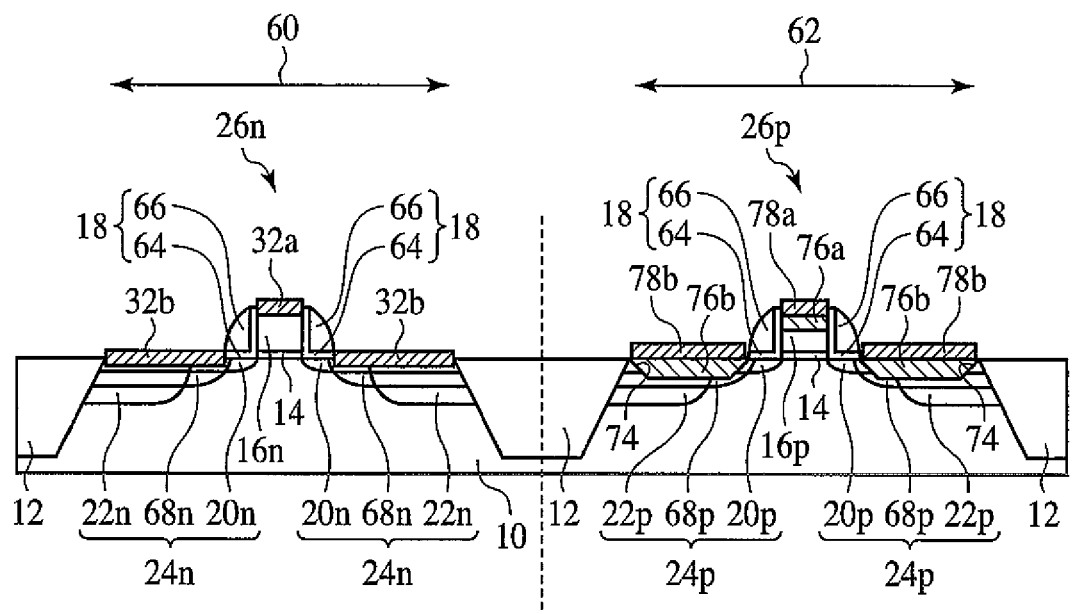
Figure 18B:
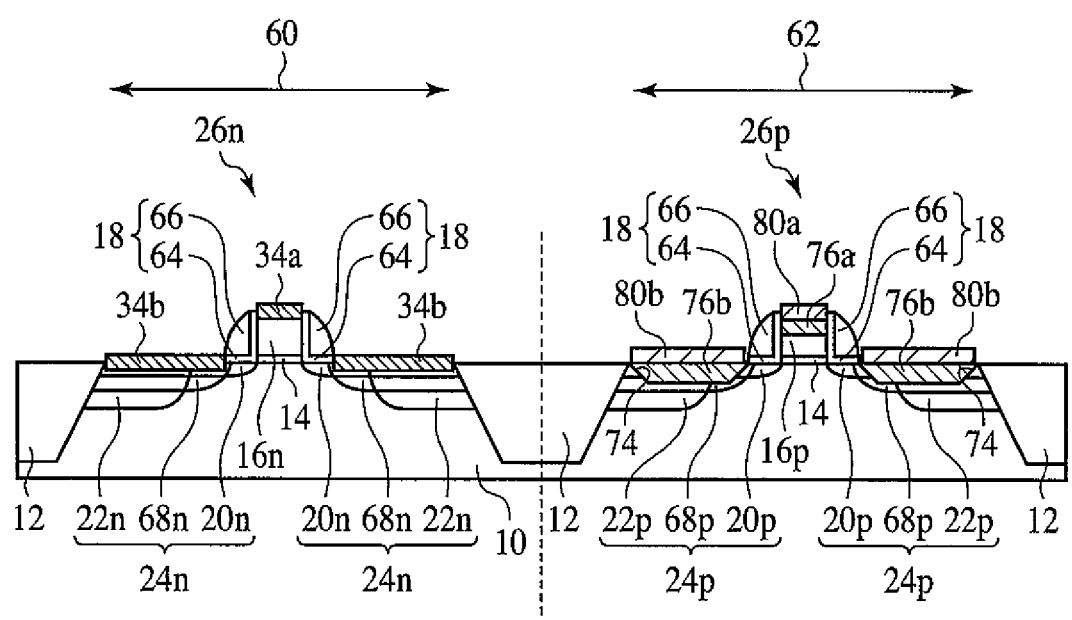

Then, in the same way as in the method of manufacturing the semiconductor device according to the first embodiment, the protective film 30 and the unreacted part of the NiPt film 28 are respectively selectively removed with a relatively high-temperature chemical liquid containing hydrogen peroxide (see FIG. 18A). As the chemical liquid containing hydrogen peroxide, SPM liquid, for example, is used. The weight % concentration of the sulfuric acid of the SPM liquid is, e.g., 50-95%, and the weight % concentration of the hydrogen peroxide of the SPM liquid is, e.g., 5-50%. In place of SPM liquid, HPM liquid may be used. The weight % concentration of the hydrochloric acid of the HPM liquid is, e.g., 0.1-25%, the weight % concentration of the hydrogen peroxide of the HPM liquid is, e.g., 0.1-25%, and the weight % concentration of the water of the HPM liquid is, e.g., 50-99.8%. In Place of SPM liquid, APM liquid may be used. The weight % concentration of the ammonia (NH$_4$OH) of the APM liquid is, e.g., 0.1-25%, the weight % concentration of the hydrogen peroxide of the APM liquid is, e.g., 0.1-25%, and the weight % concentration of the water of the APM liquid is, e.g., 50-99.8%. The temperature of the chemical liquid is set at, e.g., 71-150° C., which is relatively high. The period of time for which the substrate is immersed in the chemical liquid so as to etch off the NiPt film 28 is set at, e.g., 12-60 minutes.

At this time, on the surfaces of the Ni$_2$(Pt)Si films 32a, 32b and the surfaces of the Ni$_2$(Pt)Si$_{1-x}$Ge$_X$ films 78a, 78b, oxide film of Si will be formed due to the hydrogen peroxide contained in the relatively high-temperature chemical liquid.

Next, as the second thermal processing for the silicidation, thermal processing of, e.g., 300-500° C. and 30 seconds is made by, e.g., RTA.

The second thermal processing reacts, for the NMOS transistor 26n, the Ni$_2$(Pt)Si of the Ni$_2$(Pt)Si film 32a with the Si of the upper part of the gate electrode 16n and the Ni$_2$(Pt)Si of the Ni$_2$(Pt)Si films 32b with the Si of the upper parts of the source/drain diffused layers 24n, as in the method of manufacturing the semiconductor device according to the first embodiment. Thus, a Ni(Pt)Si film 34a is formed on the gate electrode 16n, and Ni(Pt)Si films 34b are formed on the source/drain diffused layers 24n (see FIG. 18B).

The second thermal processing reacts, for the PMOS transistor 26p, the Ni$_2$(Pt)Si$_{1-x}$Ge$_X$ of the Ni$_2$(Pt)Si$_{1-x}$Ge$_X$ film 78a with the Si$_{1-x}$Ge$_X$ of the upper part of the Si$_{1-x}$Ge$_X$ film 76a and the Ni$_2$(Pt)Si$_{1-x}$Ge$_X$ of the Ni$_2$(Pt)Si$_{1-x}$Ge$_X$ films 78b with the Si$_{1-x}$Ge$_X$ of the upper parts of the Si$_{1-x}$Ge$_X$ films 76b. Thus, a Ni(Pt)Si$_{1-x}$Ge$_X$ film 80a is formed on the Si$_{1-x}$Ge$_X$ film 76a, and the Ni(Pt)Si$_{1-x}$Ge$_X$ films 80b are formed on the Si$_{1-x}$Ge$_X$ films 76b (see FIG. 18B).

The oxide film, which seems to have been formed by the processing using the chemical liquid containing hydrogen peroxide is as thin as, e.g., below 1 nm including 1 nm and is difficult to be discriminated from the Ni(Pt)Si films 34a, 34b and the Ni(Pt)Si$_{1-x}$Ge$_X$ films 80a, 80b even with, e.g., a transmission electron microscope.

Hereafter, in the same way as in the method of manufacturing the semiconductor device according to the first embodiment shown in FIG. 3C and FIG. 12, contact plugs 54a, 54b, an interconnection layer 58, etc. are formed.

As described above, according to the present embodiment, the unreacted part of the NiPt film is removed with the relatively high-temperature chemical liquid containing hydrogen peroxide, whereby the unreacted part of the NiPt film can be selectively removed without generating Pt residues. Thus, the leak currents of the MOS transistors can be suppressed, and the characteristics of the MOS transistors can be improved.

(A Modification)

Figure 19A:
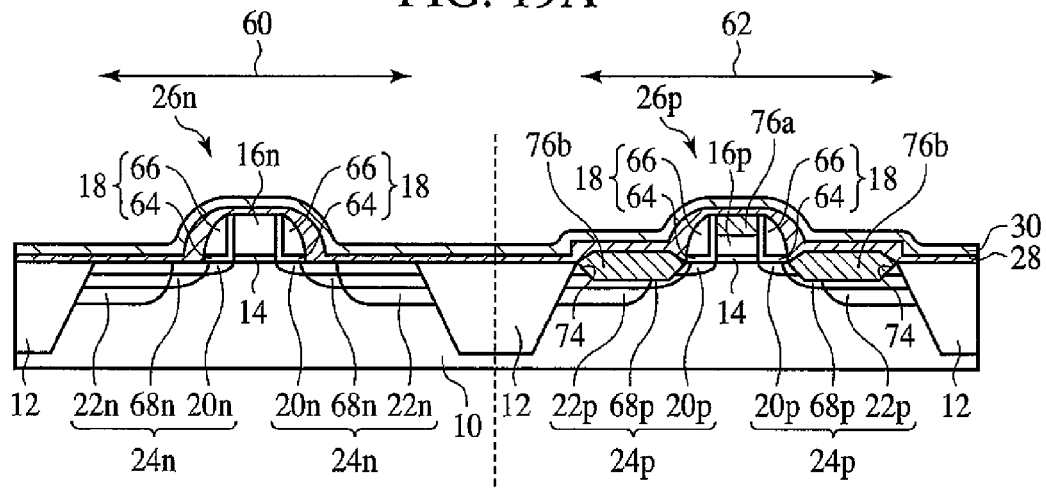
FIGS. 19A-19C are sectional views showing the steps of the method of manufacturing the semiconductor device according to a modification of the second embodiment of the present invention.
Figure 19B:
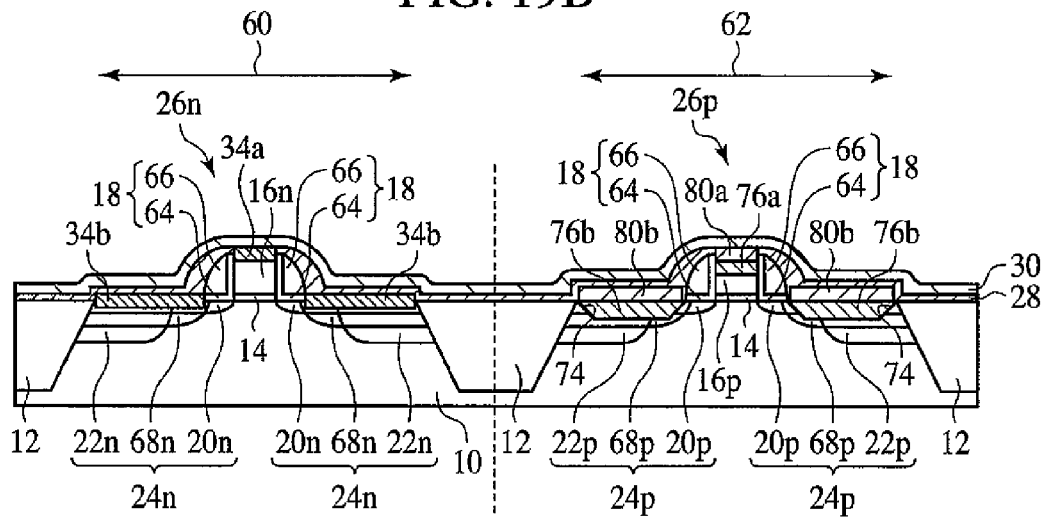
Figure 19C:
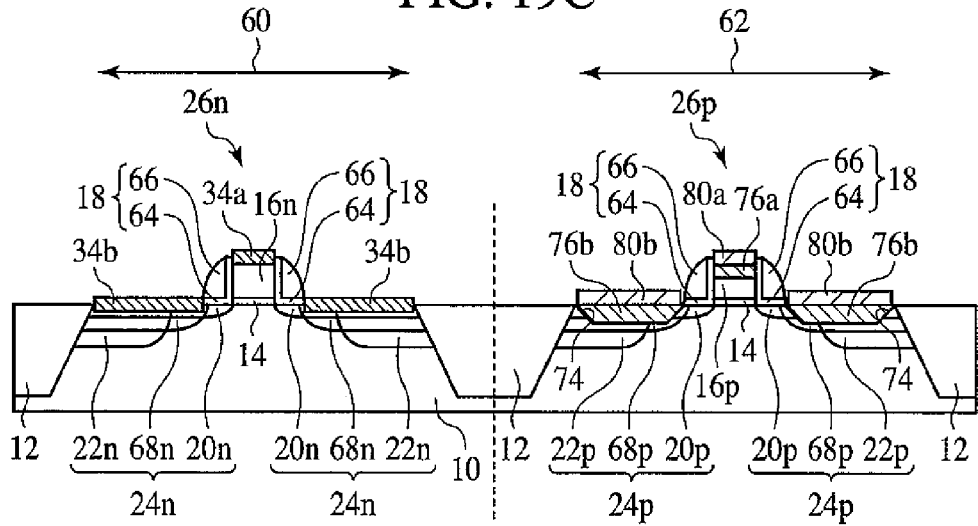

The method of manufacturing the semiconductor device according to a modification of the present embodiment will be explained with reference to FIGS. 19A-19C. FIGS. 19A-19C are sectional views showing the steps of the method of manufacturing the semiconductor device according to the present modification.

In the above, the two-step thermal processing is made in the silicidation process using NiPt film. In the method of manufacturing the semiconductor device according to the modification, thermal processing is made only once in the silicidation process using NiPt film.

First, in the same way as in the steps of FIG. 15A to FIG. 17B, the NiPt film 28 and the protective film 30 are formed on the silicon substrate 10 with the NMOS transistor 26n and the PMOS transistor 26p formed on (see FIG. 19A).

Next, as the thermal processing for the silicidation, thermal processing is made by, e.g., RTA.

Thus, this thermal processing reacts, for the NMOS transistor 26n, the NiPt of the NiPt film 28 with the Si of the upper part of the gate electrode 16n and the NiPt of the NiPt film 28 with the Si of the upper parts of the source/drain diffused layers 24n.

This thermal processing reacts, for the PMOS transistor 26p, the NiPt of the NiPt film 28 with the Si$_{1-x}$Ge$_X$ of the upper part of the Si$_{1-x}$Ge$_X$ film 76a of the gate electrode 16p and the NiPt of the NiPt film 28 with the Si$_{1-x}$Ge$_X$ of the upper parts of the Si$_{1-x}$Ge$_X$ films 76b buried in the recesses 74 of the source/drain diffused layers 24p.

Here, the conditions for the thermal processing for the silicidation are suitably set to thereby advance the silicidation to the final stage. The thermal processing conditions are, e.g., 300-500° C. and 30-300 seconds.

Thus, for the NMOS transistor 26n, the Ni(Pt)Si film 34a is formed on the gate electrode 16n and the Ni(Pt)Si films 34b are formed on the source/drain diffused layers 24n (see FIG. 19B).

For the PMOS transistor 26p, the Ni(Pt)Si$_{1-x}$Ge$_X$ film 80a is formed on the Si$_{1-x}$Ge$_X$ film 76a and the Ni(Pt)Si$_{1-x}$Ge$_X$ films 80b are formed on the Si$_{1-x}$Ge$_X$ films 76b (see FIG. 19B).

Then, in the same way as described above, the protective film 30 and the unreacted part of the NiPt film 28 are respectively selectively removed with the relatively high-temperature chemical liquid containing the hydrogen peroxide (see FIG. 19C).

The following steps are the same as described above, and their explanation will not be repeated.

As in the present modification, it is possible that thermal processing is made only once in the silicidation process using the NiPt film to thereby form the Ni(Pt)Si films 34a, 34b for the NMOS transistor 26n and the Ni(Pt)Si$_{1-x}$Ge$_X$ films 80a, 80b for the PMOS transistor 26p.

A Third Embodiment

The method of manufacturing the semiconductor device according to a third embodiment of the present invention will be explained with reference to FIGS. 20A to 22B. FIGS. 20A-20C, 21A-21C and 22A-22B are sectional views showing the steps of the method of manufacturing the semiconductor device according to the present embodiment. The same members of the present embodiment as those of the method of manufacturing the semiconductor device according to the first and the second embodiments are represented by the same reference numbers not to repeat or to simplify their explanation.

The method of manufacturing the semiconductor device according to the present embodiment is characterized mainly in that tensile strain is introduced into the channel region of an NMOS transistor.

Figure 20A:
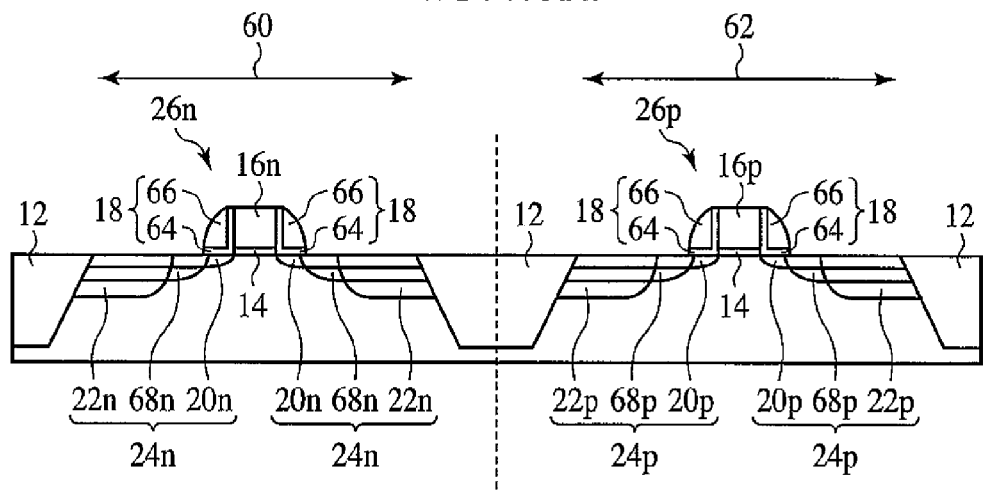
FIGS. 20A-20C, 21A-21C and 22A-22B are sectional views showing the steps of the method of manufacturing the semiconductor device according to a third embodiment of the present invention.
Figure 20B:
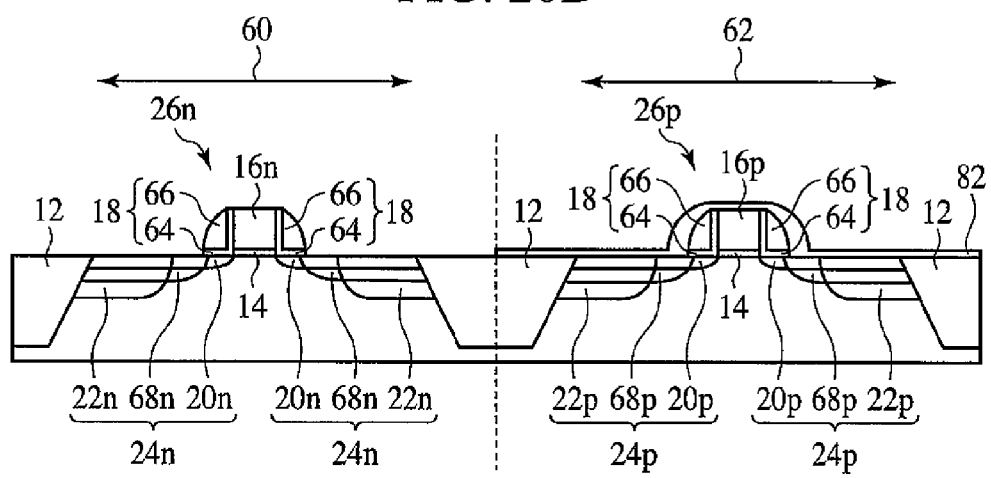
Figure 20C:
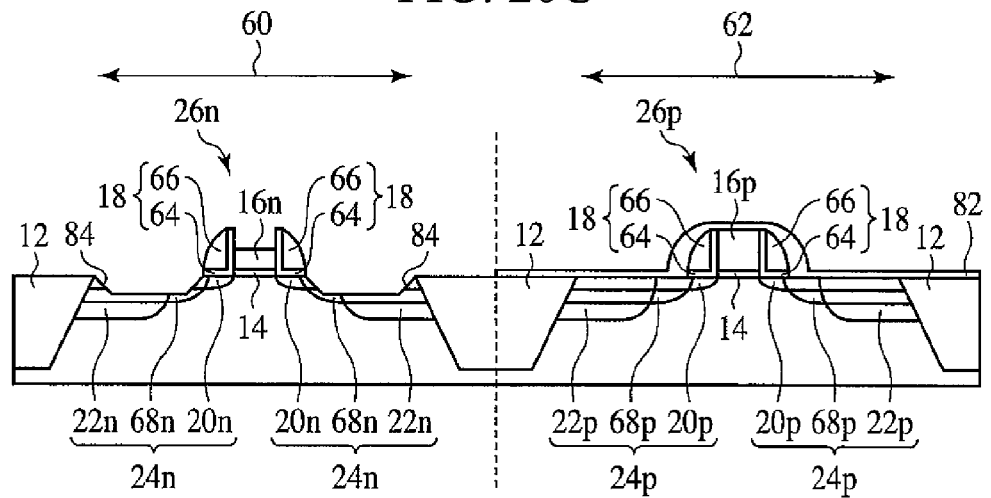

In the same way as in the method of manufacturing the semiconductor device according to the second embodiment shown in FIG. 15A to FIG. 16A, in an NMOS transistor-to-be-formed region 60 and a PMOS transistor-to-be-formed region 62, the members up to the respective source/drain diffused layers 24n, 24p are formed (see FIG. 20A).

Next, a silicon oxide film 82 of, e.g., a 40 nm-thickness is formed on the entire surface by, e.g., CVD.

Then, the silicon oxide film 82 is patterned by photolithography and dry etching. Thus, the silicon oxide film 82 on the NMOS transistor-to-be-formed region 60 and on the device isolation region 12 defining the NMOS transistor-to-be-formed region 60 is removed, and the silicon oxide film 82 on the PMOS transistor-to-be-formed region 62 and on the device isolation region 12 defining the PMOS transistor-to-be-formed region 62 is selectively left (see FIG. 20B).

Next, with the silicon oxide film 82 as the mask, the silicon substrate 10 is etched with a high selectivity ratio to the silicon oxide film by, e.g., RIE. Thus, recesses 84 of, e.g., a 50 nm-depth are formed in the source/drain diffused layers 24n on both sides of the gate electrode 16n and the sidewall insulating film 18. At this time, the upper part of the gate electrode 16n of polysilicon film is also etched off (see FIG. 20C).

Next, the surface of the silicon substrate 10 with the recesses 84, etc. formed in is cleaned for, e.g., 5 seconds with dilute hydrofluoric acid (e.g., $HF:H_2O=5:100$). Then, with the silicon oxide film 84 as the mask, silicon carbide films ($Si_{1-X}C_X$ films) 86a, 86b with a dopant impurity implanted are selectively epitaxially grown on the gate electrode 16n and in the recesses 84 by, e.g., CVD (see FIG. 21A). As the dopant impurity, $PH_3$, for example, is used. The composition ratio X of the C can be set suitably in the range of $0<X<1$.

Thus, in the NMOS transistor-to-be-formed-region 60, the $Si_{1-X}C_X$ films 86b are buried in the recesses 84 of the source/drain diffused layers 24n. The gate electrode 16n has the $Si_{1-X}C_X$ film 86a on the polysilicon film.

As described above, in the present embodiment, in the NMOS transistor 26n, the $Si_{1-X}C_X$ films 86b are buried in the source/drain regions. Because of the lattice constant of $Si_{1-X}C_X$, which is smaller than that of Si, tensile strain is applied to the channel region of the NMOS transistor 26n. Thus, the electron mobility can be high, and the operation speed of the NMOS transistor 26n can be improved.

Next, the silicon oxide film 82 formed on the PMOS transistor-to-be-formed region 62 is etched off.

Next, the natural oxide film formed on the surface of the $Si_{1-X}C_X$ film 86a of the gate electrode 16n, the surfaces of the $Si_{1-X}C_X$ films 86b buried in the recesses 84 of the source/drain diffused layers 24n, the surface of the gate electrode 16p and the surfaces of the source/drain diffused layers 24p is removed by, e.g., hydrofluoric acid processing.

Then, a NiPt film 28 of, e.g., a 5-30 nm-thickness is formed on the entire surface by, e.g., sputtering using a Ni target with Pt added. The composition ratio of the Pt of the target is, e.g., 1-10 atom %. When the NiPt film 28 is formed by using such target, the composition ratio of the Pt of the NiPt film 28 is, e.g., about 1-10 atom %.

Figure 21A:
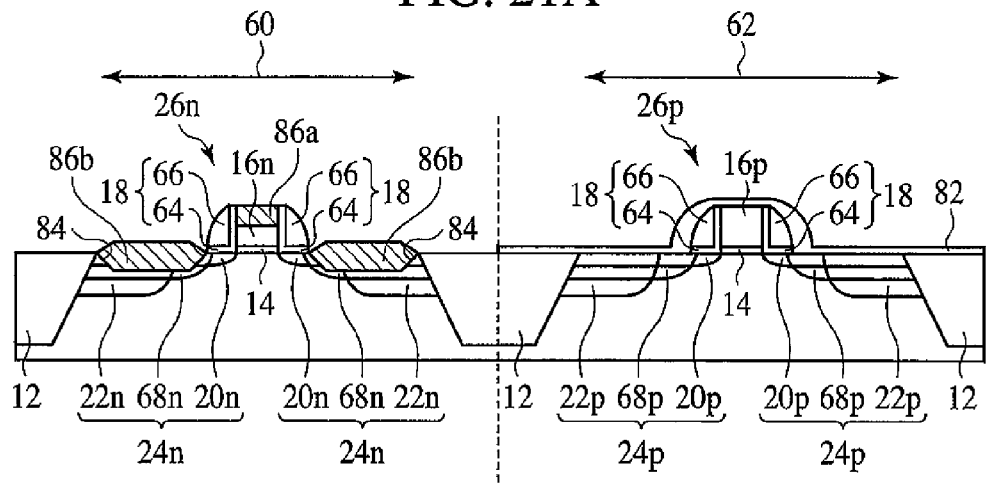
Figure 21B:
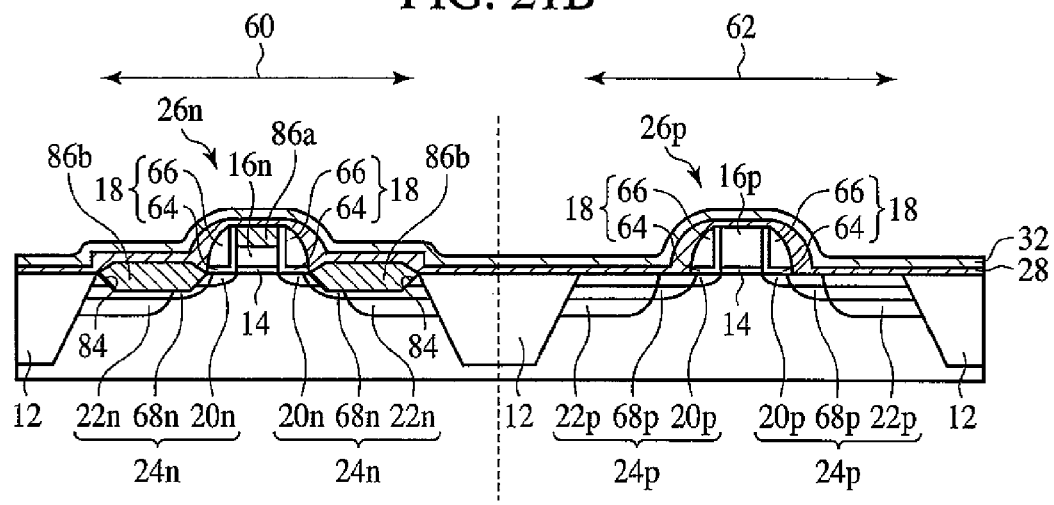
Figure 21C:
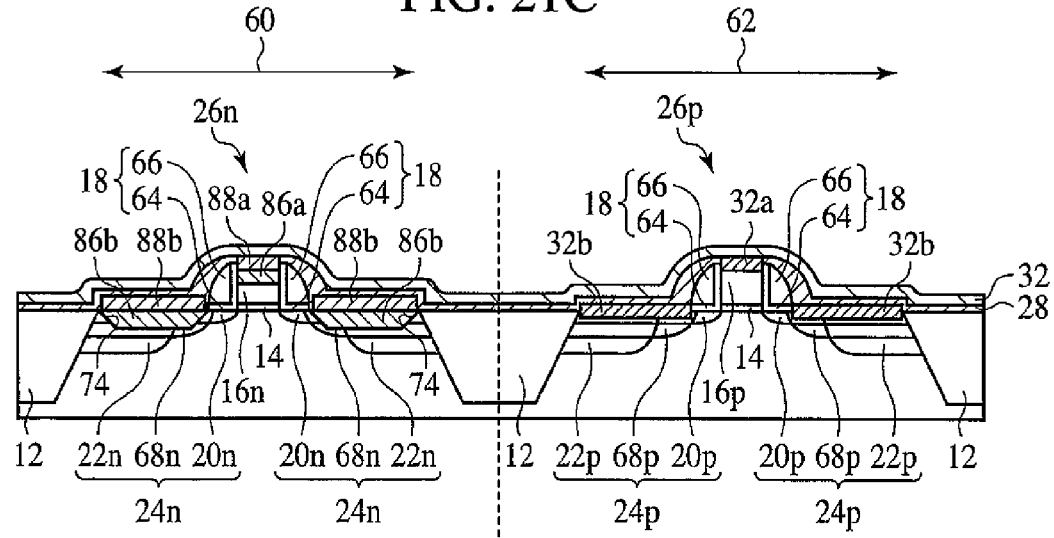

Next, a protective film 30 of a TiN film of, e.g., a 5-30 nm-thickness is formed on the NiPt film 28 by, e.g., sputtering (see FIG. 21B). The protective film 30 is for preventing the oxidation of the NiPt film 28. The protective film 30 prevents the oxidation of even a nickel platinum silicide film to be formed in a later step. The protective film 30 is not essentially a TiN film. The protective film 30 may be a Ti film of, e.g., a 5-30 nm-thickness.

Next, as the first thermal processing for the silicidation, thermal processing of, e.g., 200-400° C. of 30-300 seconds is made by, e.g., RTA.

The first thermal processing reacts, for the NMOS transistor 26n, the NiPt of the NiPt film 28 with the $Si_{1-X}C_X$ of the upper part of the $Si_{1-X}C_X$ film 86a of the gate electrode 16n and the NiPt of the NiPt film 28 with the upper parts of the $Si_{1-X}C_X$ of the $Si_{1-X}C_X$ films 86b buried in the recesses 84 of the source/drain diffused layers 24n. Thus, a $Ni_2(Pt)Si_{1-X}C_X$ film 88a is formed on the $Si_{1-X}C_X$ film 86a, and $Ni_2(Pt)Si_{1-X}C_X$ films 88b are formed on the $Si_{1-X}C_X$ films 86b (see FIG. 21C).

The first thermal processing reacts, for the PMOS transistor 26p, the NiPt of the NiPt film 28 with the Si of the upper part of the gate electrode 16p and the NiPt of the NiPt film 28 with the Si of the upper parts of the source/drain diffused layers 24p, as in the method of manufacturing the semiconductor device according to the modification of the first embodiment. Thus, a $Ni_2(Pt)Si$ film 32a is formed on the gate electrode 16p, and $Ni_2(Pt)Si$ films 32b are formed on the source/drain diffused layers 24p (see FIG. 21C).

Figure 22A:
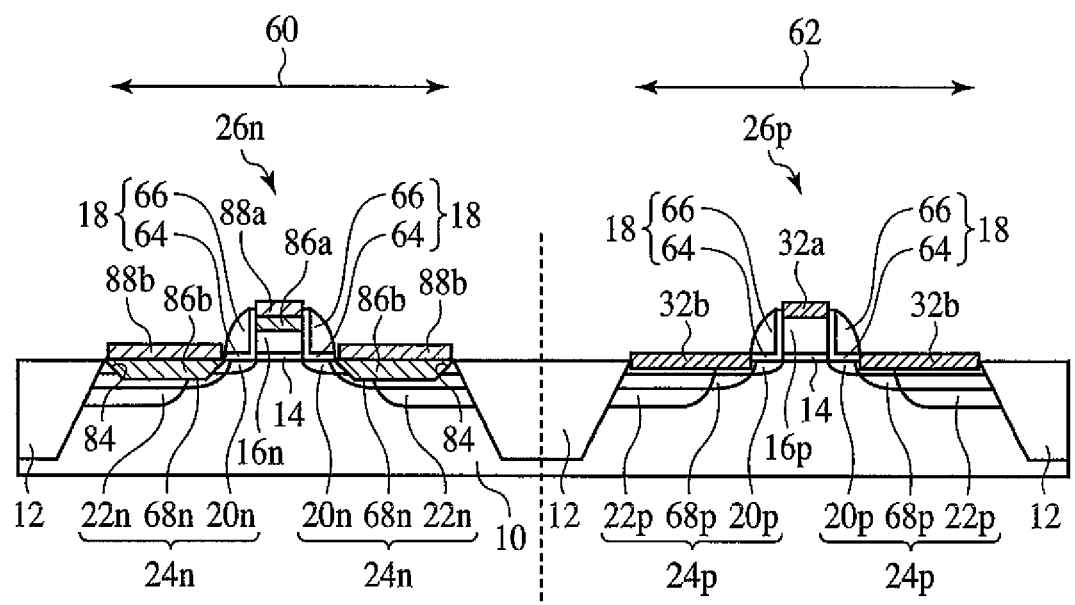
Figure 22B:
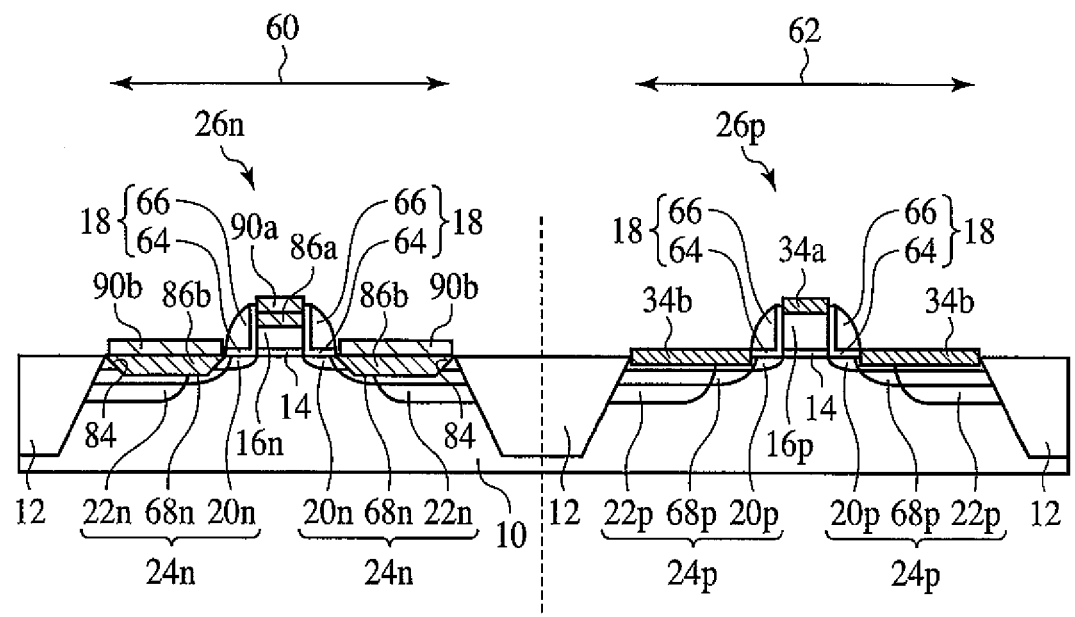

Then, in the same way as in the method of manufacturing the semiconductor device according to the first embodiment, the protective film 30 and the unreacted part of the NiPt film 28 are respectively selectively removed with a relatively high-temperature chemical liquid containing hydrogen peroxide (see FIG. 22A). As the chemical liquid containing hydrogen peroxide, SPM liquid, for example, is used. The weight % concentration of the sulfuric acid of the SPM liquid is, e.g., 50-95%, and the weight % concentration of the hydrogen peroxide of the SPM liquid is, e.g., 5-50%. In place of SPM liquid, HPM liquid may be used. The weight % concentration of the hydrochloric acid of the HPM liquid is, e.g., 0.1-25%, the weight % concentration of the hydrogen peroxide of the HPM liquid is, e.g., 0.1-25%, and the weight % concentration of the water of the HPM liquid is, e.g., 50-99.8%. In Place of SPM liquid, APM liquid may be used. The weight % concentration of the ammonia ($NH_4OH$) of the APM liquid is, e.g., 0.1-25%, the weight % concentration of the hydrogen peroxide of the APM liquid is, e.g., 0.1-25%, and the weight % concentration of the water of the APM liquid is, e.g., 50-99.8%. The temperature of the chemical liquid is set at, e.g., 71-150° C., which is relatively high. The period of time for which the substrate is immersed in the chemical liquid so as to etch off the NiPt film 28 is set at, e.g., 12-6.0 minutes.

At this time, on the surface of the $Ni_2(Pt)Si$ film 32a, 32b, and the surface of the $Ni_2(Pt)Si_{1-X}C_X$ film 88a, 88b, oxide film will be formed due to the hydrogen peroxide contained in the relatively high-temperature chemical liquid.

Next, as the second thermal processing for the silicidation, thermal processing of, e.g., 300-500° C. and 30 seconds is made by, e.g., RTA.

The second thermal processing reacts, for the NMOS transistor 26n, the $Ni_2(Pt)Si_{1-x}C_x$ of the $Ni_2(Pt)Si_{1-x}C_x$ film 88a with the $Si_{1-x}C_x$ of the upper part of the $Si_{1-x}C_x$ film 86a and the $Ni_2(Pt)Si_{1-x}C_x$ of the $Ni_2(Pt)Si_{1-x}C_x$ films 88b with the $Si_{1-x}C_x$ of the upper parts of the $Si_{1-x}C_x$ films 86b. Thus, a $Ni(Pt)Si_{1-x}C_x$ film 90a is formed on the $Si_{1-x}C_x$ film 86a, and $Ni(Pt)Si_{1-x}C_x$ films 90b are formed on the $Si_{1-x}C_x$ films 86b (see FIG. 22B).

The second thermal processing reacts, for the PMOS transistor 26, the $Ni_2(Pt)Si$ of the $Ni_2(Pt)Si$ film 32a with the Si of the upper part of the gate electrode 16p and the $Ni_2(Pt)Si$ of the $Ni_2(Pt)Si$ films 32b with the Si of the upper parts of the source/drain diffused layers 24p, as in the method of manufacturing the semiconductor device according to the modification of the first embodiment. Thus, a Ni(Pt)Si film 34a is formed on the gate electrode 16p, and Ni(Pt)Si films 34b are formed on the source/drain diffused layers 24p (see FIG. 22B).

The oxide film, which seems to have been formed by the processing with the chemical liquid containing hydrogen peroxide is as thin as, e.g., below 1 nm including 1 nm and is difficult to be discriminated from the Ni(Pt)Si films 34a, 34b and the $Ni(Pt)Si_{1-x}C_x$ films 90a, 90b even with, e.g., a transmission electron microscope.

Hereafter, contact plugs 54a, 54b, an interconnection layer 58, etc. are formed in the same way as in the method of manufacturing the semiconductor device according to the first embodiment shown in FIGS. 3C and 12.

As described above, according to the present embodiment, the unreacted part of the NiPt film is removed with the relatively high-temperature chemical liquid containing hydrogen peroxide, whereby the unreacted part of the NiPt film can be selectively removed without generating Pt residues. Thus, the leak currents of the MOS transistors can be suppressed, and the characteristics of the MOS transistors can be improved.

(A Modification)

Figure 23A:
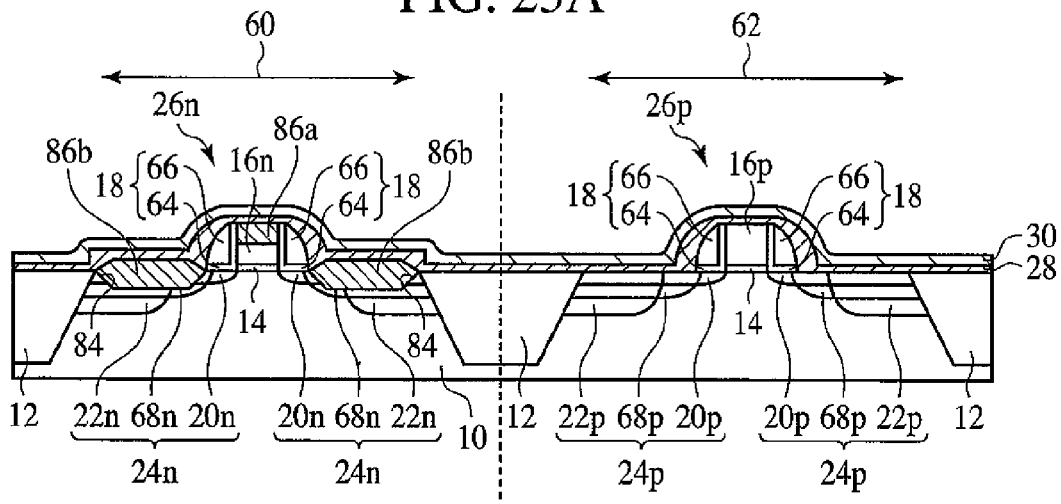
FIGS. 23A-23C are sectional views showing the steps of the method of manufacturing the semiconductor device according to a modification of the third embodiment of the present invention.
Figure 23B:
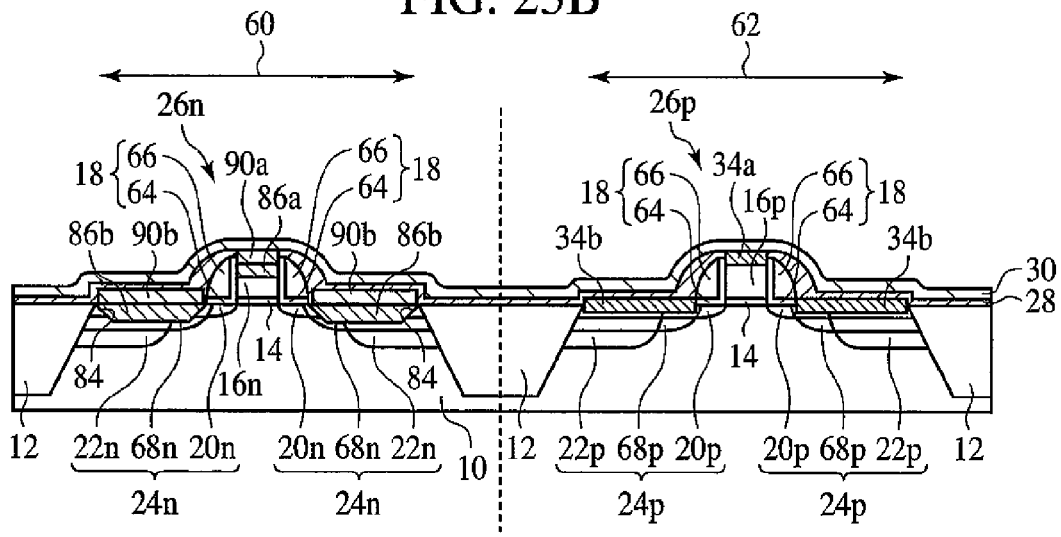
Figure 23C:
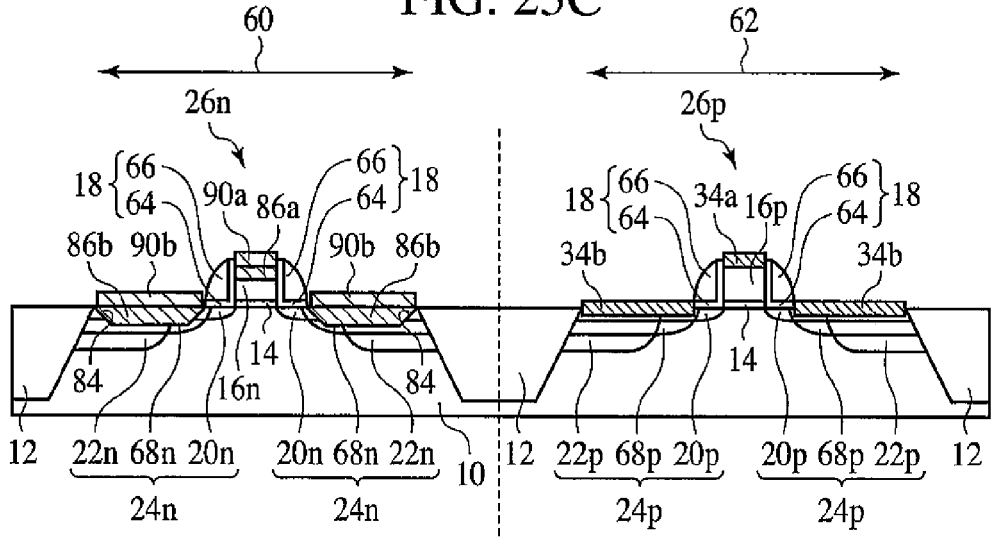

The method of manufacturing the semiconductor device according to a modification of the present embodiment will be explained with reference to FIGS. 23A-23C. FIGS. 23A-23C are sectional views showing the steps of the method of manufacturing the semiconductor device according to the present modification.

In the above, the two-step thermal processing is made in the silicidation process using the NiPt film. The method of manufacturing the semiconductor device according to the present modification is characterized mainly in that thermal processing is made only once in the silicidation process using the NiPt film.

First, in the same way as in the steps of FIG. 20A to FIG. 21B, the NiPt film 28 and the protective film 30 are formed on the silicon substrate 10 with the NMOS transistor 26n and the PMOS transistor 26P formed on (see FIG. 23A).

Next, as the thermal processing for the silicidation, thermal processing is made by, e.g., RTA.

Thus, this thermal processing reacts, for the NMOS transistor 26n, the NiPt of the NiPt film 28 with the $Si_{1-x}C_x$ of the upper part of the $Si_{1-x}C_x$ film 86a of the gate electrode 16n and the NiPt of the NiPt film 28 with the $Si_{1-x}C_x$ of the upper parts of the $Si_{1-x}C_x$ film 86b buried in the recesses 84 of the source/drain diffused layers 24n.

This thermal processing reacts, for the PMOS transistor 26p, the NiPt of the NiPt film 28 with the Ni of the upper part of the gate electrode 16p and the NiPt of the NiPt film 28 with the Si of the upper parts of the source/drain diffused layers 24p.

Here, the conditions for the thermal processing for the silicidation are suitably set to thereby advance the silicidation to the final stage. The thermal processing conditions are, e.g., 300-500° C. and 30-300 seconds.

Thus, for the NMOS transistor 26n, the $Ni(Pt)Si_{1-x}C_x$ film 90a is formed on the $Si_{1-x}C_x$ film 86a and the $Ni(Pt)Si_{1-x}C_x$ films 90b are formed on the $Si_{1-x}C_x$ films 86b (see FIG. 23B).

For the PMOS transistor 26p, the Ni(Pt)Si film 34a is formed on the gate electrode 16p and the Ni(Pt)Si films 34b are formed on the source/drain diffused layers 24p (see FIG. 23B).

Then, in the same way as described above, the protective film 30 and the unreacted part of the NiPt film 28 are respectively selectively removed with the relatively high-temperature chemical liquid containing hydrogen peroxide (see FIG. 23C).

The following steps are the same as described above, and their explanation will not be repeated.

As in the present modification, it is possible that thermal processing is made only once in the silicidation process using the NiPt film to thereby form the $Ni(Pt)Si_{1-x}C_x$ films 90a, 90b for the NMOS transistor 26n and the Ni(Pt)Si films 34a, 34b for the PMOS transistor 26p.

A Fourth Embodiment

With a nickel silicide film formed on the source/drain diffused layer of a transistor, when the gate width W of the transistor is as small as, e.g., below 1 μm, highly resistive $NiSi_2$ crystals are grown below the nickel silicide film in spikes near the junction of the source/drain diffused layer, and often the junction leak current is increased. Resultantly, the off current $I_{off}$ of transistors, especially the off current $I_{off}$ of the PMOS transistor is increased. The $NiSi_2$ crystals grown in spikes are due to the abnormal diffusion of the Ni generated by the silicon substrate being heated. It is difficult to suppress the growth of such the $NiSi_2$ crystals in spikes only by using a Ni alloy film, such as a NiPt film or others, for the silicidation.

Figure 50:
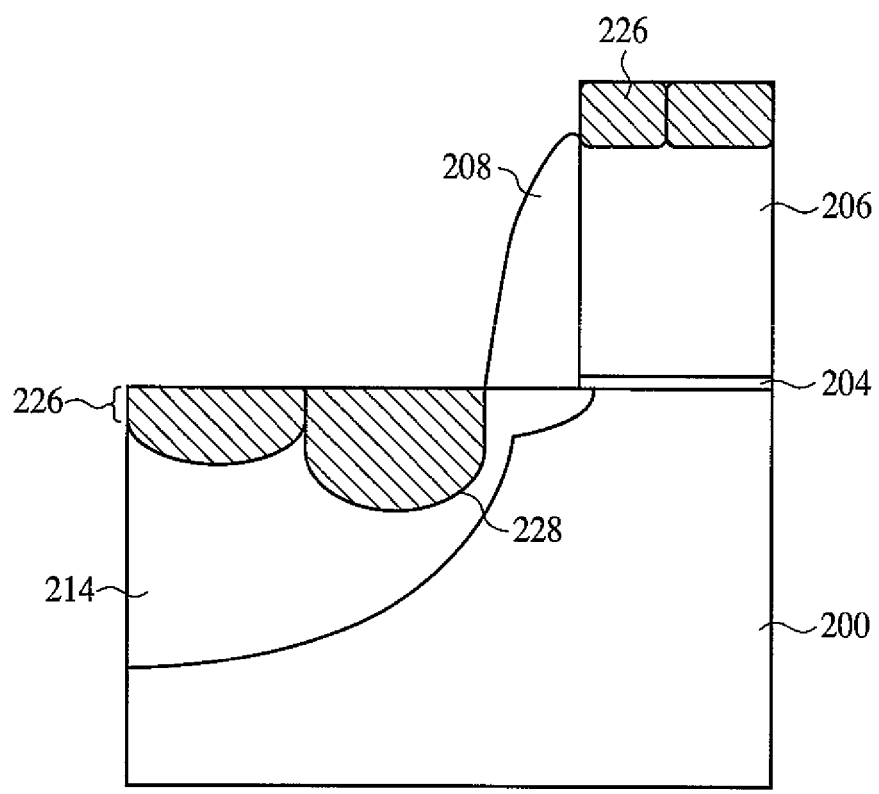
FIG. 50 is a diagrammatic sectional view showing the structure of a MOS transistor subjected to the salicide process using the Ni film.

FIG. 50 is a diagrammatic sectional view showing the structure of a MOS transistor subjected to the salicide process using a Ni film.

As illustrated, a gate electrode 206 is formed on a silicon substrate 200 with a gate insulating film 204 formed therebetween. A sidewall insulating film 208 is formed on the side walls of the gate electrode 206.

In the silicon substrate 200 on both sides of the gate electrode 206, source/drain diffused layers 214 of the extension source/drain structure are formed.

On the gate electrode 206 and the source/drain diffused layers 214, nickel monosilicide (NiSi) films 226 are formed by salicide process using a Ni film. $NiSi_2$ crystals 228 grown in spikes are ununiformly formed in the NiSi films 226 formed on the source/drain diffused layers 214 or below the NiSi films 226.

The NiSi film 226 agglomerates when heated to high temperatures. For example, when heated up to about 400° C., the NiSi film 226 often agglomerates.

Such growth of the $NiSi_2$ crystals 228 and the agglomeration of the NiSi film 226 increase the roughness of the interface between the silicide film and the base silicon. The roughness increase causes the scatter increase of the sheet resistance.

Figure 51:
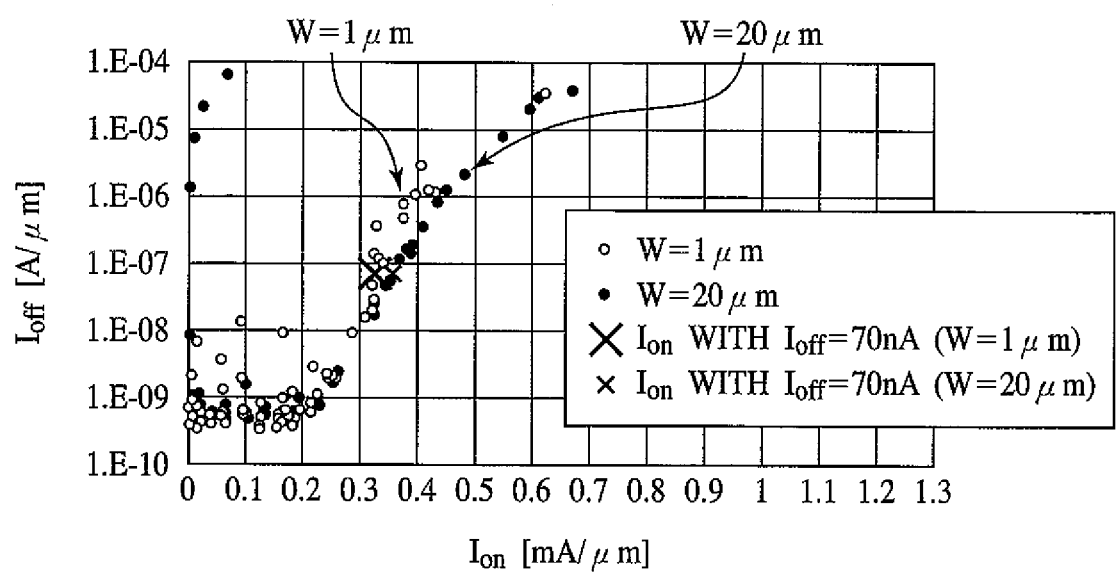
FIG. 51 is a graph of the relationships between the drive current $I_{on}$ and the off current $I_{off}$ ($I_{on}$-$I_{off}$ curve) of PMOS transistors subjected to salicide process using a Ni film.

FIG. 51 is a graph of the relationships between the drive current $I_{on}$ and the off current $I_{off}$ ($I_{on}$-$I_{off}$ curve) of PMOS transistors subjected to the salicide process using a Ni film.

The $I_{on}$-$I_{off}$ curve was measured on PMOS transistors respectively with the gate width W=1 μm and with the gate width W=20 μm.

Figure 52A:
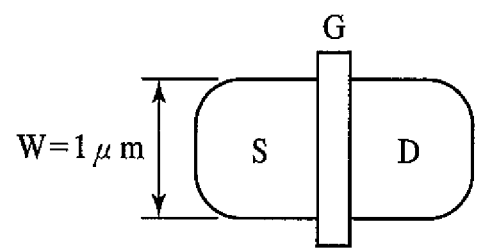
Figure 52B:
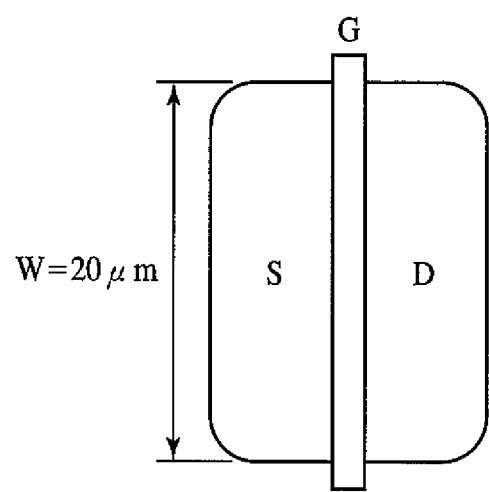

FIGS. 52A-52B are diagrammatic plan views of the gate G, the source S and the drain D of the PMOS transistor the $I_{on}$-$I_{off}$ curve was measured on. FIG. 52A is the plan view of the gate width W=1 μm, and FIG. 52B is the plan view of the gate width W=20 μm. In FIG. 51, the $I_{on}$-$I_{off}$ curve indicated by the ○ marks is of the gate width W=1 μm, the $I_{on}$-$I_{off}$ curve indicated by the ● marks is of the gate width W=20 μm. As for the two larger and smaller x marks, the larger x mark indicates the on current $I_{on}$ of the gate width W=1 μm with the off current $I_{off}$=70 nA, and the smaller x mark indicates the on current $I_{on}$ of the gate width W=20 μm with the off current $I_{off}$=70 nA.

As evident from the $I_{on}$-$I_{off}$ curve shown in FIG. 51, the off current $I_{off}$ of the gate width=1 μm is larger than that of the gate width W=20 μm.

As for the abnormal diffusion of the Ni, which causes the growth of the $NiSi_2$ crystals, it is reported that the abnormal diffusion is caused when the Ni film used in the silicidation is formed relatively thin (refer to, e.g., Non-Patent References 2 to 4).

The highly resistive $NiSi_2$ crystals formed by the abnormal diffusion of the Ni increase the roughness of the interface between the NiSi film and the base silicon, which is a cause for the scatter increase of the sheet resistance and, as described above, is also a cause for the junction leak current increase.

In the semiconductor device of the 65 nm-node technology, the junction depth of the source/drain diffused layer is about 90 nm. Furthermore, in the semiconductor device of 45 nm-node technology, the junction depth of the source/drain diffused layer is about 80 nm. In the semiconductor device having such shallow junction depth, the film thickness of the nickel silicide film formed on the source/drain diffused layer must be below 20 nm including 20 nm so that the generation of the junction leak can be sufficiently suppressed. Accordingly, it is preferable that the Ni film used for the silicidation of the source/drain diffused layer is formed relatively thin. On the other hand, with the Ni film formed relatively thin, as described above, the $NiSi_2$ crystals, which are a cause for the sheet resistance scatter and the junction leak current are formed ununiformly.

As described above, when the silicidation is made by using a Ni film in a downsized MOS transistor, the conventional method cannot help forming the Ni film thin. Accordingly, it is very difficult to prevent the formation of the $NiSi_2$ crystals, which cause the deterioration of the transistor characteristics.

As a process for suppressing the abnormal diffusion of the Ni, it is an idea to use a Ni alloy film for the silicidation to thereby improve the thermal stability of the nickel silicide.

Furthermore, the inventors of the present invention made earnest studies and have obtained the idea that a Ni alloy film for the silicidation is used and, as the thermal processing for the silicidation, millisecond annealing of applying light for an extremely short period of time of the millisecond order or below the millisecond order is made to thereby heat the extreme surface of a substrate-to-be-annealed up to a high temperature, whereby the abnormal diffusion of the Ni can be sufficiently suppressed. The millisecond annealing is made specifically by flash lamp annealing or laser annealing.

The flash lamp annealing made as the millisecond annealing uses a flash lamp, such as xenon flash lamp or others, as the heat source and applies the flash lamp light to a substrate-to-be-annealed for an extremely short irradiation period of time to thermally process the extreme surface of the substrate-to-be-annealed in an extremely short period of time of several milliseconds or less.

In the laser annealing, a laser beam of a prescribed beam shape is caused to scan a substrate-to-be-annealed to be applied thereto to thereby thermally process the substrate-to-be-annealed in an extremely short period of time of several milliseconds or less.

Then, the method of manufacturing the semiconductor device according to a fourth embodiment of the present invention will be explained with reference to FIGS. 24A to 34. FIGS. 24A-24C, 25A-25C, 26A-26C, 27A-27C, 28A-28C, 29A-29C, 30A-30C, 31A-31C, 32A-32C, 33 and 34 are sectional views showing the steps of the method of manufacturing the semiconductor device according to the present embodiment.

First, the surface of a silicon substrate 10 is cleaned with, e.g., ammonia-hydrogen peroxide mixture. As the silicon substrate 10, a p-type silicon substrate with face orientation (100), for example, is used.

Figure 24A:
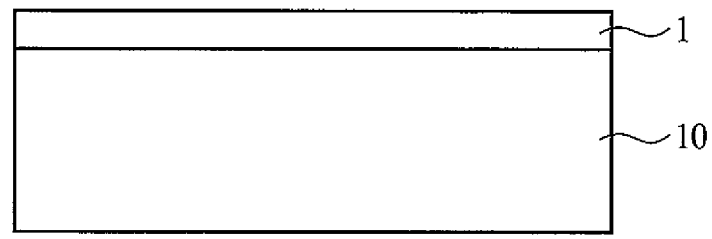
FIGS. 24A-24C, 25A-25C, 26A-26C, 27A-27C, 28A-28C, 29A-29C, 30A-30C, 31A-31C, 32A-32C, 33 and 34 are sectional views showing the steps of the method of manufacturing the semiconductor device according to a fourth embodiment of the present invention.
Figure 24B:
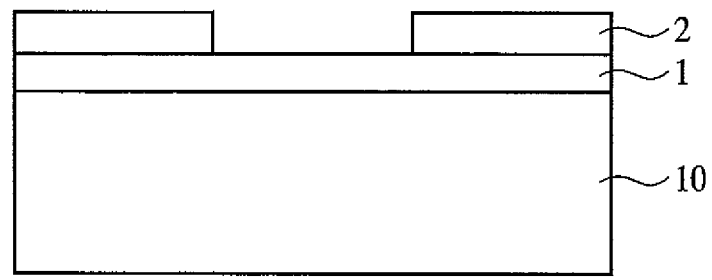

Then, a silicon oxide film 1 of, e.g., a 50 nm-thickness is formed on the silicon substrate 10 by, e.g., thermal oxidation (see FIG. 24A).

Nest, a photoresist film 2 is formed by, e.g., spin coating. Then, the photoresist film 2 is patterned by photolithography. Thus, a photoresist mask 2 for patterning the silicon oxide film 1 is formed (see FIG. 24B).

Figure 24C:
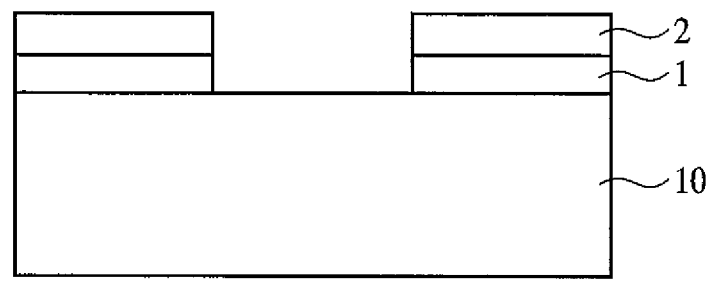

Next, with the photoresist film 2 as the mask, the silicon oxide film 1 is etched (see FIG. 24C).

Next, with the photoresist film 2 and the silicon oxide film 1 as the mask, a dopant impurity is implanted into the silicon substrate 10 by, e.g., ion implantation. Thus, a well 3 of a prescribed conduction type is formed (see FIG. 25A). When a p-type well for forming an NMOS transistor is formed, boron, for example, is used as the p-type dopant impurity, and the conditions for the ion implantation are, e.g., a 120 keV acceleration voltage and a $1 \times 10^{13}$ $cm^{-2}$ dose. When an n-type well for forming a PMOS transistor is formed, phosphorus, for example, is used as the n-type dopant impurity, and the conditions of the ion implantation are a 300 keV acceleration voltage and a $1 \times 10^{13}$ $cm^{-2}$ dose.

Figure 25A:
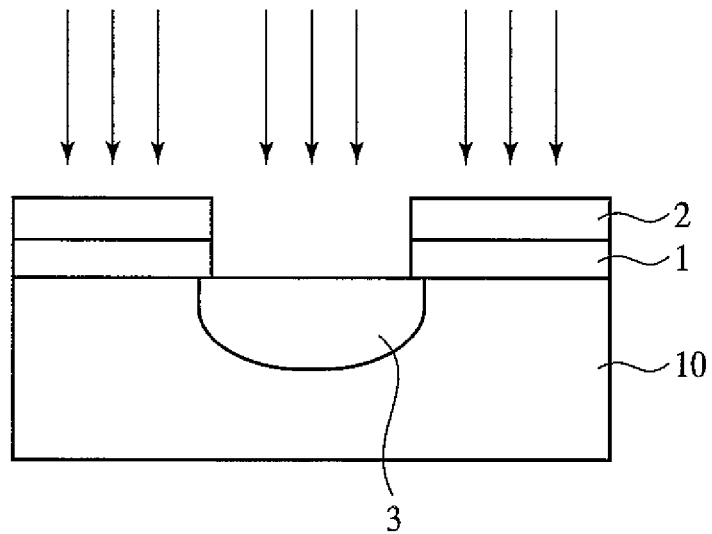
Figure 25B:
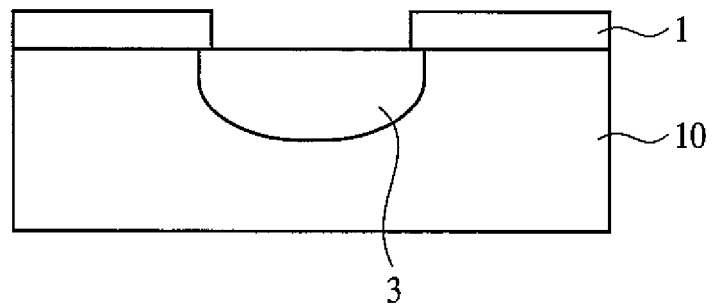

After the well 3 has been formed, the photoresist film 2 is removed (see FIG. 25B).

Figure 25C:
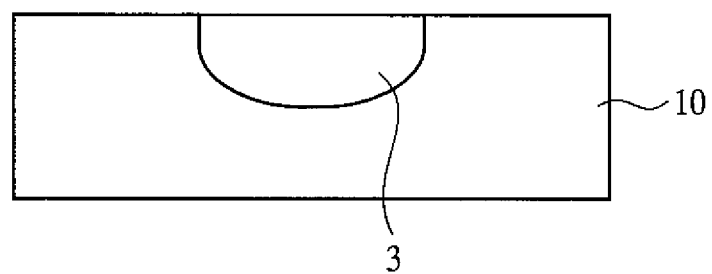

Next, the silicon oxide film 1 etched off (see FIG. 25C).

Next, device isolation regions 12 for defining device regions are formed by, e.g., STI as follows.

Figure 26A:
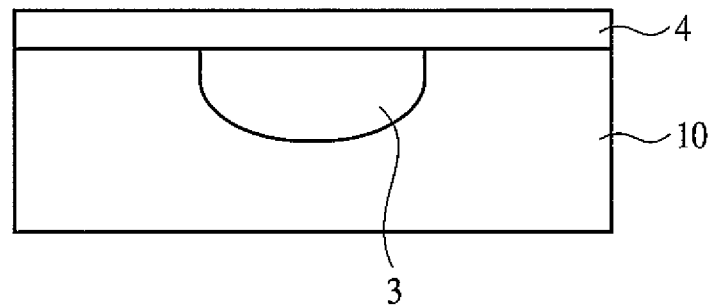
Figure 26B:
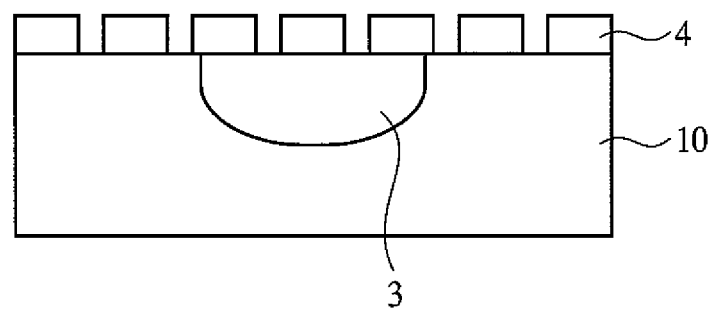
Figure 26C:
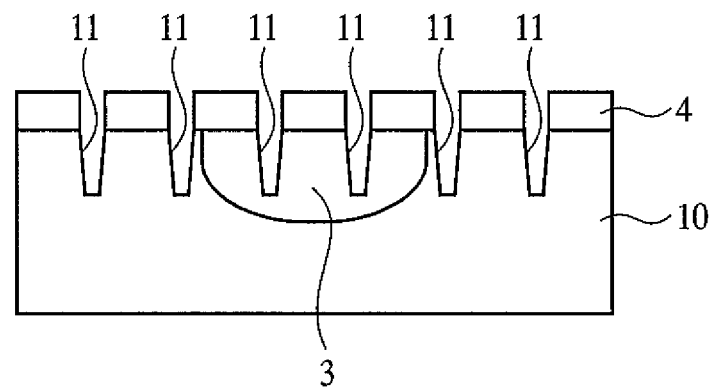

First, a silicon nitride film 4 of, e.g., a 50 nm-thickness is formed on the silicon substrate 10 by, e.g., CVD (see FIG. 26A).

Next, the silicon nitride film 4 is patterned by photolithography and dry etching. Thus, a hard mask 4 for forming trenches for silicon oxide film to be buried in are formed (see FIG. 26B).

Next, the silicon substrate 10 is etched with the silicon nitride film 4 as the mask. Thus, the trenches 11 are formed in the silicon substrate 10 (see FIG. 26C).

Figure 27A:
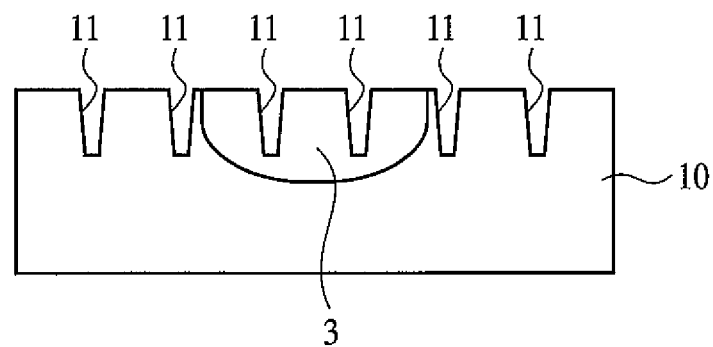

After the trenches 11 have been formed, the silicon nitride film 4 used as the mask is removed by, e.g., wet etching (see FIG. 27A).

Next, on the silicon substrate 10 with the trenches 11 formed in, a silicon oxide film of, e.g., a 300 nm-thickness is formed by, e.g., CVD.

Next, the silicon oxide film is polished by, e.g., CMP (Chemical Mechanical Polishing) until the surface of the silicon substrate 10 is exposed to thereby remove the silicon oxide film on the silicon substrate 10.

Figure 27B:
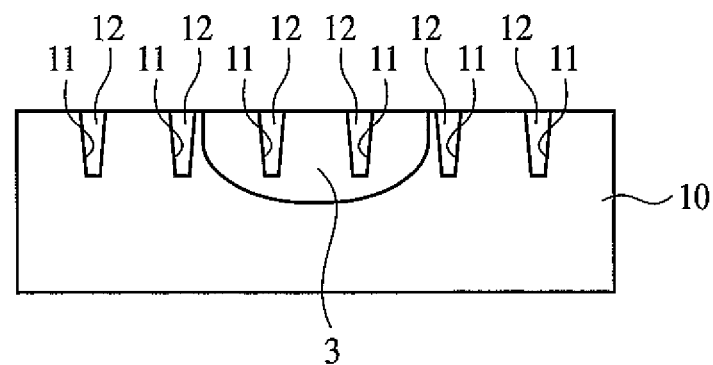

Thus, the device isolation regions 12 of the silicon oxide film buried in the trenches 11 are formed (see FIG. 27B). The device isolation regions 12 define the device regions.

Figure 27C:
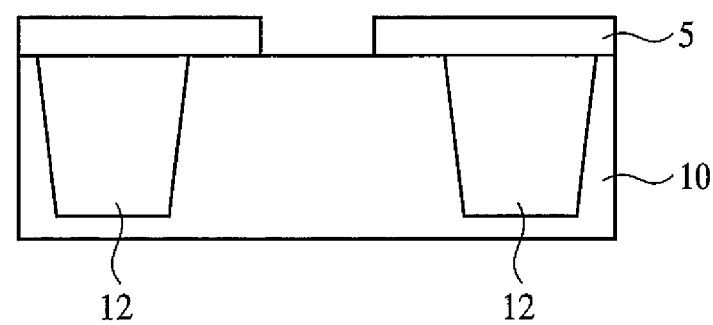

Then, a photoresist film 5 is formed by, e.g., spin coating. Then, the photoresist film 5 is patterned by photolithography. Thus, a photoresist mask 5 for forming a channel doped layer is formed (see FIG. 27C). In FIG. 27C and the followers, a device region for a MOS transistor to be formed in is enlarged.

Next, a dopant impurity is implanted into the silicon substrate 10 by, e.g., ion implantation with the photoresist film 5 as the mask. Thus, the channel doped layer 6 is formed in the silicon substrate 10 (see FIG. 28A). When an NMOS transistor is formed, boron, for example, is used as the p-type dopant impurity, and the conditions for the ion implantation are, e.g., a 15 keV acceleration voltage and a $1 \times 10^{13}$ cm$^{-2}$ dose. When a PMOS transistor is formed, arsenic, for example, is used as the n-type dopant impurity, and the conditions for the ion implantations are, e.g., an 80 keV acceleration voltage and a $1 \times 10^3$ cm$^{-2}$ dose.

After the channel doped layer 6 has been formed, the photoresist film 5 used as the mask is removed.

Then, the dopant impurity in the channel doped layer 6 is activated by thermal processing of, e.g., 950° C. and 10 seconds.

Figure 28A:
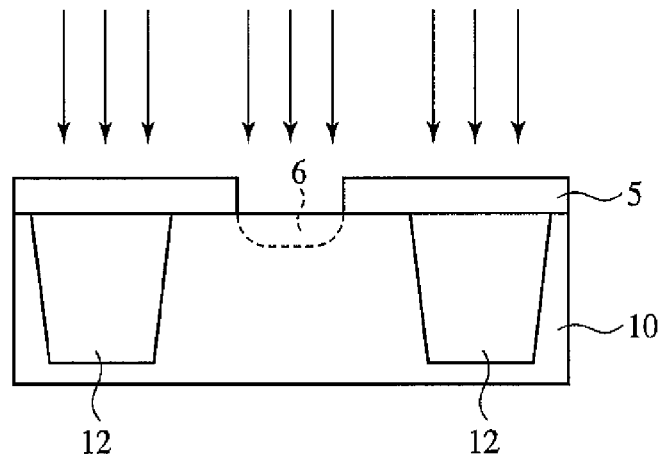
Figure 28B:
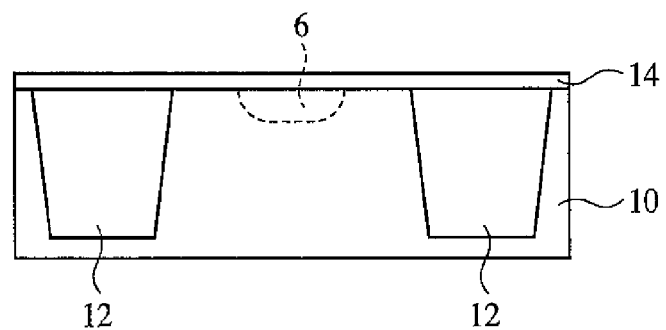

Next, on the silicon substrate 10, a gate insulating film 14 of a silicon oxide film of, e.g., a 2 nm-thickness is formed by, e.g., CVD (see FIG. 28B). The gate insulating film is formed of a silicon oxide film but is not essentially formed of a silicon oxide film. Any other insulating film can be suitably used.

Then, a polysilicon film 16 of, e.g., a 100 nm-thickness is formed on the entire surface by, e.g., CVD.

Figure 28C:
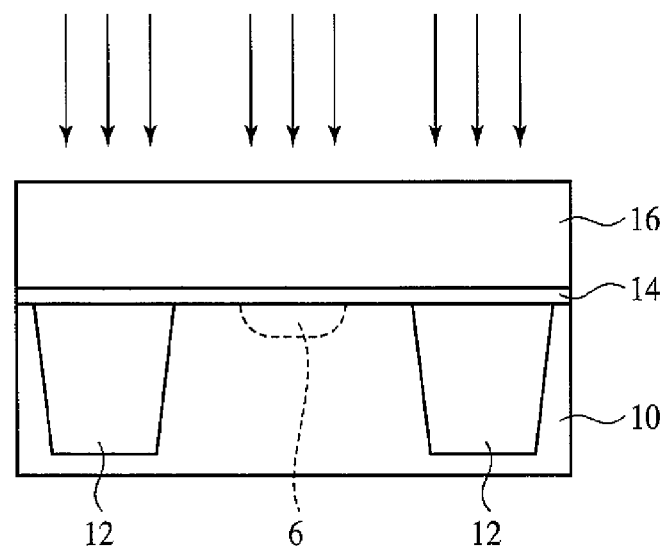
Figure 29A:
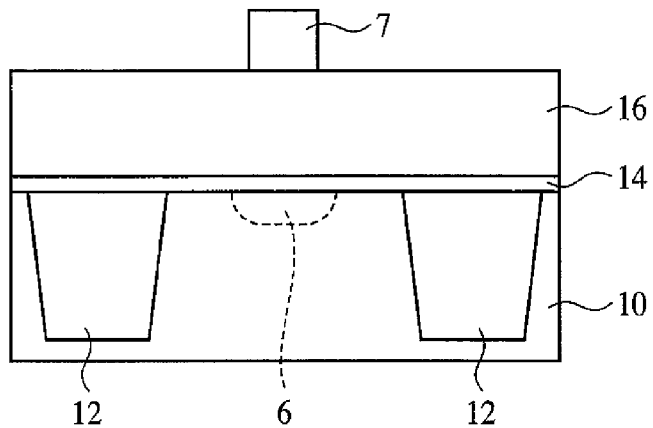
Figure 29B:
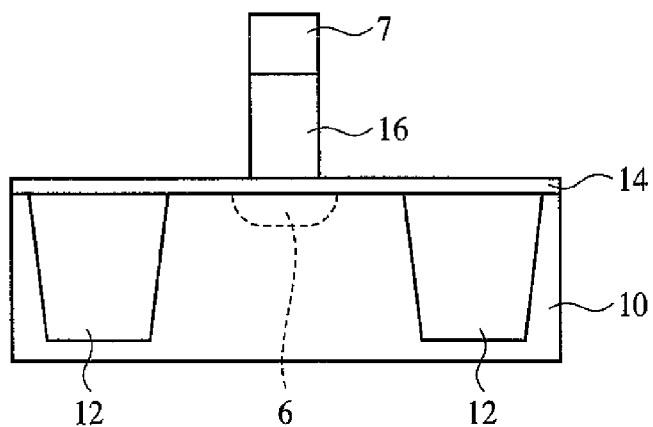
Figure 29C:
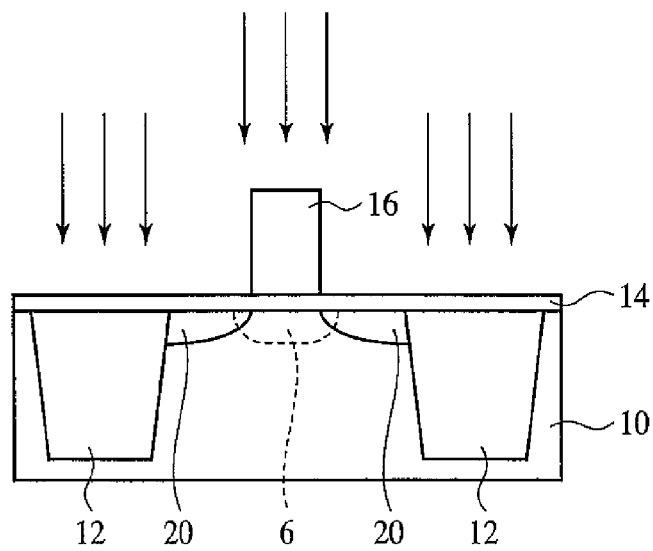

Then, a dopant impurity is implanted into the polysilicon film 16 by, e.g., ion implantation (see FIG. 28C). When the NMOS transistor is formed, phosphorus, for example, is used as the n-type dopant impurity, and the conditions for the ion implantation are, e.g., a 10 keV acceleration voltage and a $1 \times 10^{16}$ cm$^{-2}$ dose. When the PMOS transistor is formed, boron, for example, is used as the p-type dopant impurity, and the conditions for the ion implantation are, e.g., a 5 keV acceleration voltage and a $5 \times 10^{15}$ cm$^{-2}$ dose.

Then, a photoresist film 7 is formed by, e.g., spin coating. Then, the photoresist film 7 is patterned by photolithography. Thus, a photoresist mask 7 for patterning the polysilicon film 16 is formed (see FIG. 29A).

Then, the polysilicon film 16 is dry etched with the photoresist film 7 as the mask. Thus, a gate electrode 16 of the polysilicon film is formed (see FIG. 29B).

After the gate electrode 16 has been formed, the photoresist film 7 used as the mask is removed.

Then, with the gate electrode 16 as the mask, a dopant impurity is implanted into the silicon substrate 10 on both sides of the gate electrode 16 by, e.g., ion implantation. When the NMOS transistor is formed, arsenic, for example, is used as the n-type dopant impurity, and the conditions for the ion implantation are, e.g., a 1 keV acceleration voltage and a $1 \times 10^{15}$ cm$^{-2}$ dose. When the PMOS transistor is formed, boron, for example, is used as the p-type dopant impurity, and the conditions for the ion implantation are, e.g., a 0.5 keV voltage and a $1 \times 10^{15}$ cm$^{-2}$ dose. Thus, shallow impurity diffused regions 20 forming the extension regions of the extension source/drain structure are formed (see FIG. 29C).

Figure 30A:
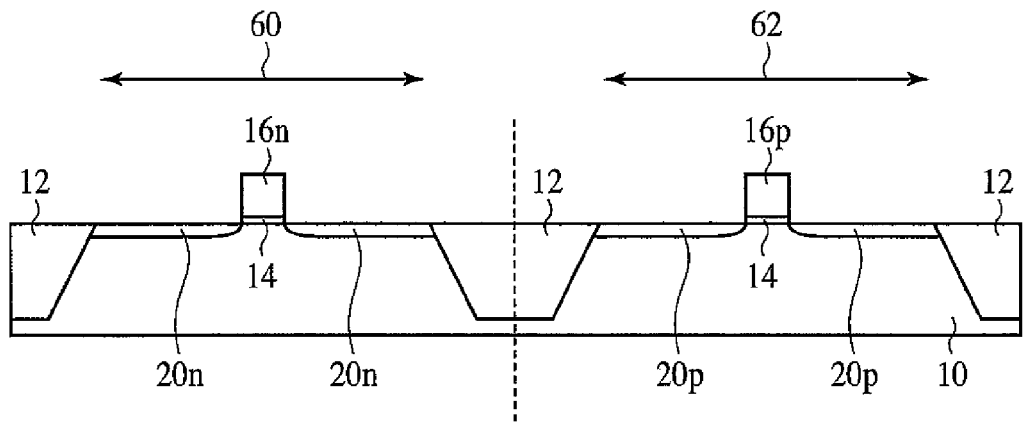
Figure 30B:
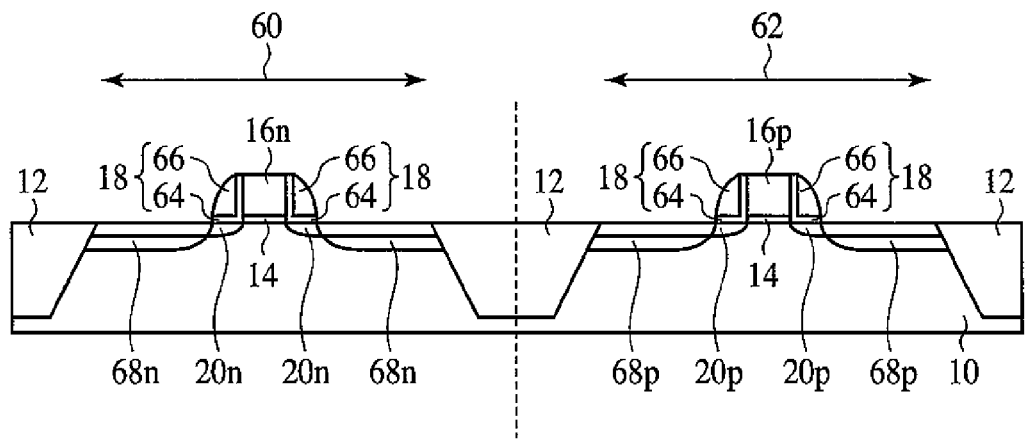

In FIG. 30A, the n-type shallow impurity diffused layers 20n forming the extension regions are formed in the silicon substrate 10 on both sides of the gate electrode 16n in the NMOS transistor-to-be-formed region 60 and the p-type shallow impurity diffused layers 20p forming the extension regions in the silicon substrate 10 on both sides of the gate electrode 16p in the PMOS transistor-to-be-formed region 62.

Then, a silicon oxide film 64 of, e.g., a 10 nm-thickness is formed on the entire surface by, e.g., CVD.

Next, a silicon nitride film 66 of, e.g., an 80 nm-thickness is formed on the entire surface by, e.g., CVD.

Next, the silicon nitride film 66 and the silicon oxide film 64 are anisotropically etched by, e.g., RIE. Thus, a sidewall insulating film 18 of the two-layer structure of the silicon oxide film 64 and the silicon nitride film 66 is formed on the side walls of the gate electrode 16n and the gate electrode 16p.

Then, with the gate electrodes 16, 16p and the sidewall insulating film 18 as the mask, dopant impurities are implanted into the silicon substrate 10 on both sides of the gate electrodes 16n, 16p and the sidewall insulating film 18 by, e.g., ion implantation. When the NMOS transistor is formed, arsenic, for example, is used as the n-type dopant impurity. When the PMOS transistor is formed, boron, for example, is used as the p-type dopant impurity. Thus, impurity diffused regions 68n, 68p for making the extension regions 20n, 20p with low resistivity are formed (see FIG. 30B).

Next, a silicon oxide film 70 of, e.g., a 40 nm-thickness is formed on the entire surface by, e.g., CVD.

Next, the silicon oxide film 70 is anisotropically etched by, e.g., RIE. Thus, a sidewall insulating film 70 of the silicon oxide film is further formed on the side walls of the sidewall insulating film 18.

Next, with the gate electrodes 16n, 16p and the sidewall insulating films 18, 70 as the mask, dopant impurities are implanted into the silicon substrate 10 on both sides of the gate electrodes 16n, 16p and the sidewall insulating films 18, 70 by, e.g., ion implantation. When the NMOS transistor is formed, phosphorus, for example, is used as the n-type dopant impurity. When the PMOS transistor is formed, boron, for example, is used as the p-type dopant impurity. Thus, impurities diffused regions 22n, 22p forming the deep regions of the source/drain diffused layers are formed.

Next, prescribed thermal processing is made to thereby activate the dopant impurities implanted in the impurity diffused regions 20n, 20p, 68n, 68p, 22n, 22p.

Figure 30C:
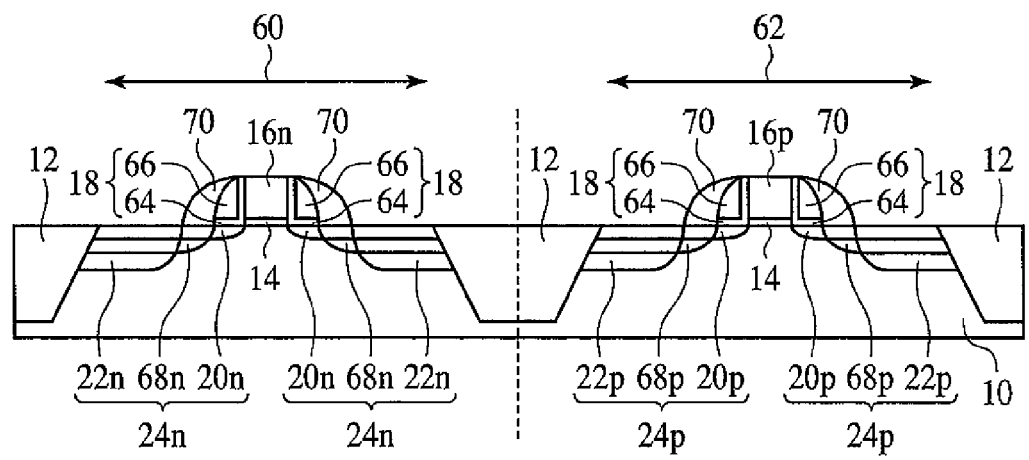

Thus, in the silicon substrate 10 on both sides of the gate electrodes 16n, 16p, source/drain diffused layers 24n, 24p formed of the extension regions, i.e., the shallow impurity diffused regions 20n, 20p, the impurity diffused regions 68n, 68p for making the extension regions 22n 22p with low resistivity and the deep impurity diffused regions 22n, 22p are formed (see FIG. 30C).

Figure 31A:
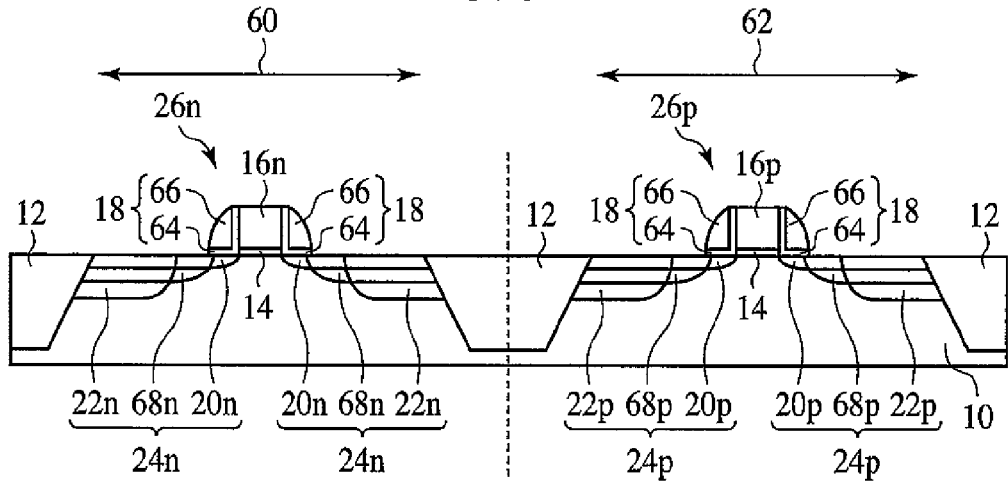
Figure 31B:
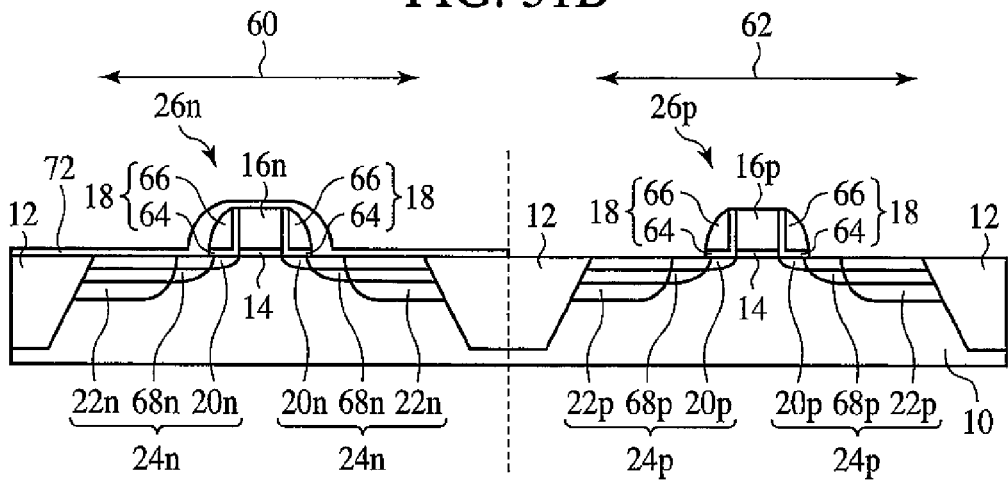
Figure 31C:
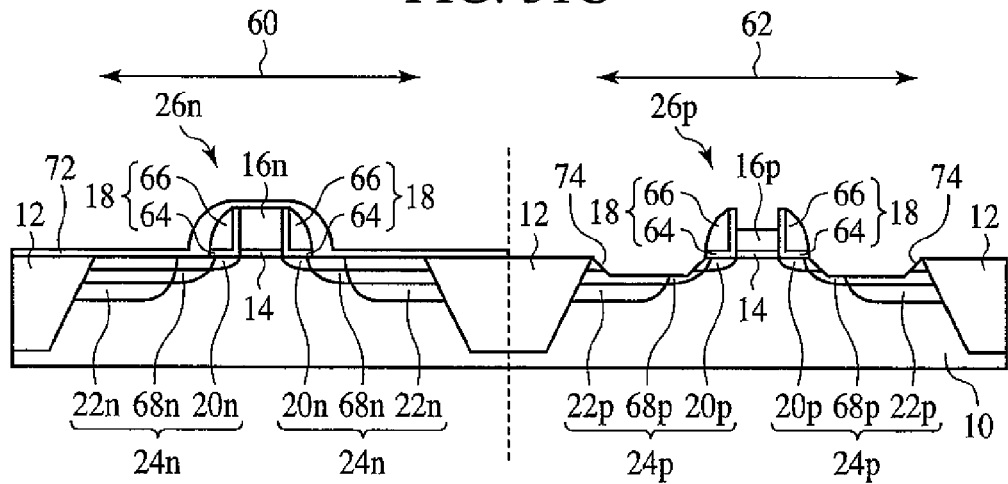

Then, the sidewall insulating film 70 formed on the outside of the sidewall insulating film 18 is etched off (see FIG. 31A).

Thus, the NMOS transistor 26n is formed in the NMOS transistor-to-be-formed region 60, and the PMOS transistor 26p is formed in the PMOS transistor-to-be-formed region.

Then, a silicon oxide film 72 of, e.g., a 40 nm-thickness is formed on the entire surface by, e.g., CVD.

Then, the silicon oxide film 72 is patterned by photolithography and dry etching. Thus, the silicon oxide film 72 on the PMOS transistor-to-be-formed region 62 and on the device isolation region 12 defining the PMOS transistor-to-be-formed region 62 is removed, and the silicon oxide film 72 on the NMOS transistor-to-be-formed region 60 and on the device isolation region 12 defining the NMOS transistor-to-be-formed region 60 is selectively left (see FIG. 31B).

Next, with the silicon oxide film 72 as the mask, the silicon substrate 10 is etched with a high selectivity ratio to the silicon oxide film by, e.g., RIE. Thus, recesses 74 of, e.g., a 50 nm-depth are formed in the source/drain diffused layers 24$p$ on both sides of the gate electrode 16$p$ and the sidewall insulating film 18. At this time, the upper part of the gate electrode 16$p$ of polysilicon film is also etched off (see FIG. 31C).

Next, the surface of the silicon substrate 10 with the recesses 74, etc. formed in, is cleaned for, e.g., 5 seconds with dilute hydrofluoric acid (e.g., HF:H$_2$O=5:100). Then, with the silicon oxide film 72 as the mask, silicon germanium films (Si$_{1-X}$Ge$_X$ films) 76$a$, 76$b$ with a dopant impurity implanted in are selectively epitaxially grown on the gate electrode 16$p$ and in the recesses 74 by, e.g., CVD (see FIG. 32A) As the dopant impurity, boron, for example, is used. The composition ratio X of the Ge can be set suitably in the range of 0<X<1.

Thus, in the PMOS transistor-to-be-formed region 62, the Si$_{1-X}$Ge$_X$ films 76$b$ are buried in the recesses 74 of the source/drain diffused layers 24$p$. The gate electrode 16$p$ has the Si$_{1-X}$Ge$_X$ film 76$a$ on the polysilicon film.

As described above, in the present embodiment as well in the second embodiment, in the PMOS transistor 26$p$, the Si$_{1-X}$Ge$_X$ films 76$b$ are buried in the source/drain regions. Accordingly, the hole mobility can be high, and the operation speed of the PMOS transistor can be improved.

Next, the silicon oxide film 72 formed on the NMOS transistor-to-be-formed region 60 is etched off.

Then, the natural oxide film formed on the surface of the gate electrode 16$n$, the surfaces of the source/drain diffused layers 24$n$, the surface of the Si$_{1-X}$Ge$_X$ film 76$a$ of the gate electrode 16$p$ and the surfaces of the Si$_{1-X}$Ge$_X$ films 76$b$ buried in the recesses 74 of the source/drain diffused layers 24$p$ is removed by, e.g., hydrofluoric acid processing.

Next, a NiPt film 28 of, e.g., an 8 nm-thickness is formed on the entire surface by, e.g., sputtering using a Ni target with Pt added. The film thickness of the NiPt film 28 may be set above 7 nm including 7 nm for making the silicidation sufficient, but to ensure the advance of the silicidation by flash lamp annealing or laser annealing which will be described later, it is preferable to set the thickness at below 10 nm including 10 nm at maximum. The NiPt film 28 is deposited thinner in the present embodiment than in a fifth and a sixth embodiments which will be described later for the following reason. That is, in the present embodiment, wherein flash lamp annealing or laser annealing is made after the NiPt film 28 has been deposited, when the NiPt film 28 is thick, the reflection of the flash lamp light or the laser beam becomes strong, and the reaction of the NiPt with the Si fails to advance. In the fifth and the sixth embodiments, as will be described later, after the deposition of the NiPt film 28, low-temperature annealing, and the selective etch of the unreacted part of the NiPt film 28 have been sequentially made, the flash lamp annealing or the laser annealing is made, whereby the film thickness of the silicide film after the unreacted part of the NiPt film 28 has been selectively etched off does not depend on the film thickness of the initial NiPt film 28. The composition ratio of the Pt of the target is, e.g., 1-1 10 atom %. When the NiPt film 28 is formed by using such target, the composition ratio of the Pt of the NiPt film 28 becomes, e.g., about 1-10 atom %. The Pt composition ratio of the target is set at, e.g., 1-10 atom %, because the relative resistance of the silicide film to be formed in a later step is increased when the Pt composition ratio is too large.

Figure 32A:
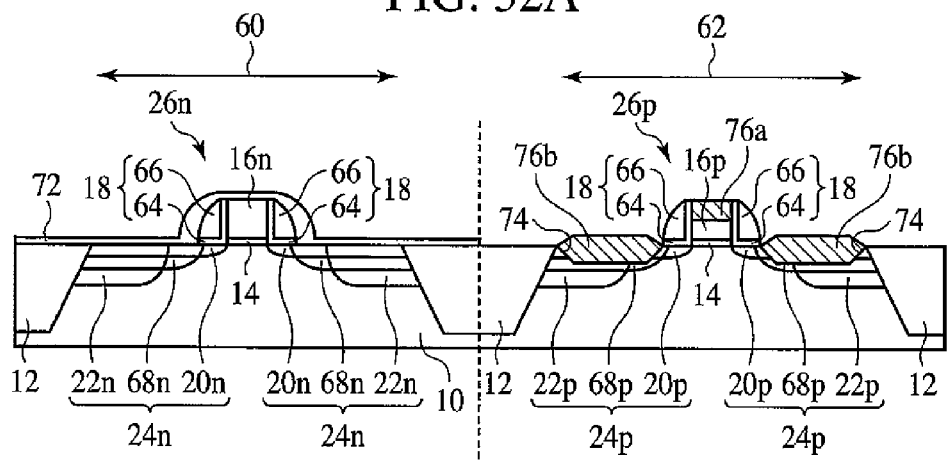
Figure 32B:
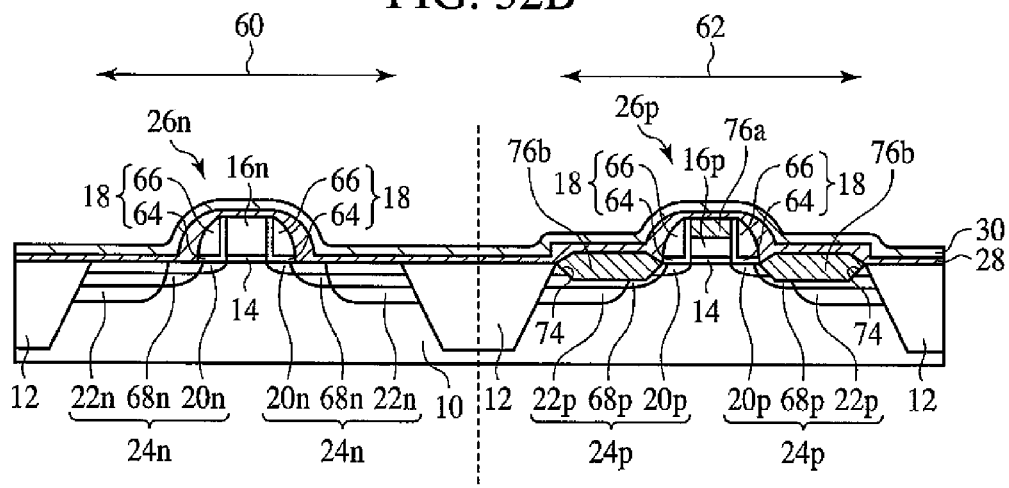
Figure 32C:
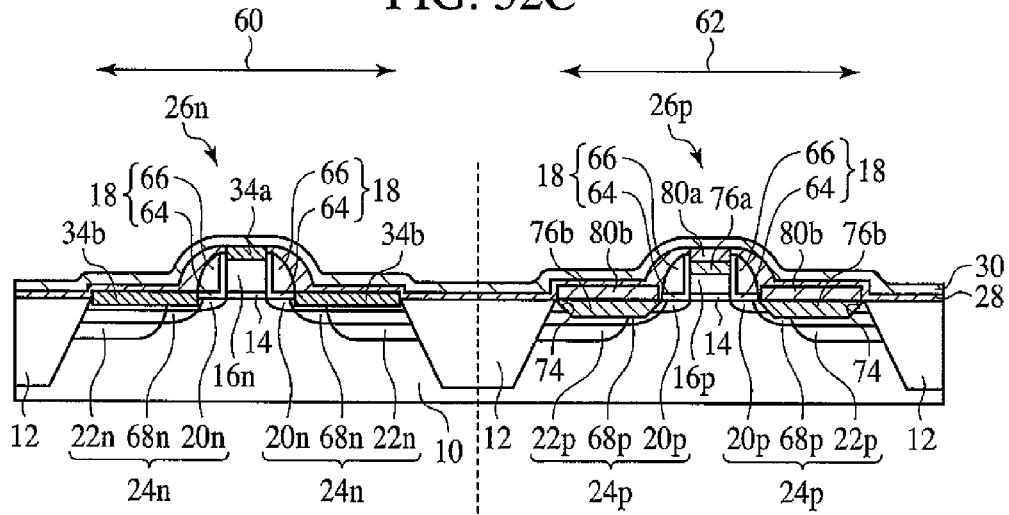

Then, a protective film 30 of, a TiN film of, e.g., a 5-30 nm-thickness is formed on the NiPt film 28 by, e.g., sputtering (see FIG. 32B). The protective film 30 is for preventing the oxidation of the NiPt film 28. The protective film 30 prevents the oxidation of even a nickel platinum silicide film to be formed in a later step. The protective film 30 is not essentially a TiN film. The protective film 30 may be a Ti film of, e.g., a 5-30 nm-thickness.

Next, as the thermal processing for the silicidation, flash lamp annealing is made. The conditions for the flash lamp annealing are, e.g., 24-28 J/cm$^2$ energy density of the flash lamp light, 0.5-1.5 msec application period of time of the flash lamp light, and 150-250° C. assist temperature, i.e., the substrate temperature. Specifically, for, example, the energy density is 26 J/cm$^2$, the application period of time is 0.8 msec, and the assist temperature is 200° C.

In place of the flash lamp annealing, laser annealing may be made. When the laser annealing is made, the conditions for the laser annealing are, e.g., 0.1-3.0 J/cm$^2$ energy density of the laser beam, 10-200 nsec application period of time of the laser beam, and 150-250° C. assist temperature.

Thus, for the NMOS transistor 26$n$, the NiPt of the NiPt film 28 and the Si of the upper part of the gate electrode 16$n$ are reacted with each other, and the NiPt of the NiPt film 28 and the Si of the upper parts of the source/drain diffused layers 24$n$ are reacted with each other. Thus, a Ni(Pt)Si film 34$a$ is formed on the gate electrode 16$n$, and the Ni(Pt)Si films 34$b$ are formed on the source/drain diffused layer 24$n$ (see FIG. 32C).

For the PMOS transistor 26$p$, the NiPt of the NiPt film 28 and the Si$_{1-X}$Ge$_X$ film 76$a$ of the gate electrode 16$p$ are reacted with each other, and the NiPt of the NiPt film 28 and the Si$_{1-X}$Ge$_X$ of the upper parts of the Si$_{1-X}$Ge$_X$ films 76$b$ buried in the recesses 74 of the source/drain diffused layers 24$p$ are reacted with each other. Thus, the Ni(Pt)Si$_{1-X}$Ge$_X$ film 80$a$ is formed on the Si$_{1-X}$Ge$_X$ film 76$a$, and the Ni(Pt)Si$_{1-X}$Ge$_X$ film 80$b$ is formed on the Si$_{1-X}$Ge$_X$ film 76$b$ (see FIG. 32C).

As described above, the method of manufacturing the semiconductor device according to the present embodiment is characterized mainly in that as the thermal processing for the silicidation after the NiPt film 28 has been formed, flash lamp annealing or laser annealing, which thermally processes the extreme surface layer of a substrate-to-be-annealed in an extreme short period of time, is made.

In the method of manufacturing the semiconductor device according to the present embodiment, only the NiPt film 28, the Si and the Si$_{1-X}$Ge$_X$ near the interface with the NiPt film 28 are heated by the flash lamp annealing or the laser annealing.

That is, in the NMOS transistor 26$n$, by the flash lamp annealing or the laser annealing, only the NiPt film 28, the part of the gate electrode 16$n$ which is near the interface with the NiPt film 28, and the parts of the source/drain diffused layers 24$n$ which are near the interfaces with the NiPt film 28 are heated.

In the PMOS transistor 26$p$, by the flash lamp annealing or the laser annealing, only the NiPt film 28, the part of the Si$_{1-X}$Ge$_X$ film 76$a$ which is near the interface with the NiPt film 28, and the parts of the Si$_{1-X}$Ge$_X$ films 76$b$ which are near the interfaces with the NiPt film 28 are heated.

As described above, only the NiPt film 28, and the Si and Si$_{1-X}$Ge$_X$ near the interface with the NiPt film 28 are heated to make the silicidation, whereby the abnormal diffusion of the Ni can be sufficiently suppressed. Accordingly, the sheet resistance and the sheet resistance scatter of the silicided gate electrodes 16$n$, 16$p$ and the source/drain diffused layers 24$n$, 24$p$ can be decreased, and the junction leak current can be also decreased.

In the flash lamp annealing, when the energy density of the flash lamp light is too low, or the application period of time is too short, the formed nickel silicide film cannot be made sufficiently with low resistivity. When the energy density of the flash lamp light is too high, or the application period of time is too long, the abnormal diffusion of the Ni takes place. In view of this, it is preferable that, in the flash lamp annealing, the energy density of the flash lamp light is set at 24-28 J/cm$^2$, and the application period of time of the flash lamp light is set at 0.5-1.5 msec.

Also in making the laser annealing in place of the flash lamp annealing, in view of the above, it is preferable to set the energy density of the laser beam at 0.1-3.0 J/cm$^2$ and set the application period of time of the laser beam at 10-200 nsec.

The flash lamp annealing or the laser annealing may be made only once or a plurality of times. When the flash lamp annealing or the laser annealing is made a plurality of times, the energy density of the flash lamp light or the laser beam for each application is set lower than that in the case where the anneal is made only once.

Figure 33:
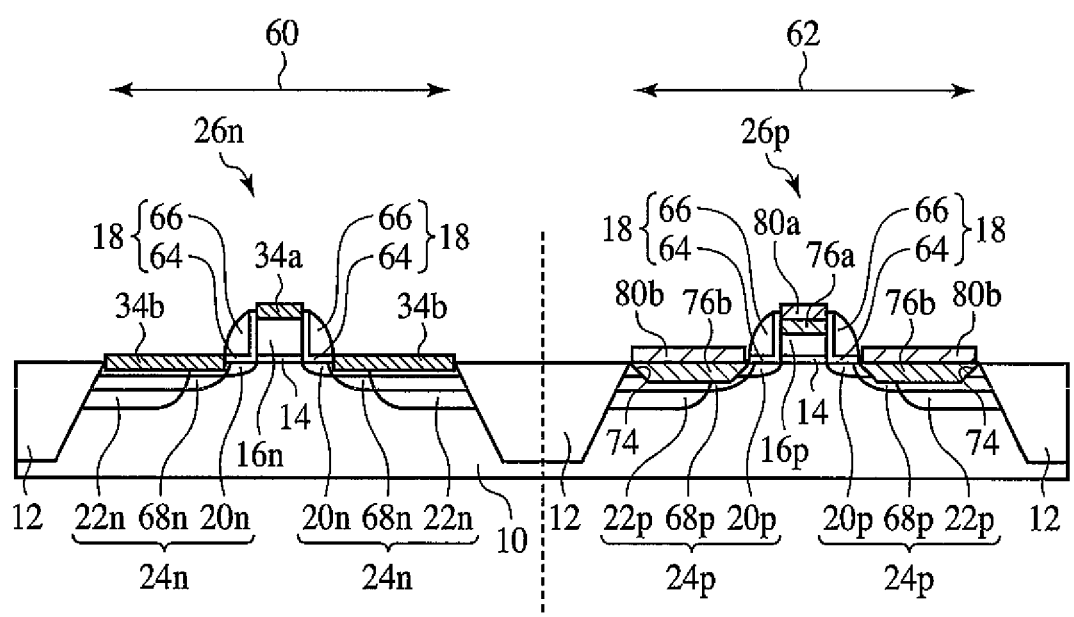

Then, the protective film 30, and the unreacted part of the NiPt film 28 with the Si or the $Si_{1-X}Ge_X$ are respectively selectively removed by wet etching (see FIG. 33). The etchant is, e.g., SPM liquid, which is a chemical liquid of sulfuric acid and hydrogen peroxide mixture. The mixture ratio of the sulfuric acid and the hydrogen peroxide is, e.g., 3:1. The temperature of the SPM liquid is, e.g., 80° C. In place of SPM liquid, HPM liquid, which is a chemical liquid of the mixture of hydrochloric acid, hydrogen peroxide and water, may be used.

Next, a silicon nitride film 44 of, e.g., a 50 nm-thickness is formed on the entire surface by, e.g., plasma CVD. The temperature of forming the silicon nitride film 44 is, e.g., 500° C. The steps following the salicide process are performed at, e.g., below 500° C. including 500° C. so as to suppress the agglomeration of the Ni(Pt)Si film 34a, 34b, the Ni(Pt)Si$_{1-X}$Ge$_X$ film 80a, 80b.

Then, on the silicon nitride film 44, a silicon oxide film 46 of, e.g., a 600 nm-thickness is formed by, e.g., plasma CVD. The temperature of forming the silicon oxide film 46 is, e.g., 400° C.

Next, the silicon film 46 is planarized by, e.g., CMP.

Then, by photolithography and dry etching, in the silicon oxide film 46 and the silicon nitride film 44, contact holes 48a are formed respectively down to the Ni(Pt)Si film 34a and the Ni(Pt)Si$_{1-X}$Ge$_X$ film 80a, and contact holes 48b are formed respectively down to the Ni(Pt)Si films 34b and the Ni(Pt)Si$_{1-X}$Ge$_X$ films 80b.

Then, on the silicon oxide film 46 with the contact holes 48a, 48b formed in, a barrier metal 50 of, e.g., a 50 nm-thickness titanium nitride film is formed by, e.g., sputtering.

Next, on the barrier metal 50, a tungsten film 52 of, e.g., a 400 nm-thickness is formed by, e.g., CVD.

Next, the tungsten film 52 and the barrier metal 50 are polished by, e.g., CMP until the surface of the silicon oxide film 46 is exposed. Thus, contact plugs 54a, 54b of the barrier metal 50 and the tungsten film 52 are formed respectively in the contact holes 48a, 48b.

Next, an inter-layer insulating film 56 is formed by, e.g., CVD.

Next, a trench for an interconnection layer 96 to be buried in is formed in the inter-layer insulating film 56 by photolithography.

Next, a barrier metal 92 of a tantalum film is formed by, e.g., sputtering.

Next, a copper film 94 is formed by, e.g., electroplating.

Then, the copper film 94 and the barrier metal 92 are polished b, e.g., CMP until the surface of the inter-layer insulating film 56 is exposed. Thus, the interconnection layer 96 of the barrier metal 92 and the copper film 94 are formed.

Next, an inter-layer insulating film 98 is formed on the entire surface by, e.g., CVD.

Next, a trench for an interconnection layer 104 to be formed in is formed in the inter-layer insulating film 98 by photolithography.

Next, a barrier metal 100 of a tantalum film is formed by, e.g., sputtering.

Next, a copper film 102 is formed by, e.g. electroplating.

Next, the copper film 102 and the barrier metal 100 are polished by, e.g., CMP until the surface of the inter-layer insulating film 98 is exposed. Thus, an interconnection layer 104 of the barrier metal 100 and the copper film 102 is formed.

Next, aluminum film is grown by, e.g., sputtering.

Next, by photolithography, the aluminum film is patterned. Thus, electrodes 106 of the aluminum film are formed.

As described above, according to the present embodiment, after the NiPt film 28 has been formed, the flash lamp annealing or the laser annealing is made for the thermal processing for the silicidation to thereby heat only the NiPt film 28, the Si and the $Si_{1-X}Ge_X$ near the interface with the NiPt film 28 for the silicidation, whereby the abnormal diffusion of the Ni can be sufficiently suppressed. Accordingly, the sheet resistance of the silicided gate electrodes 16n, 16p and the source/drain diffused layers 24n, 24p and the sheet resistance scatter can be decreased, and the junction leak current can be decreased.

A Fifth Embodiment

The method of manufacturing the semiconductor device according to a fifth embodiment of the present invention will be explained with reference to FIGS. 35A to 36B. FIGS. 35A-35B and 36A-36B are sectional views showing the steps of the method of manufacturing the semiconductor device according to the present embodiment. The same members of the present embodiment as those of the method of manufacturing the semiconductor device according to the fourth embodiment are represented by the same reference numbers not to repeat or to simplify their explanation.

The method of manufacturing the semiconductor device according to the present embodiment is characterized mainly in that when the silicidation is made by two-step thermal processing, the second thermal processing for the silicidation after the unreacted part of the NiPt film 28 with Si or $Si_{1-X}Ge_X$ has been removed is made by flash lamp annealing or laser annealing.

Figure 35A:
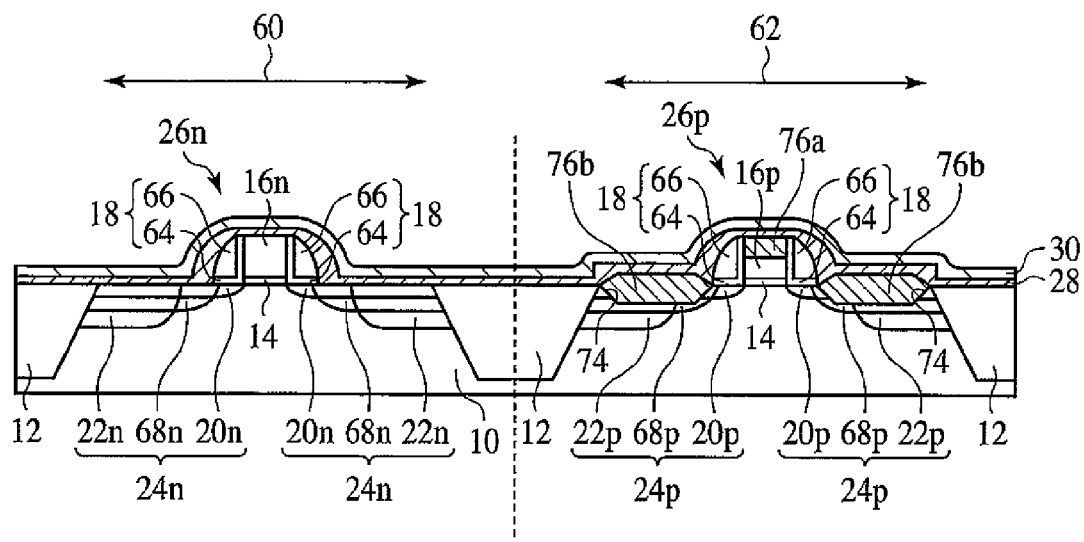
FIGS. 35A-35B and 36A-36B are sectional views showing the steps of the method of manufacturing the semiconductor device according to a fifth embodiment of the present invention.
Figure 35B:
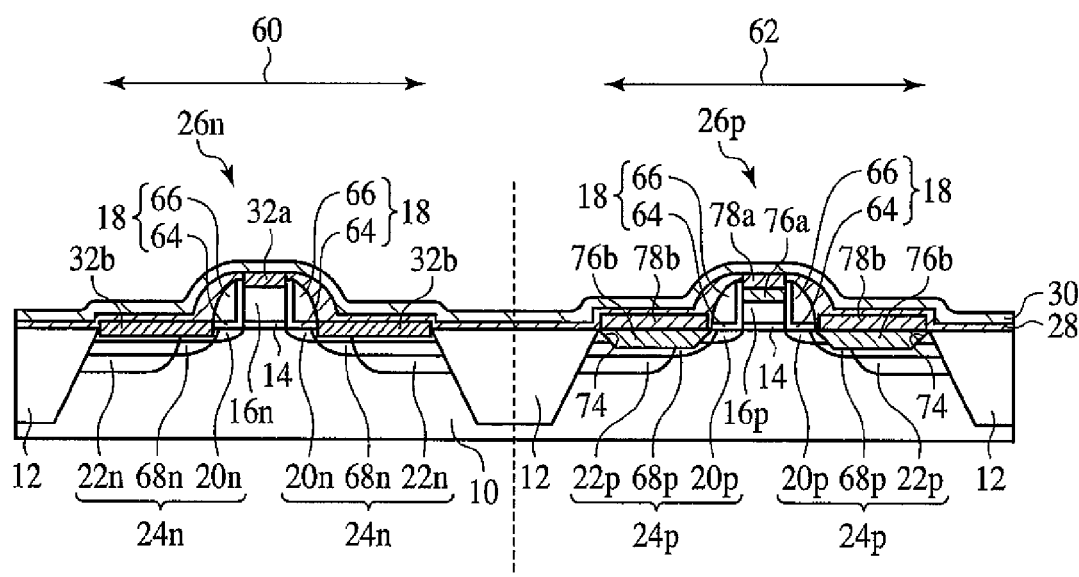

First, in the same way as in the method of manufacturing the semiconductor device according to the fourth embodiment shown in FIGS. 25A to 32B, the members up to the protective film 30 are formed (see FIG. 35A). The film thickness of the NiPt film 28 is set at, e.g., 20 nm. The film thickness of the NiPt film 28 may be set at above 8 nm including 8 nm to make the silicidation sufficient, but is preferably set at below 200 nm including 200 nm at maximum so as to ensure the removal of the unreacted part of the NiPt film 28 after the silicidation.

Then, as the first thermal processing for the silicidation, thermal processing of, e.g., 220-260° C. and 10-600 seconds is made by, e.g., RTA. Specifically, thermal processing of, e.g., 260° C. and 30 seconds is made.

The first thermal processing reacts, for the NMOS transistor 26, the NiPt of the NiPt film 28 with the Si of the upper part of the gate electrode 16n and the NiPt of the NiPt film 28 with the Si of the upper parts of the source/drain diffused layers 24n. Thus, a Ni$_2$(Pt)Si film 32a is formed on the gate electrode 16n, and Ni$_2$(Pt)Si films 32b are formed on the source/drain diffused layers 24n (see FIG. 35B).

The first thermal processing reacts, for the PMOS transistor, the NiPt of the NiPt film 28 with the $Si_{1-X}Ge_X$ of the upper part of the $Si_{1-X}Ge_X$ film 76 of the gate electrode 16p and the NiPt of the NiPt film 28 with the $Si_{1-X}Ge_X$ of the upper parts of the $Si_{1-X}Ge_X$ films 76b buried in the recesses 74 of the source/drain diffused layers 24p. Thus, a $Ni_2(Pt)Si_{1-X}Ge_X$ film 78a is formed on the $Si_{1-X}Ge_X$ film 76a and $Ni_2(Pt)Si_{1-X}Ge_X$ films 78b are formed on the $Si_{1-X}Ge_X$ films 76b (see FIG. 35B).

Figure 36A:
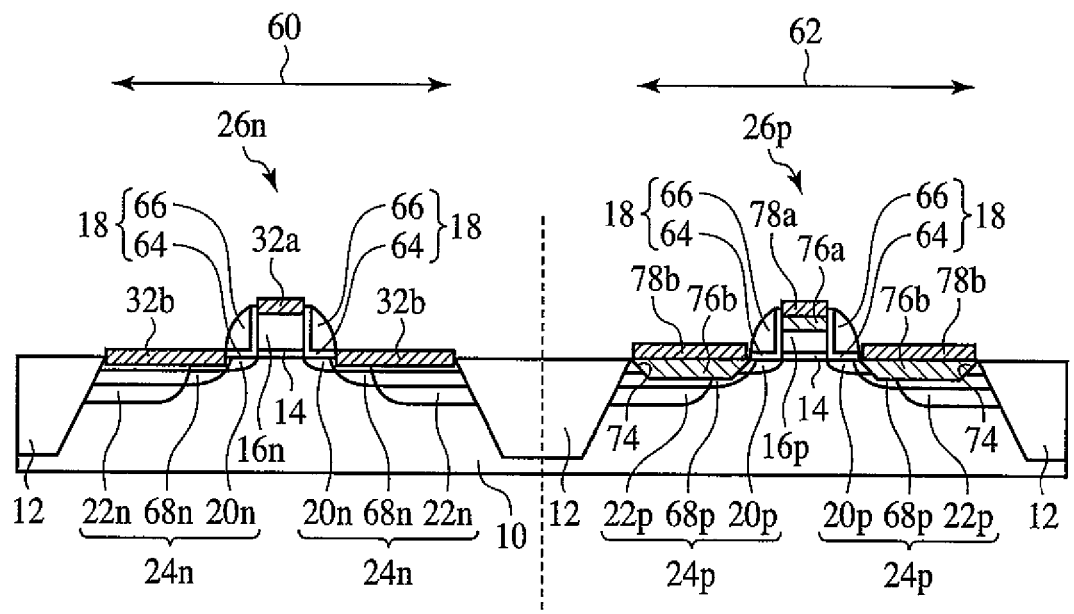
Figure 36B:
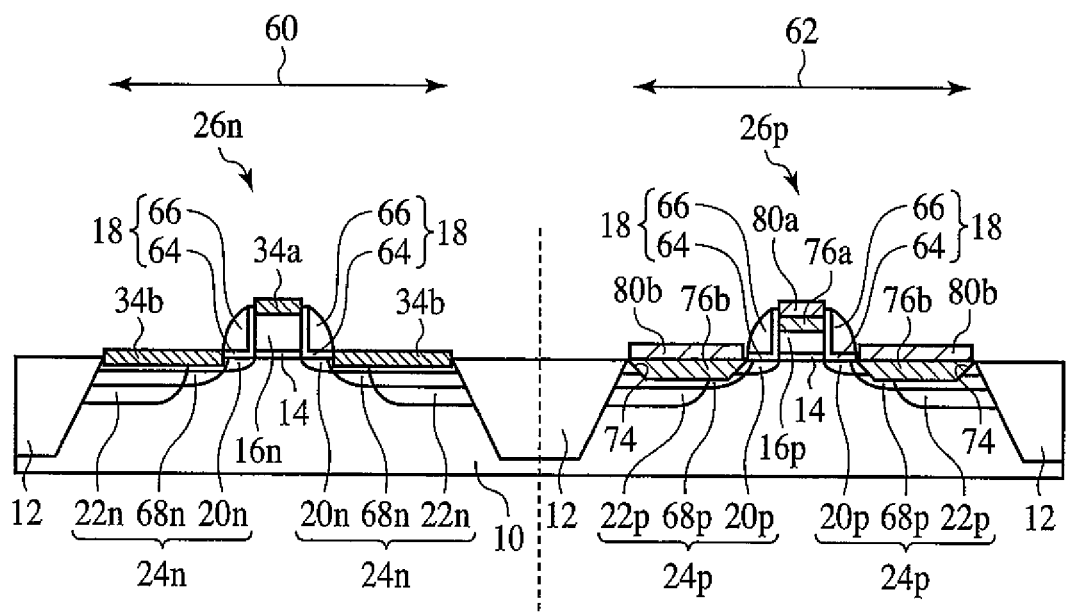

Next, in the same way as in the method of manufacturing the semiconductor device according to the fourth embodiment, the protective film 30 and the unreacted part of the NiPt film 28 with the Si or the $Si_{1-X}Ge_X$ are respectively selectively removed (see FIG. 36A).

Then, as the second thermal processing for the silicidation, flash lamp annealing is made. The conditions for the flash lamp annealing are, e.g., 24-28 J/cm² energy density of the flash lamp light, 0.5-1.5 msec application period of time of the flash lamp light, and 150-250° C. assist temperature, i.e., the substrate temperature. Specifically, for example, the energy density is 26 J/cm², the application period of time is 0.8 msec and the assist temperature is 200° C.

In place of the flash lamp annealing, laser annealing may be made. When the laser annealing is made, the conditions for the laser annealing are, e.g., 0.1-3.0 J/cm² energy density of the laser beam, 10-200 nsec application period of time of the laser beam and 150-250° C. assist temperature.

The flash lamp annealing or the laser annealing as the second thermal processing reacts, for the NMOS transistor 26n, the $Ni_2(Pt)Si$ of the $Ni_2(Pt)Si$ film 32a with the Si of the upper part of the gate electrode 16n and the $Ni_2(Pt)Si$ of the $Ni_2(Pt)Si$ films 32b with the Si of the upper parts of the source/drain diffused layers 24n. Thus, a Ni(Pt)Si film 34a is formed on the gate electrode 16n, and Ni(Pt)Si films 34b are formed on the source/drain diffused layers 24n (see FIG. 36B).

The flash lamp annealing or the laser annealing as the second thermal processing reacts, for the PMOS transistor 26p, the $Ni_2(Pt)Si_{1-X}Ge_X$ of the $Ni_2(Pt)Si_{1-X}Ge_X$ film 78a with the $Si_{1-X}Ge_X$ of the upper part of the $Si_{1-X}Ge_X$ film 76a and the $Ni_2(Pt)Si_{1-X}Ge_X$ of the $Ni_2(Pt)Si_{1-X}Ge_X$ films 78b with the $Si_{1-X}Ge_X$ of the upper parts of the $Si_{1-X}Ge_X$ films 76b. Thus, a $Ni(Pt)Si_{1-X}Ge_X$ film 80a is formed on the $Si_{1-X}Ge_X$ film 76a, and $Ni(Pt)Si_{1-X}Ge_X$ films 80b are formed on the $Si_{1-X}Ge_X$ films 76b (see FIG. 36B).

Figure 34:
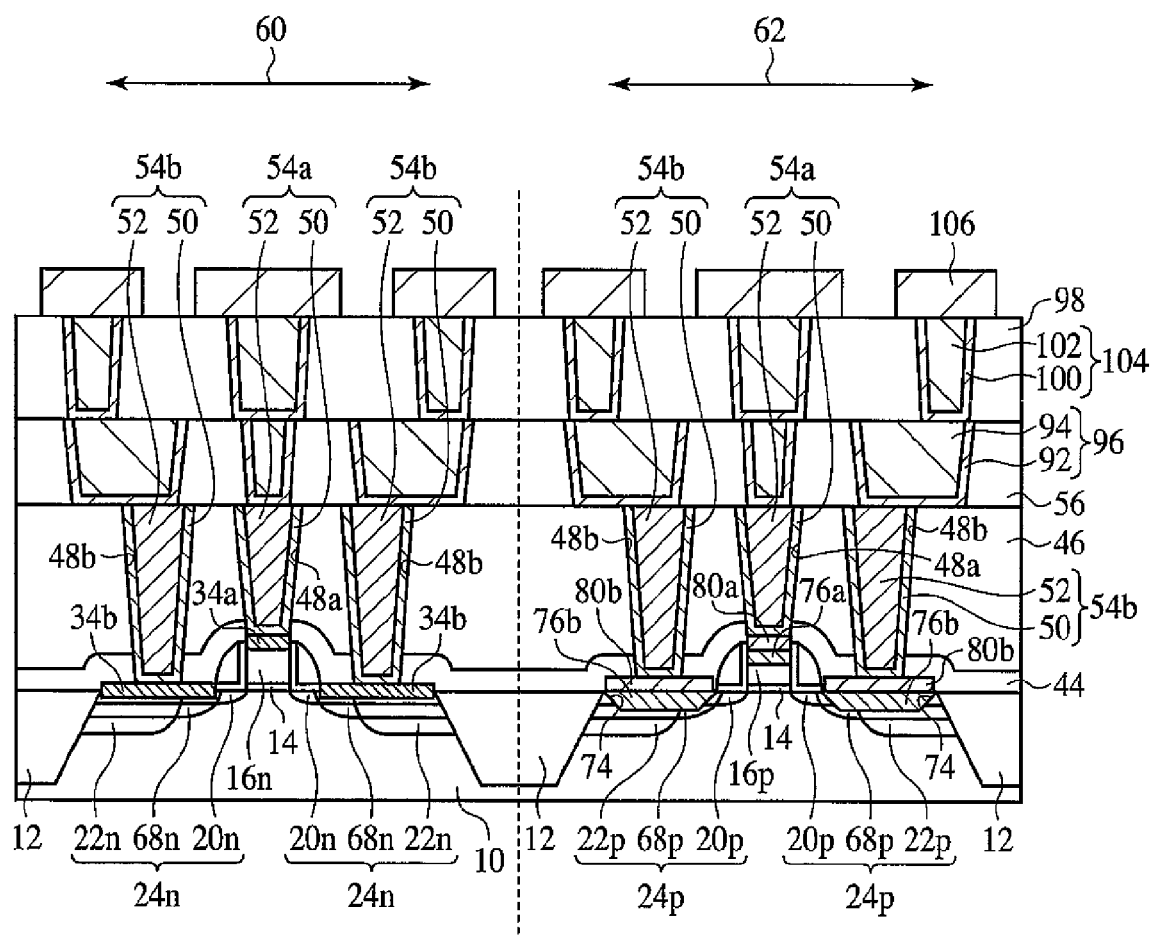

The following steps are the same as those of the method of manufacturing the semiconductor device according to the fourth embodiment shown in FIG. 34, and their explanation will not be repeated.

As described above, the method of manufacturing the semiconductor device according to the present embodiment is characterized mainly in that as the second thermal processing for the silicidation after the unreacted part of the NiPt film 28 with the Si or the $Si_{1-X}Ge_X$ has been removed by wet etching, flash lamp annealing or laser annealing, which thermally processes the extreme surface layer of a substrate-to-be-annealed in an extreme short period time, is made.

In the method of manufacturing the semiconductor device according to the present embodiment, by the flash lamp annealing or the laser annealing, only the $Ni_2(Pt)Si$ films 32a, 32b and the Si near the interfaces with the $Ni_2(Pt)Si$ films 32a, 32b are heated, and only the $Ni_2(Pt)Si_{1-X}Ge_X$ films 78a, 78b and the $Si_{1-X}Ge_X$ near the interfaces with the $Ni_2(Pt)Si_{1-X}Ge_X$ films 78a, 78b are heated.

That is, in the NMOS transistor 26n, by the flash lamp annealing or the laser annealing, only the $Ni_2(Pt)Si$ films 32a, 32b, the part of the gate electrode 16n which is near the interface with the $Ni_2(Pt)Si$ film 32a and the parts of the source/drain diffused layers 24n which are near the interfaces with the $Ni_2(Pt)Si$ films 32b are heated.

In the PMOS transistor 26p, by the flash lamp annealing or the laser annealing, only the $Ni_2(Pt)Si_{1-X}Ge_X$ films 78a, 78b, the part of the $Si_{1-X}Ge_X$ film 76a which is near the interface with the $Ni_2(Pt)Si_{1-X}Ge_X$ film 78a, and the parts of the $Si_{1-X}Ge_X$ films 76b which are near the interfaces with the $Ni_2(Pt)Si_{1-X}Ge_X$ films 78b are heated.

As described above, only the $Ni_2(Pt)Si$ films 32a, 32b and the Si near the interfaces with the $Ni_2(Pt)Si$ films 32a, 32b are heated to make the silicidation, and only the $Ni_2(Pt)Si_{1-X}Ge_X$ films 78a, 78b and the $Si_{1-X}Ge_X$ near the interfaces with the $Ni_2(Pt)Si_{1-X}Ge_X$ films 78a, 78b are heated to make the silicidation, whereby the abnormal diffusion of the Ni can be sufficiently suppressed. Accordingly, the sheet resistance and the sheet resistance scatter of the silicided gate electrodes 16n 16p and source/drain diffused layer 24n, 24p can be decreased, and the junction leak current can be also decreased.

In the present embodiment as well, in the flash lamp annealing, when the energy density of the flash lamp light is too low, or the application period of time is too short, the formed nickel silicide film cannot be made with sufficiently low resistivity. When the energy density of the flash lamp light is too high, or the application period of time is too long, the abnormal diffusion of the Ni takes place. In view of this, it is preferable that, in the flash lamp annealing, the energy density of the flash lamp light is set at 24-28 J/cm² and the application period of time of the flash lamp light is set at 0.5-1.5 msec.

When the laser annealing is made in place of the flash lamp annealing, in view of the above, it is preferable to set the energy density of the laser beam at 0.1-3.0 J/cm² and the application period of time of the laser beam at 10-200 nsec.

The flash lamp annealing or the laser annealing may be made only once or a plurality of times. When the flash lamp annealing or the laser annealing is made a plurality of times, the energy density of the flash lamp light or the laser beam for each application is set lower than that in the case where the annealing is made only once.

In the present embodiment, before the flash lamp annealing or the laser annealing is made, the protective film 30 and the unreacted part of the NiPt film 28 with the Si or the $Si_{1-X}Ge_X$ have been respectively removed. Accordingly, in the flash lamp annealing or the laser annealing, the flash lamp light or the laser beam is applied to the extension regions 20n, 20p of the source/drain diffused layers 24n, 24p via the sidewall insulating film 18, and the extension regions 20n 20p are heated. Thus, the dopant impurities implanted in the extension regions 20n, 20p are further activated, and the activation ratio can be further activated. Thus, according to the present embodiment, the drive current of the transistors 26n, 26p can be increased.

A Sixth Embodiment

The method of manufacturing the semiconductor device according to a sixth embodiment of the present invention will be explained with reference to FIGS. 37A to 38B. FIGS. 37A-37C and 38A-38B are sectional views showing the steps of the method of manufacturing the semiconductor device according to the present embodiment. The same members of the present embodiment as those of the method of manufacturing the semiconductor device according to the fourth embodiment are represented by the same reference numbers not to repeat or to simplify their explanation.

The method of manufacturing the semiconductor device according to the present embodiment is characterized mainly in that flash lamp annealing or laser annealing is made after Ni(Pt)Si films 34a, 34b and Ni(Pt)Si$_{1-x}$Ge$_x$ films 80a, 80b have been formed to thereby to improve the activation ratio of dopant impurities implanted in the extension regions 20n, 20p.

Figure 37A:
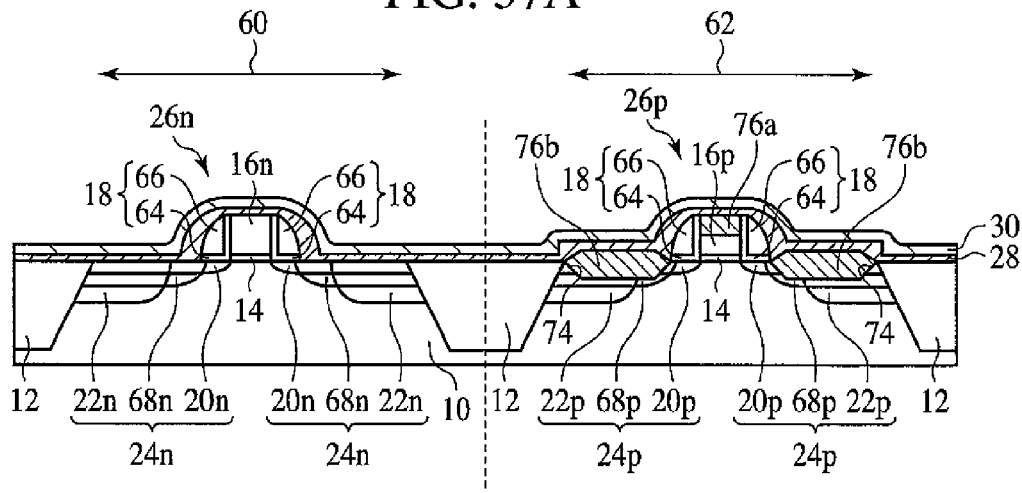
FIGS. 37A-37C and 38A-38B are sectional views showing the steps of the method of manufacturing the semiconductor device according to a sixth embodiment of the present invention.
Figure 37B:
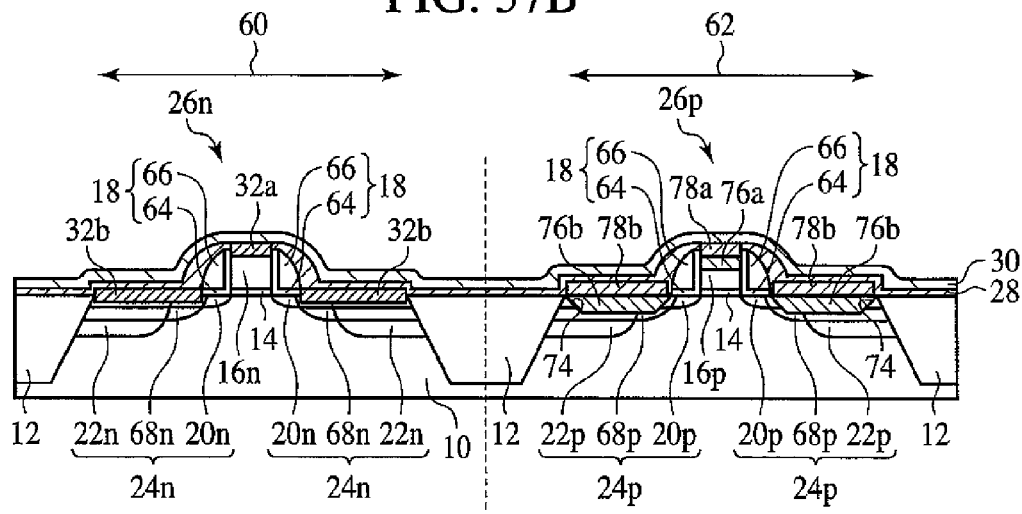

First, in the same as in the method of manufacturing the semiconductor device according to the fourth embodiment shown in FIGS. 25A to 32B, the members up to the protective film 30 are formed (see FIG. 37A). The film thickness of the NiPt film 28 is set at, e.g., 20 nm. The film thickness of the NiPt film 28 may be set at above 8 nm including 8 nm to make the silicidation sufficient but is preferably set at below 200 nm including 200 nm at maximum so as to ensure the removal of the unreacted part of the NiPt film 28 after the silicidation.

Next, as the first thermal processing for the silicidation, thermal processing of, e.g., 220-260° C. and 10-600 seconds is made by, e.g., RTA. Specifically, thermal processing of 260° C. and 30 seconds is made.

The first thermal processing reacts, for the NMOS transistor 26n, the NiPt of the NiPt film 28 with the Si of the upper part of the gate electrode 16n and the NiPt of the NiPt film 28 with the Si of the upper parts of the source/drain diffused layers 24n. Thus, a Ni$_2$(Pt)Si film 32a is formed on the gate electrode 16n, and Ni$_2$(Pt)Si films 32b are formed on the source/drain diffused layers 14n (see FIG. 37B).

The first thermal processing reacts, for the PMOS transistor 26p, the NiPt of the NiPt film 28 with the Si$_{1-x}$Ge$_x$ of the upper part of the Si$_{1-x}$Ge$_x$ film 76a of the gate electrode 16p and the NiPt of the NiPt film 28 with the Si$_{1-x}$Ge$_x$ of the upper parts of the Si$_{1-x}$Ge$_x$ films 76 buried in the recesses 74 of the source/drain diffused layers 24p. Thus, a Ni$_2$(Pt)Si$_{1-x}$Ge$_x$ film 78a is formed on the Si$_{1-x}$Ge$_x$ film 76a, and Ni$_2$(Pt)Si$_{1-x}$Ge$_x$ films 78b are formed on the Si$_{1-x}$Ge$_x$ films 76b (see FIG. 37B).

Figure 37C:
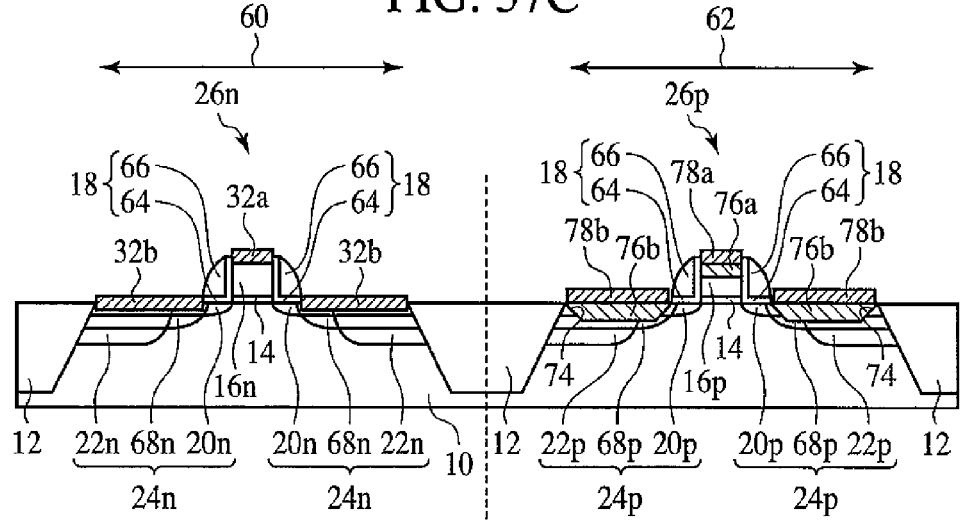

In the same way as in the method of manufacturing the semiconductor device according to the fourth embodiment, the protective film 30 and the unreacted part of the NiPt film 28 with the Si or the Si$_{1-x}$Ge$_x$ are respectively selectively removed (see FIG. 37C).

Then, as the second thermal processing for the silicidation, thermal processing of, e.g., 300-400° C. and 10-600 seconds is made by, e.g., RTA. Specifically, thermal processing of 400° C. and 30 seconds is made.

The second thermal processing reacts, for the NMOS transistor 26n, the Ni$_2$(Pt)Si of the Ni$_2$(Pt)Si film 32a with the Si of the upper part of the gate electrode 16n and the Ni$_2$(Pt)Si of the Ni$_2$(Pt) Si films 32b with the Si of the upper parts of the source/drain diffused layers 24n. Thus, a Ni(Pt)Si film 34a is formed on the gate electrode 16n, and Ni(Pt)Si films 34b are formed on the source/drain diffused layers 24n (see FIG. 38A)

The second thermal processing reacts, for the PMOS transistor 26p, the Ni$_2$(Pt)Si$_{1-x}$Ge$_x$ of the Ni$_2$(Pt)Si$_{1-x}$Ge$_x$ film 78a with the Si$_{1-x}$Ge$_x$ of the upper part of the Si$_{1-x}$Ge$_x$ film 76a and the Ni$_2$(Pt)Si$_{1-x}$Ge$_x$ of the Ni$_2$(Pt)Si$_{1-x}$Ge$_x$ films 78b with the Si$_{1-x}$Ge$_x$ of the upper parts of the Si$_{1-x}$Ge$_x$ films 76b. Thus, a Ni(Pt)Si$_{1-x}$Ge$_x$ film 80a is formed on the Si$_{1-x}$Ge$_x$ film 76a, and Ni(Pt)Si$_{1-x}$Ge$_x$ films 80b are formed on the Si$_{1-x}$Ge$_x$ films 76b (see FIG. 38A).

Figure 38A:
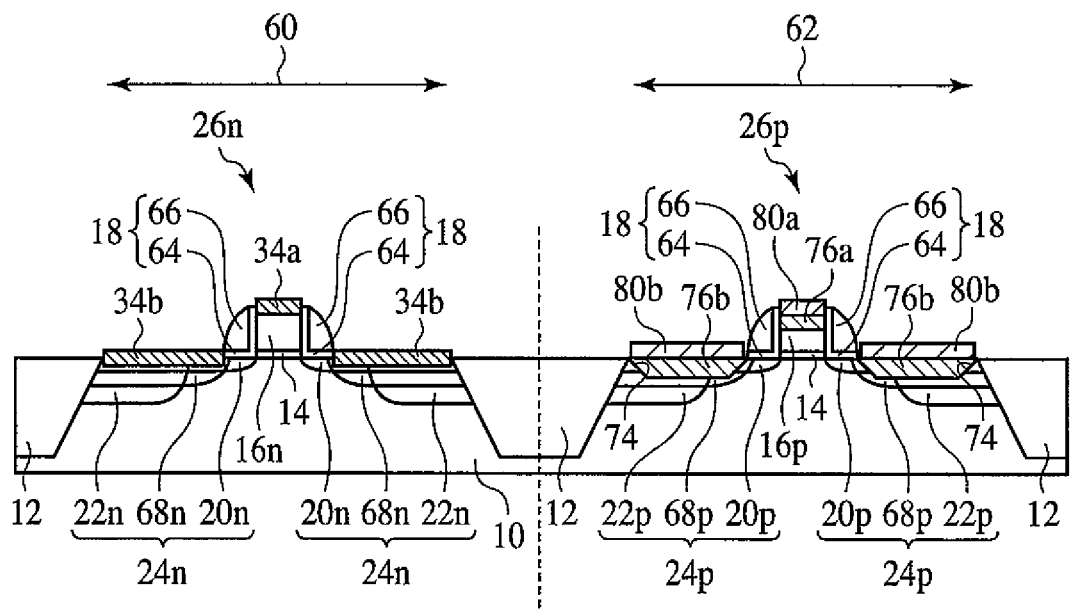
Figure 38B:
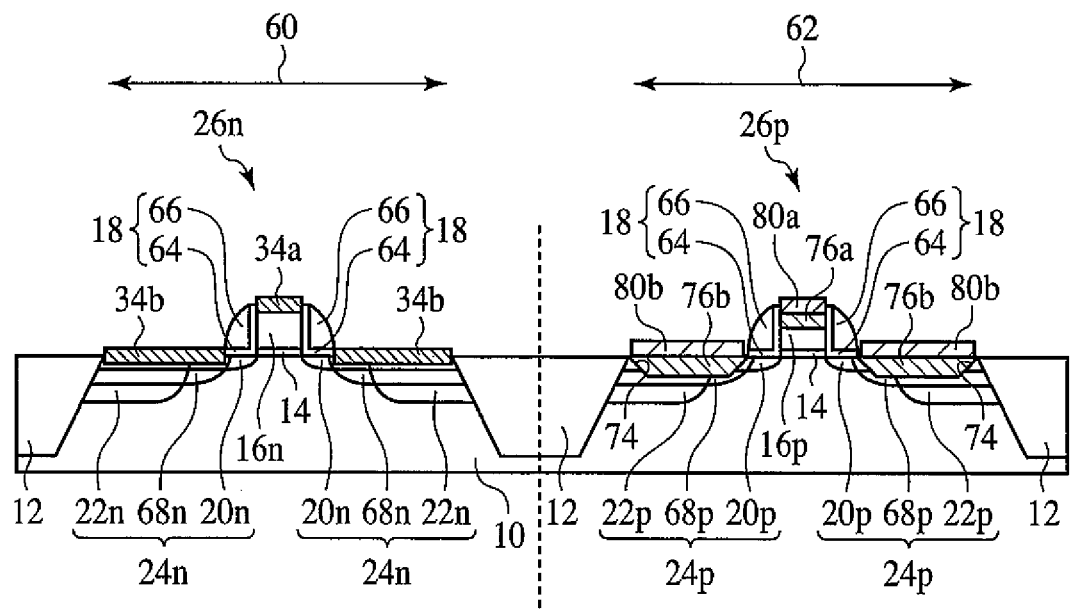

Then, flash lamp annealing is made to thereby increase the activation ratio of the dopant impurities implanted in the extension regions 20n, 20p of the source/drain diffused layers 24n, 24p (see FIG. 38B). The conditions for the flash lamp annealing are, e.g., 24-28 J/cm$^2$ energy density of the flash lamp light, 0.5-1.5 msec application period of time of the flash lamp light and 400-450° C. assist temperature, i.e., the substrate temperature. Specifically, for example, the energy density is 26 J/cm$^2$, the application period of time is 0.8 msec, and the assist temperature is 450° C.

In place of the flash lamp annealing, laser annealing may be made. When the laser annealing is made, the conditions for the laser annealing are, e.g., 0.1-3.0 J/cm$^2$ energy density of the laser beam, 10-200 nsec application period of time of the laser beam and 400-450° C. assist temperature.

In the flash lamp annealing or the laser annealing, the flash lamp light or the laser beam is applied to the extension regions 20n, 20p of the source/drain diffused layers 24n, 24p via the sidewall insulating film 18, and the extension regions 20n, 20p are heated. Thus, the dopant impurities implanted in the extension regions 20n, 20p are further activated, and the activation ratio is improved.

The following steps are the same as those of the method of manufacturing the semiconductor device according to the fourth embodiment shown in FIG. 34, and their explanation will not be repeated.

As described above, the method of manufacturing the semiconductor device according to the present embodiment is characterized mainly in that the flash lamp annealing or the laser annealing is made after the Ni(Pt)Si films 34a, 34b and the Ni(Pt)Si$_{1-x}$Ge$_x$ films 80a, 80b have been formed to thereby further activate the dopant impurities implanted in the extension regions 20n, 20p to improve the activation ratio.

In the ends of the source/drain diffused layers 24n, 24p on the side of the gate electrodes 16n, 16p, i.e., the extension regions 20n, 20p of the source/drain diffused layers 24n, 24p, a dopant impurity, such as arsenic or others, for the NMOS transistor 26n and a dopant impurity, such as boron or others, for the PMOS transistor 26p are implanted heavily and as shallow as below 10 nm including 10 nm. These dopant impurities are activated by annealing. However, when the usual lamp annealing is made, the activation ratio of the dopant impurities and the junction depth have the trade-off relationship. That is, to make the activation ratio of the dopant impurities higher, the junction depth is increased. Accordingly, it is very difficult to improve the activation ratio of the dopant impurities implanted very shallow in the extensions 20n, 20p by the usual lamp annealing.

In contrast to this, in the present embodiment, the flash lamp annealing or the laser annealing is made as the annealing for improving the activation ratio of the dopant impurities implanted in the extension regions 20n, 20p. The flash lamp annealing or the laser annealing thermally processes the extreme surface layer of the silicon substrate 10 in an extreme short period of time, which can prevent the deepening of the junction depth and improve the activation ratio of the dopant impurities implanted in the extension regions 20n, 20p. Thus, according to the present embodiment, the dive current of the transistors 26n, 26p can be increased.

The reflectance of metal silicide is higher in comparison with that of silicon. That is, the reflectance of silicon is about 0.3, while the reflectance of metal silicide is about 0.5. Accordingly, the flash lamp annealing is made after the Ni(Pt) Si film 34a, 34b and the Ni(Pt) Si$_{1-x}$Ge$_x$ film 80a, 80b have been formed, whereby the absorptance of the silicon substrate 10 for the flash lamp light can be decreased. Thus, in the flash lamp annealing, the warp of the silicon substrate 10 due to the flash lamp annealing can be suppressed while improving the activation ratio of the dopant impurities implanted in the extension regions 20n, 20p.

In the flash lamp annealing, when the energy density of the flash lamp light is too low, or the application period of time of the flash lamp light is too short, the activation ratio of the dopant impurities cannot be increased. When the energy density of the flash lamp light is too high, or the application period of time is too long, the junction depth becomes large. In view of this, it is preferable that, in the flash lamp annealing, the energy density of the flash lamp light is set at 24-28 J/cm$^2$ and the application period of time of the flash lamp light at 0.5-1.5 msec.

When the laser annealing is made in place of the flash lamp annealing, in view of the above, it is preferable to set the energy density of the laser beam at 0.1-3.0 J/cm$^2$ and the application period of time of the laser beam at 10-200 nsec.

The flash lamp annealing or the laser annealing may be made only once or a plurality of times. When the flash lamp annealing or the laser annealing is made a plurality of times, the energy density of the flash lamp light or the laser beam for each application is set lower than that in the case where the annealing is made only once.

A Seventh Embodiment

The method of manufacturing the semiconductor device according to a seventh embodiment of the present invention will be explained with reference to FIGS. 39A to 40C. FIGS. 39A-39C and 40A-40C are sectional views showing the steps of the method of manufacturing the semiconductor device according to the present embodiment. The same members of the present embodiment as those of the method of manufacturing the semiconductor device according to the fourth embodiment are represented by the same reference numbers not to repeat or to simplify their explanation.

The method of manufacturing the semiconductor device according to the present embodiment is characterized mainly in that flash lamp annealing or laser annealing is made to thereby alloy a metal layer film 112 to form a NiPt film 114.

First, in the same way as in the method of manufacturing the semiconductor device according to the first embodiment shown in FIGS. 24A to 32A, the members up to the SiGe films 76a, 76b are formed.

Next, the silicon oxide film 72 formed on the NMOS transistor-to-be-formed region 60 is etched off.

Next, the natural oxide film form on the surface of the gate electrode 16n, the surfaces of the source/drain diffused layers 24n, the surface of the Si$_{1-x}$Ge$_x$ film 76a of the gate electrode 16p and the surfaces of the Si$_{1-x}$Ge$_x$ films 76b buried in the recesses 74 of the source/drain diffused layers 24p is removed by, e.g., hydrofluoric acid processing.

Figure 39A:
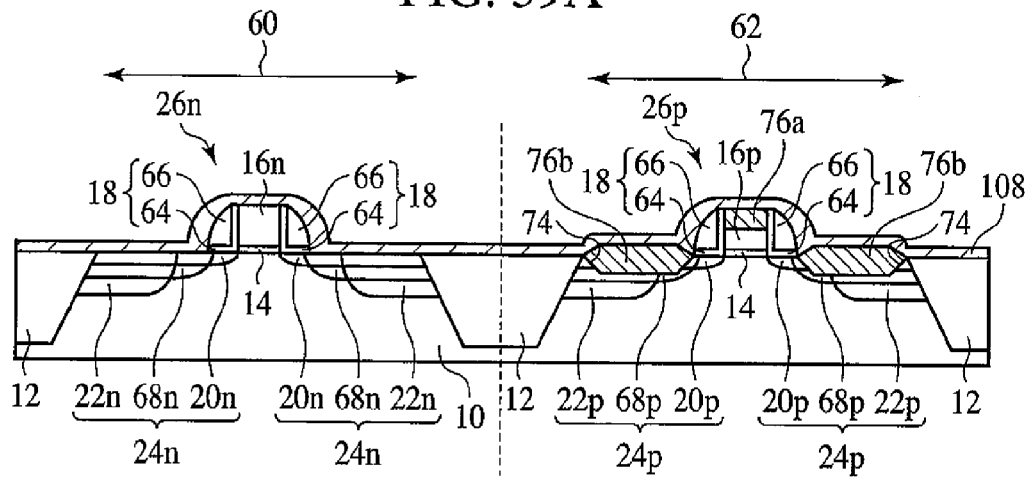
FIGS. 39A-39C and 40A-40C are sectional views showing the steps of the method of manufacturing the semiconductor device according to a seventh embodiment of the present invention.

Next, a Ni film 108 of, e.g., a 10 nm-thickness is formed on the entire surface by, e.g., sputtering (see FIG. 39A).

Next, a Pt film 110 of, e.g., a 1 nm-thickness is formed on the Ni film 108 by, e.g., sputtering.

Figure 39B:
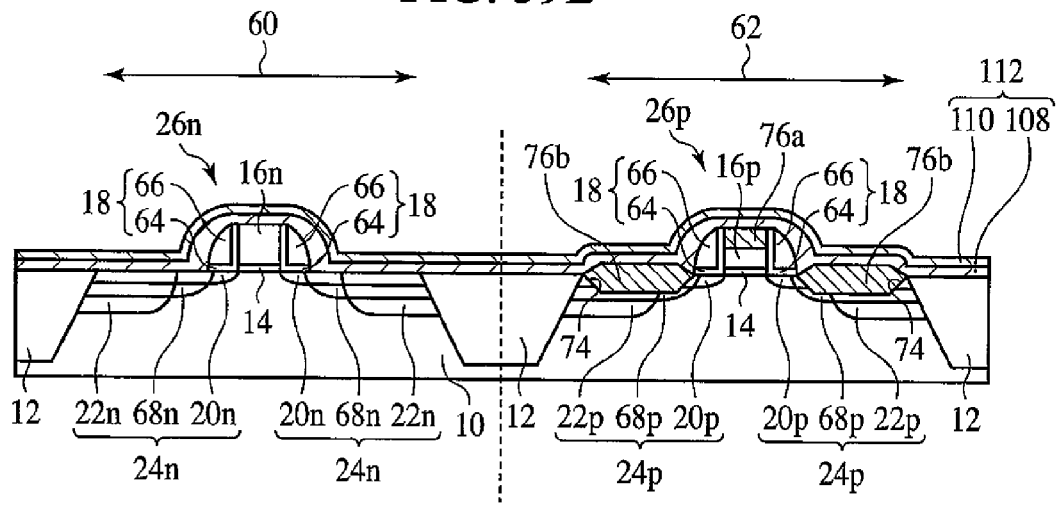

Thus, the metal layer film 112 of the Ni film 108 and the Pt film 110 is formed (see FIG. 39B). The Pt film 110 is for improving the thermal stability of a silicide film to be formed in a later step. In place of the Pt film 110, tantalum (Ta) film, tungsten (W) film or rhenium (Re) film may be formed. An alloy film of at least two metals of Pt, Ta, W and Re may be formed. A metal film containing at least one of Pt, Ta, W and Re can improve the thermal stability of the silicide film to be formed in a later step. The sequence of forming the Ni film 108 and the Pt film 110 is reversed to form a metal layer film of the Pt film 110 and the Ni film 108 sequentially laid the latter on the former.

The total film thickness of the Ni film 108 and the Pt film 110, i.e., the film thickness of the metal layer film 112 may be set at above 8 nm including 8 nm so as to make sufficient the silicidation with a NiPt film 144 to be formed by alloying the metal layer film 112, which will be described later. It is preferable to set the film thickness of the metal layer film 112 at below 20 nm including 20 nm at maximum so as to be alloyed by flash lamp annealing which will be described later.

Then, a protective film of TiN film or Ti film may be formed on the metal layer film 112.

Figure 39C:
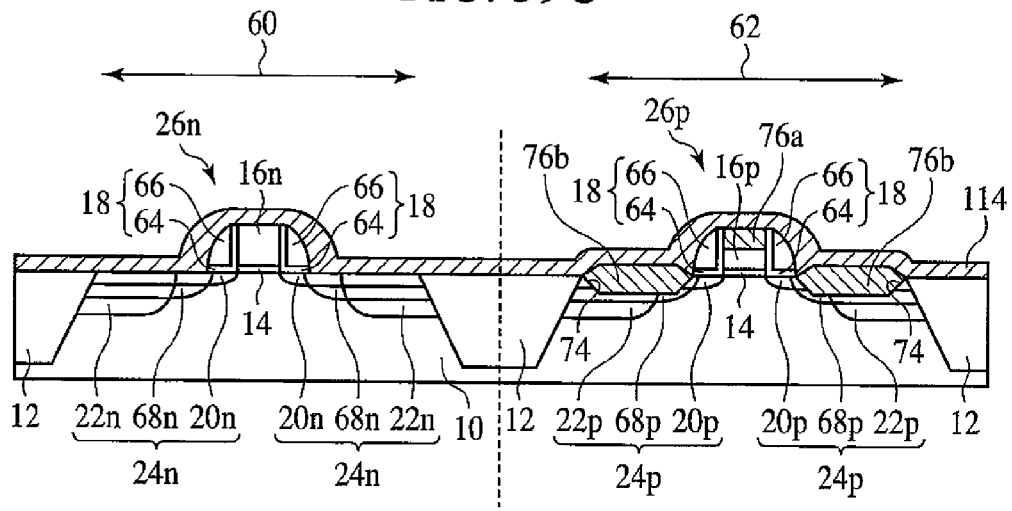

Next, the metal layer film 112 is alloyed by flash lamp annealing to form the NiPt film 114 (see FIG. 39C). The composition ratio of the Pt of the thus alloyed NiPt film 114 is, e.g., about 1-10 atom %. The conditions for the flash lamp annealing are, e.g., 26-30 J/cm$^2$ energy density of the flash lamp light, 0.5-1.5 msec application period of time of the flash lamp light, and 150-250° C. assist temperature, i.e., the substrate temperature. Specifically, for example, the energy density is 26 J/cm$^2$, the application period of time is 0.8 msec, and the assist temperature is 200° C.

In place of the flash lamp annealing, laser annealing may be made. When laser annealing is made, the conditions for the laser annealing are, e.g., 0.3-3.0 J/cm$^2$ energy density of the laser beam, 30-200 nsec application period of time of the laser beam, and 150-250° C. assist temperature.

Then, as the first thermal processing for the silicidation, thermal processing of, e.g., 220-350° C. and 10-600 seconds is made by, e.g., RTA. Specifically, for example, thermal processing of 300° C. and 30 seconds is made.

The first thermal processing reacts, for the NMOS transistor 26n, the NiPt of the NiPt film 114 with the Si of the upper part of the gate electrode 16n and the NiPt of the NiPt film 114 with the Si of the upper parts of the source/drain diffused layers 24n. Thus, a Ni$_2$(Pt)Si film 32a is formed on the gate electrode 16n, and the Ni$_2$(Pt)Si films 32b are formed on the source/drain diffused layers 24n (see FIG. 40A).

The first thermal processing reacts, for the PMOS transistor 26p, the NiPt of the NiPt film 114 with the Si$_{1-x}$Ge$_x$ of the upper part of the Si$_{1-x}$Ge$_x$ film 76a of the gate electrode 16p and the NiPt of the NiPt film 114 with the Si$_{1-x}$Ge$_x$ of the upper parts of the Si$_{1-x}$Ge$_x$ films 76b buried in the recesses 74 of the source/drain diffused layers 24p. Thus, a Ni$_2$(Pt)Si$_{1-x}$Ge$_x$ film 78a is formed on the Si$_{1-x}$Ge$_x$ film 76a and Ni$_2$(Pt)Si$_{1-x}$Ge$_x$ films 78b are formed on the Si$_{1-x}$Ge$_x$ films 76b (see FIG. 40A).

Figure 40A:
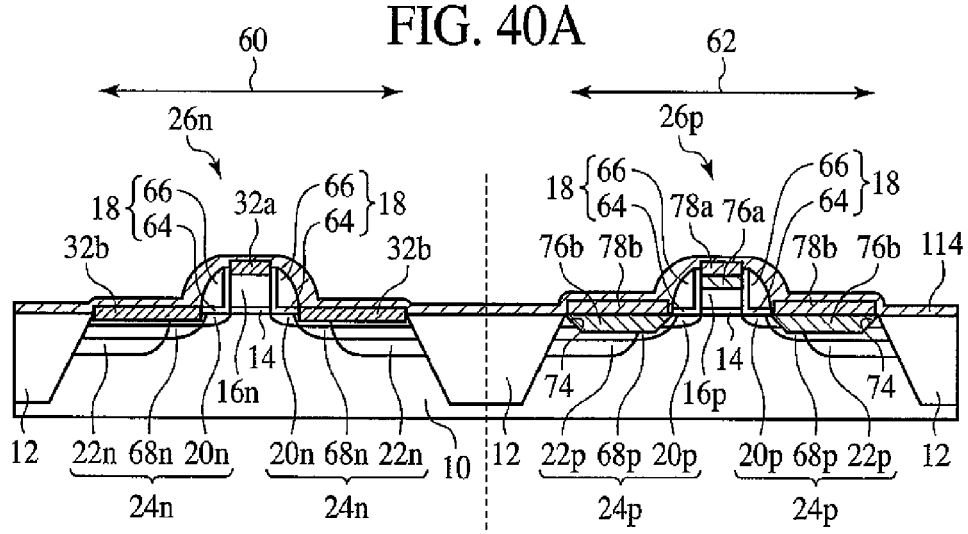
Figure 40B:
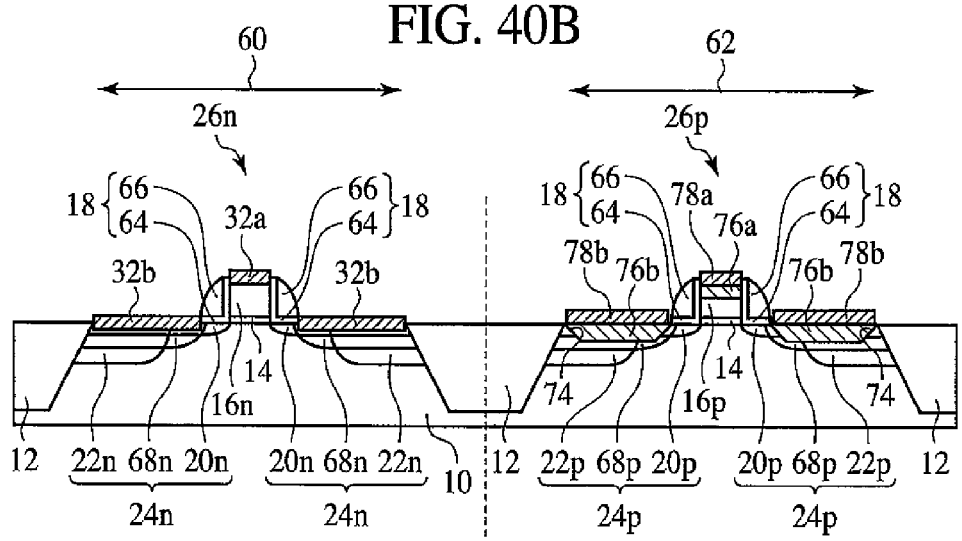
Figure 40C:
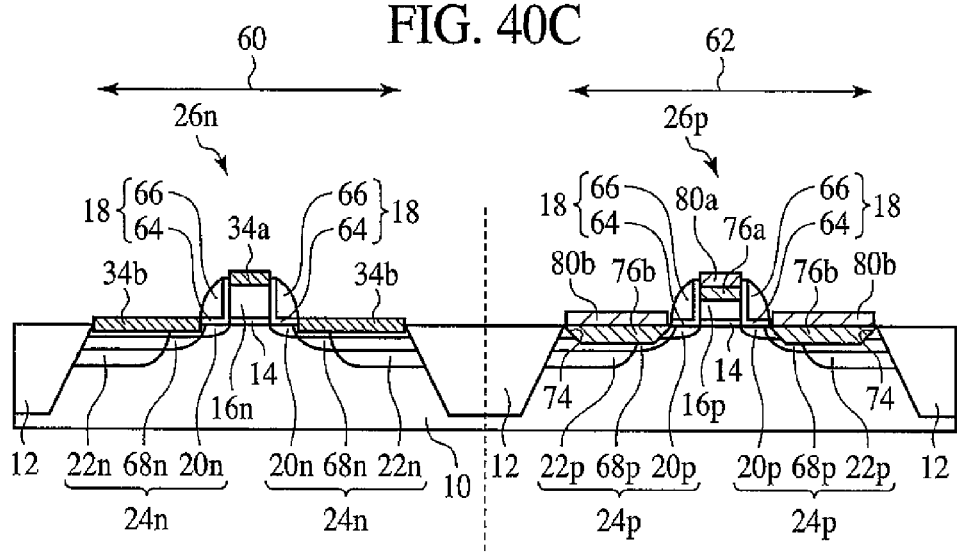

Then, in the same way as in the method of manufacturing the semiconductor device according to the fourth embodiment, the unreacted part of the NiPt film 114 with the Si or the Si$_{1-x}$Ge$_x$ is selectively removed (see FIG. 40B).

Then, as the second thermal processing for the silicidation, thermal processing of, e.g., 300-400° C. and 10-600 seconds is made by, e.g., RTA. Specifically, for example, thermal processing of 400° C. and 30 seconds is made.

The second thermal processing reacts, for the NMOS transistor 26n, the Ni$_2$(Pt)Si of the Ni$_2$(Pt)Si film 32a with the Si of the upper part of the gate electrode 16n and the Ni$_2$(Pt)Si of the Ni$_2$(Pt)Si films 32b with the Si of the upper parts of the source/drain diffused layers 24n. Thus, a Ni(Pt)Si film 34a is formed on the gate electrode 16n and Ni(Pt)Si films 34b are formed on the source/drain diffused layers 24n (see FIG. 40C).

The second thermal processing reacts, for the PMOS transistor 26p, the Ni$_2$(Pt)Si$_{1-x}$Ge$_x$ of the Ni$_2$(Pt)Si$_{1-x}$Ge$_x$ film 78a with the Si$_{1-x}$Ge$_x$ of the upper part of the Si$_{1-x}$Ge$_x$ film 76a and the Ni$_2$(Pt)Si$_{1-x}$Ge$_x$ of the Ni$_2$(Pt)Si$_{1-x}$Ge$_x$ films 78b with the Si$_{1-x}$Ge$_x$ of the upper parts of the Si$_{1-x}$Ge$_x$ films 76b. Thus, an Ni(Pt)Si$_{1-x}$Ge$_x$ film 80a is formed on the Si$_{1-x}$Ge$_x$ film 76a and Ni(Pt)Si$_{1-x}$Ge$_x$ films 80b are formed on the Si$_{1-x}$Ge$_x$ films 76b (see FIG. 40C).

The following steps are the same as those of the method of manufacturing the semiconductor device shown in FIG. 34, and their explanation will not be repeated.

As described above, the method of manufacturing the semiconductor device according to the present embodiment is characterized mainly in that the metal layer film 112 is alloyed by the flash lamp annealing or the laser annealing to thereby form the NiPt film 114.

The formation of a Ni alloy film by sputtering has disadvantages that the sputter target of Ni alloy is expensive, and it is difficult to manufacture the target.

On the other hand, in the present embodiment, the metal layer film 112 is alloyed by the flash lamp annealing or the laser annealing to thereby form the NiPt film 114. The flash lamp annealing or the laser annealing can heat the metal layer film 112 alone, whereby the metal layer film 112 is alloyed to form the NiPt film 114 while the reaction of the metal layer film 112 with the base layers containing Si and $Si_{1-X}Ge_X$ being suppressed.

Furthermore, according to the present embodiment, the sputter target of Ni alloy, which is expensive and difficult to be manufactured, is not necessary. Accordingly, the NiPt film 114 can be formed inexpensively.

In the flash lamp annealing, when the energy density of the flash lamp light is too low, or the application period of time is too short, it is impossible to alloy the metal layer film 112 to thereby form the NiPt film 114. When the energy density of the flash lamp light is too high, or the application period of time is too long, the reaction of the metal layer film 112 with the Si and the $Si_{1-X}Ge_X$ takes place. In view of this, it is preferable to set the energy density of the flash lamp light at 26-30 $J/cm^2$ and the application period of time of the flash lamp light at 0.5-1.5 msec.

When laser annealing is made in place of the flash lamp annealing, in view of the above, it is preferable to set the energy density of the laser beam at 0.3-3.0 $J/cm^2$ and the application period of time at 30-200 nsec.

The flash lamp annealing or the laser annealing may be made only once or a plurality of times. When the flash lamp annealing or the laser annealing is made a plurality of times, the energy density of the flash lamp light or the laser beam for each application is set lower than that in the case where the annealing is made only once.

An Eighth Embodiment

Barrier metals forming contact plugs connected to metal silicide films formed on a gate electrode and source/drain diffused layers by salicide process are formed by various film forming processes, such as PVD (Physical Vapor Deposition), CVD or others.

When the metal silicide film is formed of a nickel silicide film, to suppress the agglomeration of the nickel silicide film, the process after the nickel silicide film has been formed must be low-temperature process. To this end, when the metal silicide film is formed of the nickel silicide film, PVD or MOCVD (Metal Organic Chemical Vapor Deposition), whose film forming temperature is relatively low, are used as the film forming process for the barrier metal.

The process for forming contact plugs when the metal silicide film is formed of a nickel silicide film will be explained with reference to FIGS. 53A to 56B. FIGS. 53A-53C, 54A-54C, 55A-55C and 56A-56B are sectional views showing the steps of the method for forming the contact plugs with the metal silicide films being nickel silicide films.

Figure 53A:
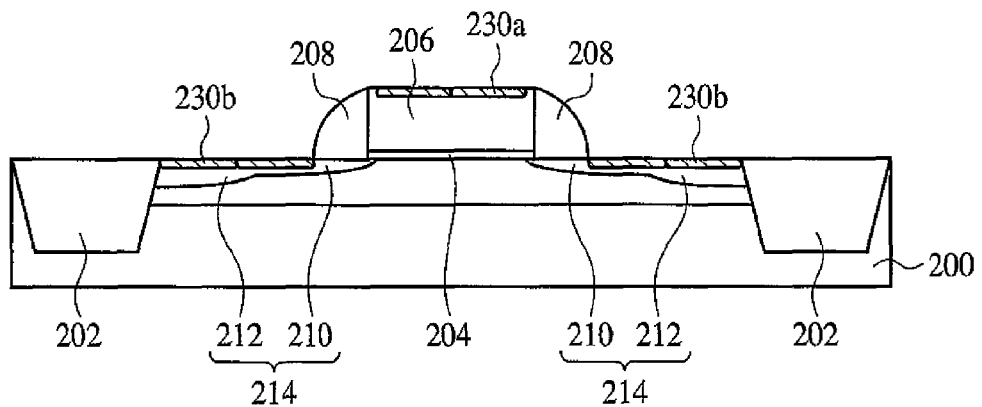
FIGS. 53A-53C, 54A-54C, 55A-55C and 56A-56B are sectional views showing the steps of the method for forming the contact plugs with the metal silicide films being nickel silicide films.

FIG. 53A illustrates a MOS transistor 216 including metal silicide films 230a, 230b of a nickel silicide film formed on a gate electrode 206 and source/drain diffused layers 214 by salicide process. As illustrated, a device region is defined by a device isolation region 202 on a silicon substrate 200. On the silicon substrate 200, the gate electrode 206 of a polysilicon film or an amorphous silicon film is formed with a gate insulating film 204 formed therebetween. A sidewall insulating film 208 is formed on the side walls of the gate electrode 206. In the silicon substrate 200 on both sides of the gate electrode 206, the source/drain diffused layers 214 each formed of a shallow impurity diffused region 210 forming the extension region of the extension source/drain structure, and a deep impurity diffused region 212 are formed. On the gate electrode 206, the metal silicide film 230a of a nickel silicide film is formed. The nickel silicide films 230b of a nickel silicide film is formed on the source/drain diffused layer 214. Thus, on the silicon substrate 200, the MOS transistor 216 including the gate electrode 206 and the source/drain diffused layers 214 is formed.

Figure 53B:
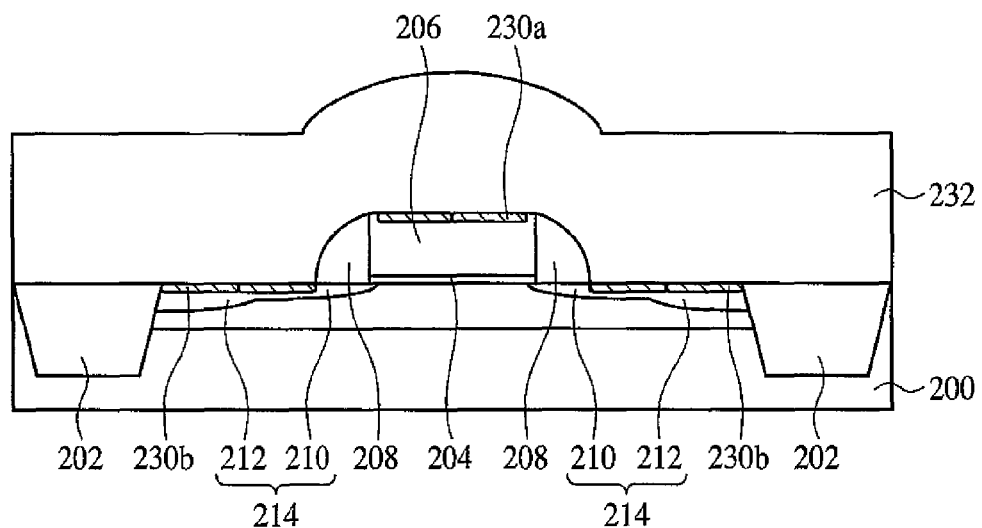

Next, an inter-layer insulating film 232 is formed on the entire surface by, e.g., CVD (see FIG. 53B).

Figure 53C:
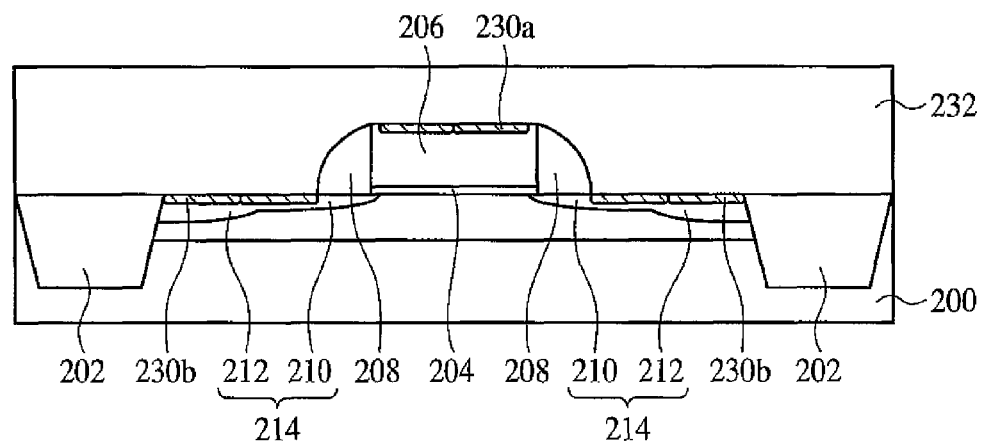

Next, the inter-layer insulating film 232 is planarized by, e.g., CMP (see FIG. 53C).

Next, a photoresist film 234 is formed on the inter-layer insulating film 232. Then, by photolithography, the photoresist film 234 is patterned. Thus, a photoresist mask 234 for forming contact holes is formed (see FIG. 54A).

Figure 54A:
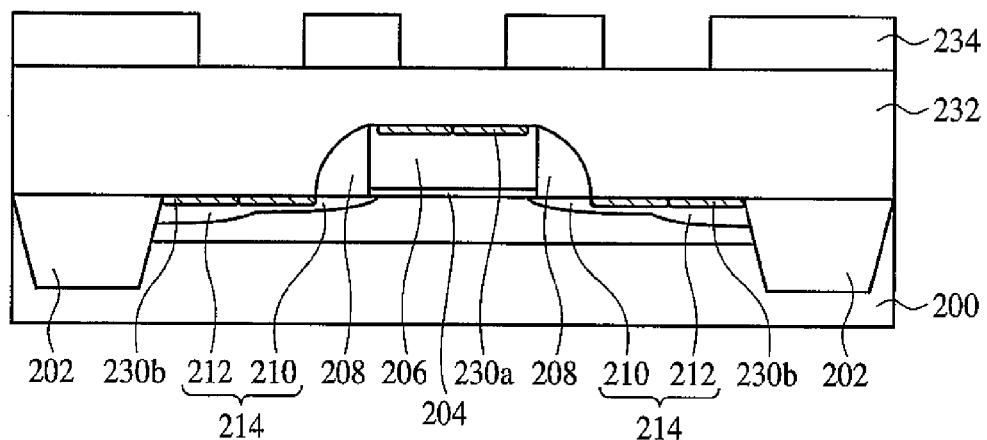
Figure 54B:
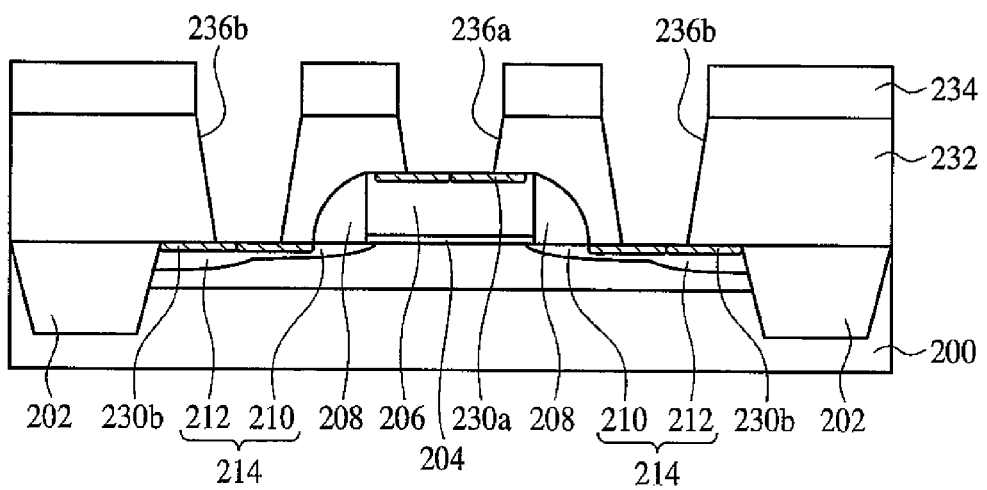

Next, with the photoresist film 234 as the mask, the inter-layer insulating film 232 is dry etched to thereby form in the inter-layer insulating film 232 a contact hole 236a down to the metal silicide film 230a and contact holes 236b down to the metal silicide films 230b (see FIG. 54B).

Figure 54C:
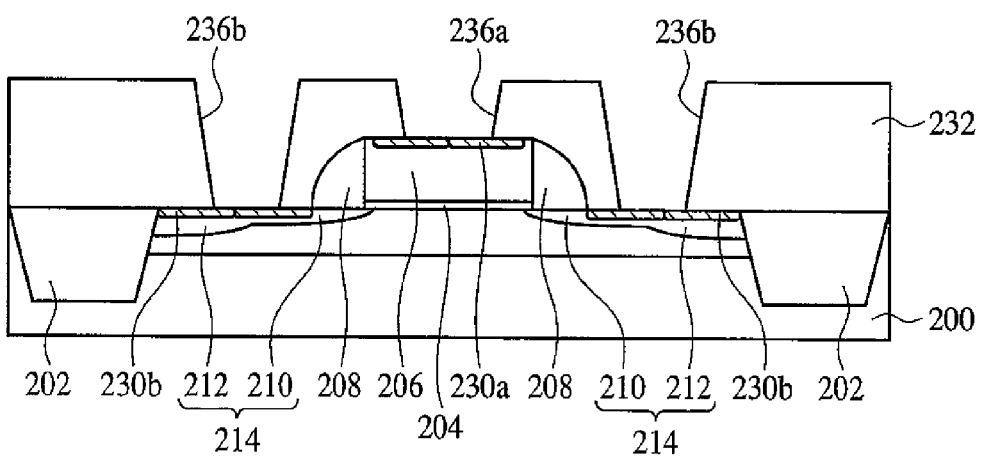

After the contact holes 236a, 236b have been formed, the photoresist film 234 used as the mask is removed (see FIG. 54C).

Figure 55A:
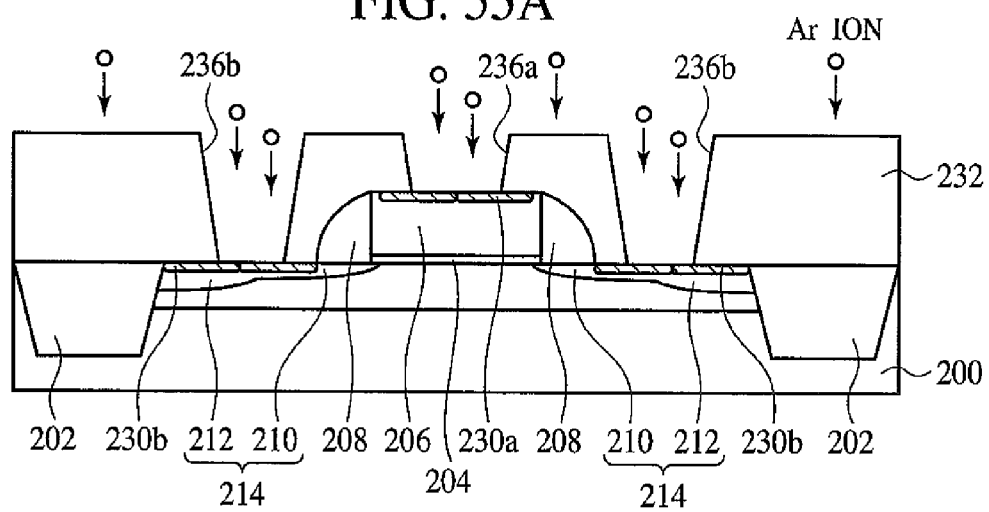

Next, by sputtering using argon (Ar) gas plasma, the natural oxide film formed on the surface of the metal silicide film is removed (see FIG. 55A).

Figure 55B:
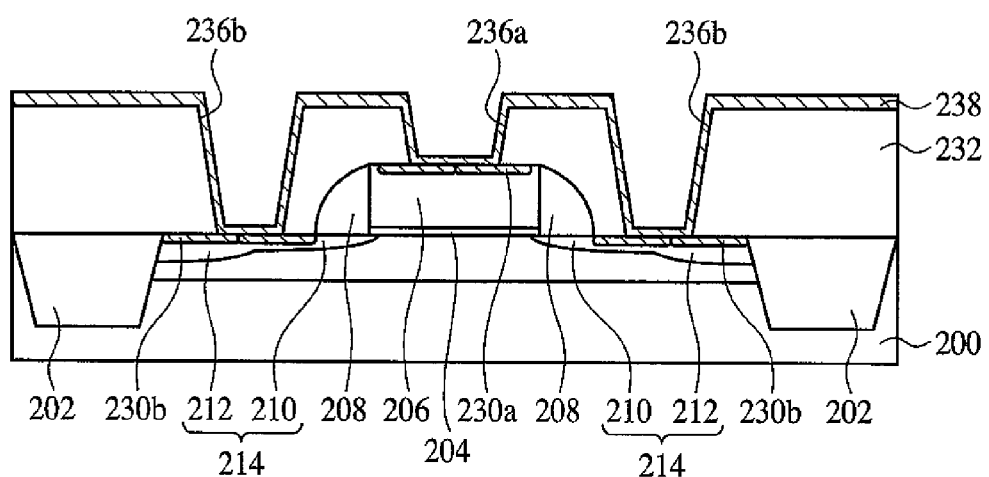

Then, on the inter-layer insulating film 232 and on the inside walls and the bottom surfaces of the contact holes 236a, 236b, a titanium (Ti) film 238 is deposited by PVD (see FIG. 55B). The PVD used in forming the Ti film 238 is specifically sputtering.

Next, on the Ti film 238, a titanium nitride (TiN) film 240 is deposited by MOCVD.

Figure 55C:
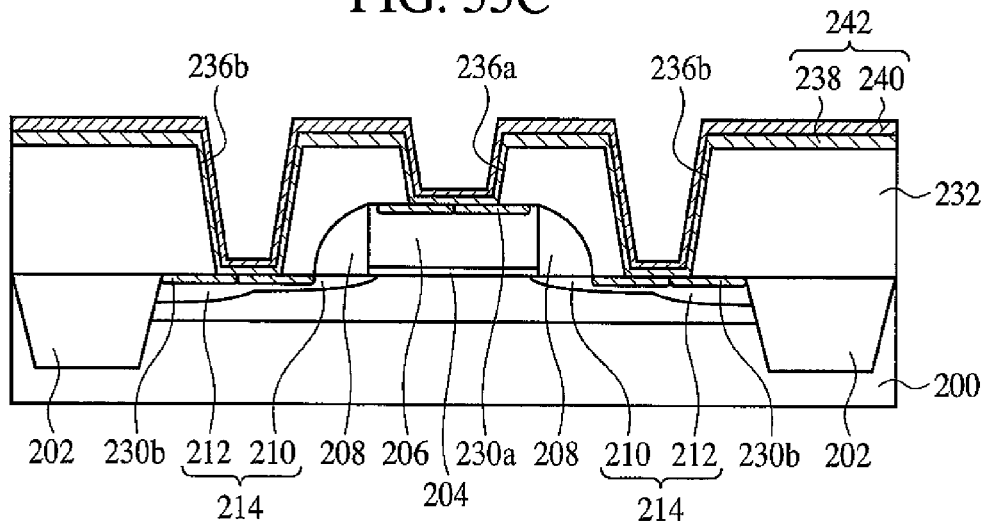

Thus, a barrier metal 242 of the Ti film 238 and the TiN film 240 sequentially laid the latter on the former is formed (see FIG. 55C).

Figure 56A:
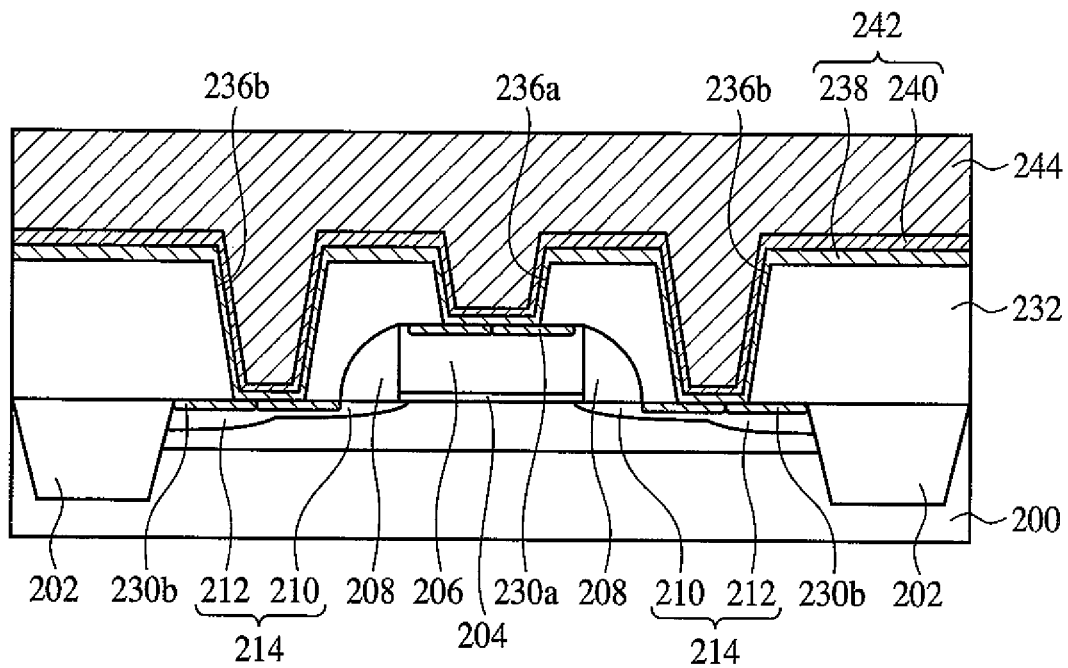

Next, on the barrier metal 242, a tungsten (W) film 244 is deposited by thermal CVD (see FIG. 56A).

Next, the W film 244 and the barrier metal 242 are polished by, e.g., CMP until the surface of the inter-layer insulating film 232 is exposed. Thus, contact plugs 246a, 246b of the barrier metal 242 and the W film 244 are buried respectively in the contact holes 236a, 236b (see FIG. 56B).

Thus, when the metal silicide film 230a, 230b is formed of the nickel silicide film, PVD and MOCVD, which are low-temperature processes, are used as the process for forming the barrier metal 242.

In contrast to this, when the metal silicide film is formed of a cobalt silicide film, as the process after the cobalt silicide film has been formed, higher-temperature processes than the processes for the nickel silicide film can be used. Specifically, high-temperature processes of above 680° C. including 680° C. can be used. Thus, when the metal silicide film is formed of the cobalt silicide film, the film forming process for the barrier metal can be plasma CVD and thermal CVD.

Figure 57A:
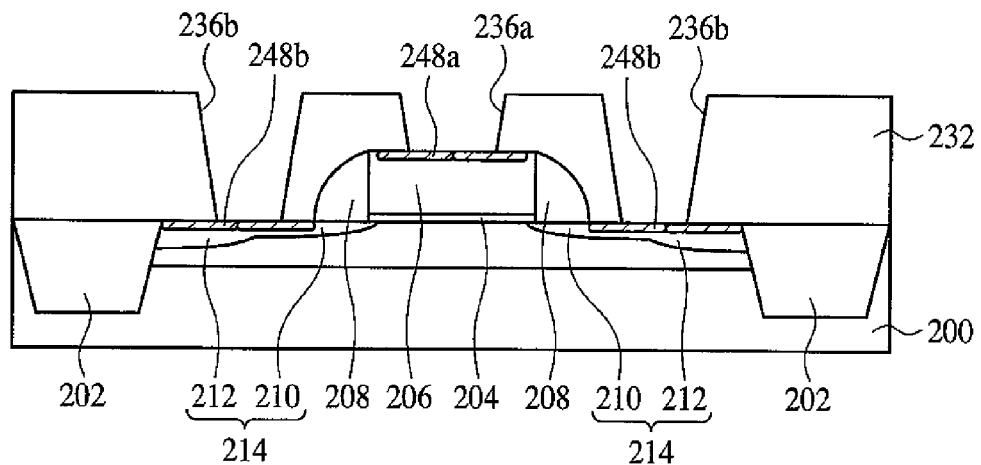
FIGS. 57A-57C are sectional views showing the steps of the method for forming the contact plugs with the metal silicide films being cobalt silicide films.

The process for forming the contact plugs when the metal silicide film is formed of a cobalt silicide film will be explained with reference to FIGS. 57A to 57C. FIGS. 57A-

57C are sectional views showing the steps of the method for forming the contact plugs with the metal silicide films being cobalt silicide films.

First, in the same way as shown in FIGS. 54A to 54C, the members up to contact holes 236a, 236b are formed (FIG. 57A). On the gate electrode 206, a metal silicide film 248a of cobalt silicide film is formed. On the source/drain diffused layers 214, metal silicide films 248b of cobalt silicide film are formed.

Figure 57B:
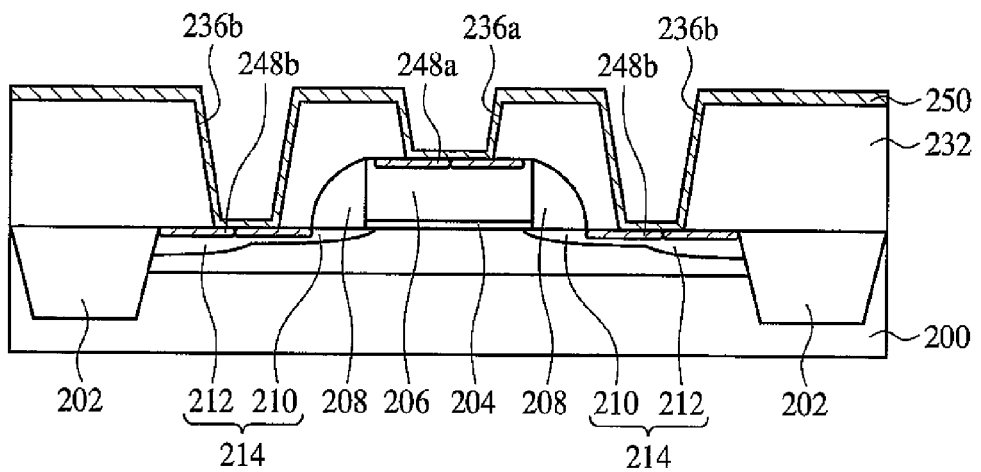

Then, a Ti film 250 is deposited on the inter-layer insulating film 232 and on the inside walls and the bottom surfaces of the contact holes 236a, 236b by plasma CVD using titanium tetrachloride ($TiCl_4$) as the raw material gas (see FIG. 57B).

Next, a TiN film 252 is deposited on the Ti film 250 by thermal CVD using $TiCl_4$ gas as the raw material gas.

Figure 57C:
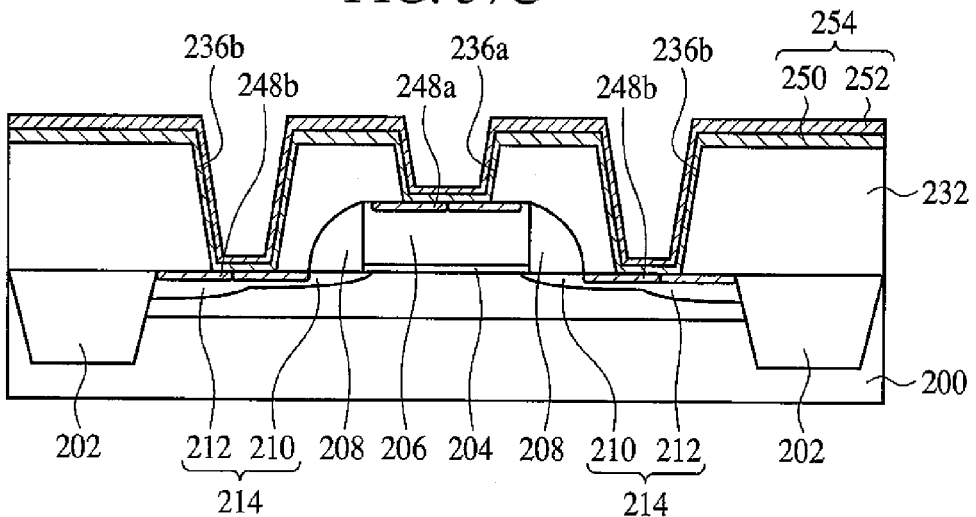

Thus, a barrier metal 254 of the Ti film 250 and the TiN film 252 sequentially laid the latter on the former is formed (see FIG. 57C).

Figure 56B:
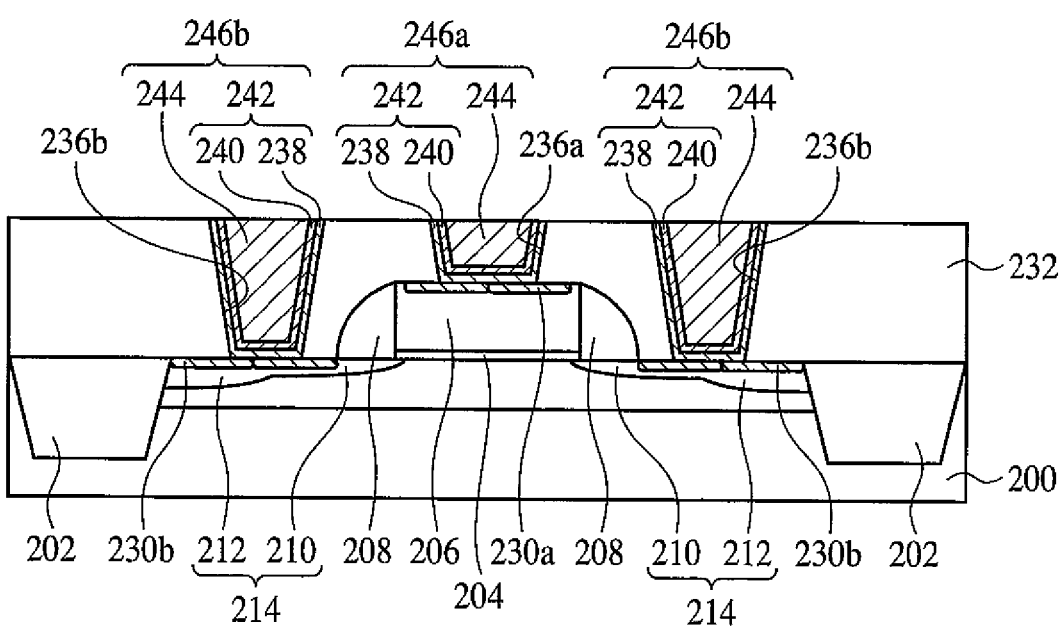

The steps after the barrier metal 254 has been formed are the same as in the case that the metal silicide film is formed of the nickel silicide film described with reference to FIGS. 56A and 56B, and their explanation will not be repeated.

As described above, depending on kinds of the metal silicide film, the barrier metal is formed by different processes.

That is, when the metal silicide film is formed of the nickel silicide film, the barrier metal is formed of the combination of Ti film formed by PVD (hereinafter suitably called "PVD-Ti film"), and TiN film formed by MOCVD (hereinafter suitably called "MOCVD-TiN film").

When the metal silicide film is formed of the cobalt silicide film, the barrier metal is formed of the combination of Ti film formed by plasma CVD using $TiCl_4$ as the raw material gas (hereinafter suitably called "$TiCl_4$-CVD-Ti film) and TiN film formed by thermal CVD using $TiCl_4$ as the raw material gas (hereinafter suitably called "$TiCl_4$-CVD-TiN film").

It is known that the barrier metal of the combination of the $TiCl_4$-CVD-Ti film and the $TiCl_4$-CVD-TiN film can decrease the contact resistance than the barrier metal of the combination of the PVD-Ti film and the MOCVD-TiN film. This is because the $TiCl_4$-CVD-Ti film has better coverage than the PVD-Ti film. This is also because the natural oxide film formed on the surface of the metal silicide film is removed due to the reduction by the $TiCl_4$ gas used as the raw material gas.

However, the film forming temperatures of the $TiCl_4$-CVD-Ti film and the $TiCl_4$-CVD-TiN film are high. That is, the film forming temperature of the $TiCl_4$-CVD-Ti film is 650° C., and the film forming temperature of the $TiCl_4$-CVD-TiN film is 680° C.

With the metal silicide film formed of the cobalt silicide film, even when heated up to above 700° C. including 700° C., the disadvantage of the contact resistance increase, etc. do not take place. Accordingly, as described above, the barrier metal of the combination of the $TiCl_4$-CVD-Ti film and the $TiCl_4$-CVD-TiN film is used.

In contrast to this, with the metal silicide film formed of the nickel silicide film, when heated up to high temperatures, the nickel silicide film agglomerates. When the nickel silicide film agglomerates, the contact resistance increases, and the contact resistance scatter becomes large. Accordingly, the barrier film of the combination of the $TiCl_4$-CVD-Ti film and the $TiCl_4$-CVD-TiN film, whose film forming temperatures are high, cannot be used.

Then, when the metal silicide film is formed of the nickel silicide film, generally, as described above, the barrier metal of the combination of the PVD-Ti film and the MOCVD-TiN film, whose film forming temperatures are low, is used. The film forming temperature of the PVD-Ti film is 250-400° C., and the film forming temperature of the MOCVD-TiN film is 400° C. The use of the barrier metal of the combination of such PVD-Ti film and MOCVD-TiN film can suppress the agglomeration of the nickel silicide film. However, in this case, the contact resistance often a little increases.

The inventors of the present application have made earnest studies of the process for forming the barrier metal which decreases the contact resistance and the contact resistance scatter in connecting a contact plug to the metal silicide film formed by salicide process using a Ni film or a Ni alloy film.

Based on their knowledge of the thermal stability of silicides, such as nickel platinum silicide, etc., they have obtained the idea that the barrier metal of the combination of the $TiCl_4$-CVD-Ti film and the MOCVD-TiN film is used to thereby decrease the contact resistance and the contact resistance scatter.

Figure 45:
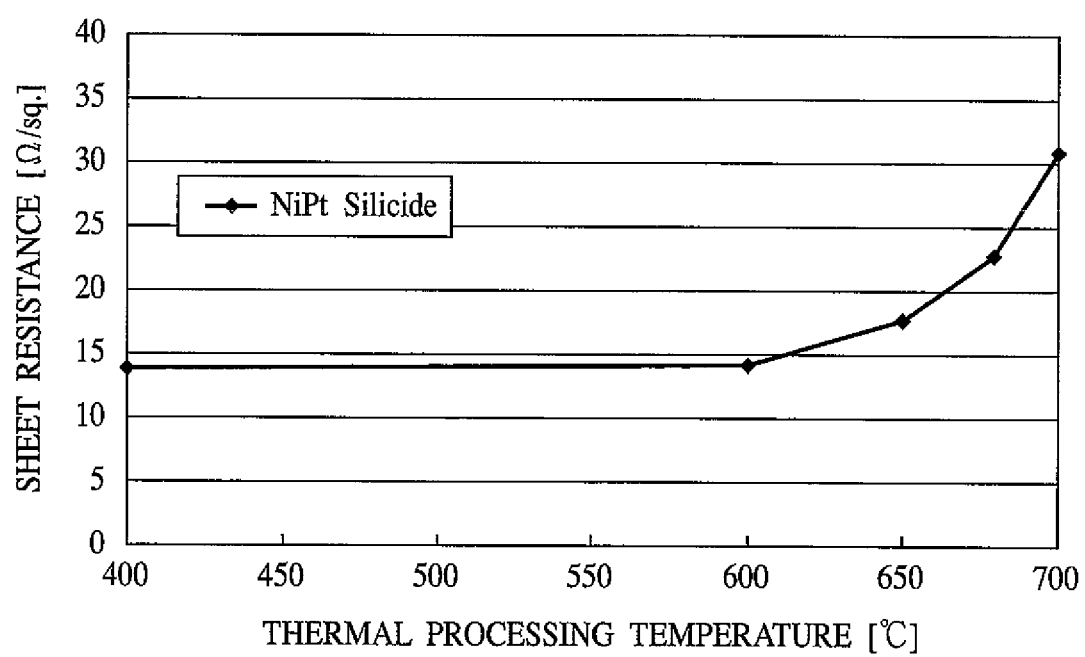
FIG. 45 is a graph of the thermal stability of the nickel platinum monosilicide.
Figure 46A:
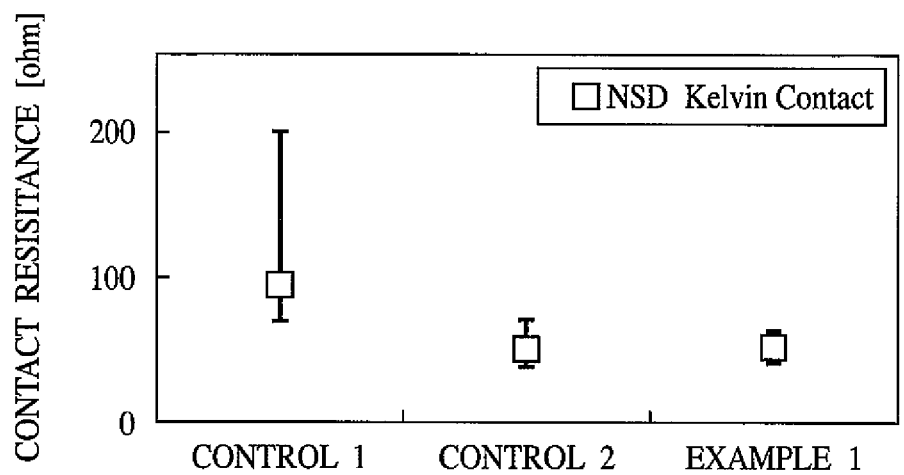
FIGS. 46A and 46B are graphs of the evaluation result of the method of manufacturing the semiconductor device according to the eighth embodiment of the present invention.
Figure 46B:
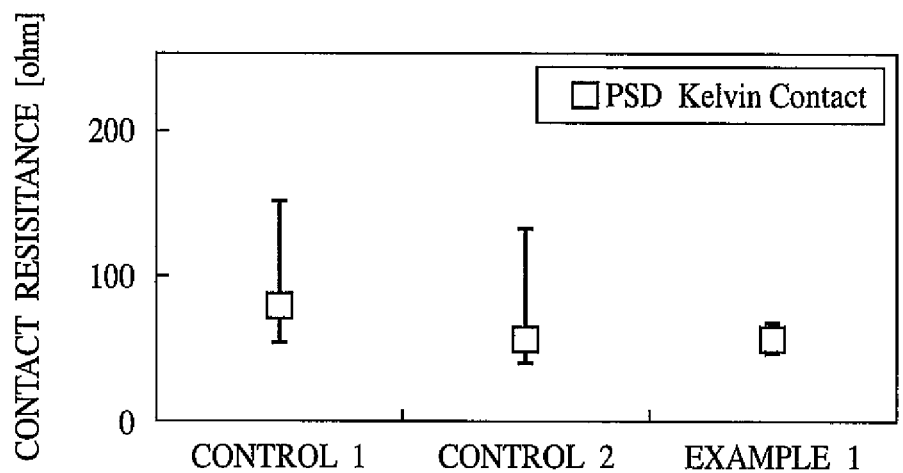

The method of manufacturing the semiconductor device according to an eighth embodiment of the present invention will be explained with reference to FIGS. 41A to 46B. FIGS. 41A-41C, 42A-42C, 43A-43C and 44A-44C are sectional views showing the steps of the method of manufacturing the semiconductor device according to the present embodiment. FIG. 45 is a graph of the thermal stability of the nickel platinum monosilicide. FIGS. 46A and 46B are graphs of the evaluation result of the method of manufacturing the semiconductor device according to the present embodiment.

The method of manufacturing the semiconductor device according to the present embodiment is characterized mainly in that a Ti film 124 is deposited by plasma CVD using $TiCl_4$ gas as the raw material gas, and a TiN film 126 is deposited by MOCVD, whereby a barrier metal 128 of the Ti film 124 and the TiN film 126 sequentially laid the latter on the former is formed.

First, by the usual MOS transistor manufacturing method, a MOS transistor 26 is formed on a silicon substrate 10. Then, by salicide process using a nickel platinum film, metal silicide films 116a, 116b of a nickel platinum monosilicide film is formed on a gate electrode 16 and source/drain diffused layers 24.

Figure 41A:
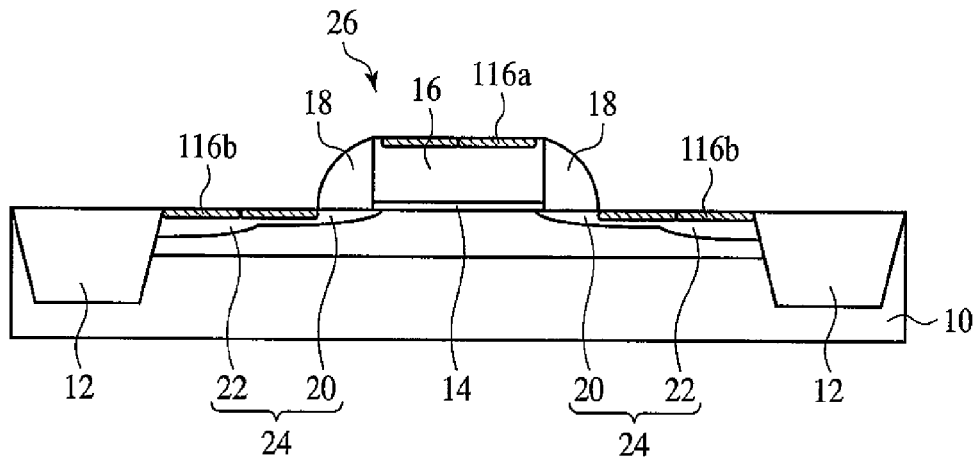
FIGS. 41A-41C, 42A-42C, 43A-43C and 44A-44C are sectional views showing the steps of the method of manufacturing the semiconductor device according to an eighth embodiment of the present invention.

FIG. 41A illustrates the MOS transistor 26 including the metal silicide film 116a, 116b formed on the gate electrode 16 and the source/drain diffused layers 24 by salicide process. As illustrated, a device region is defined by a device isolation region 12 on the silicon substrate 10. On the silicon substrate 10 with the device region defined, the gate electrode 16 of a polysilicon film or an amorphous silicon film is formed with a gate insulating film 14 formed therebetween. A sidewall insulating film 18 is formed on the side walls of the gate electrode 16. In the silicon substrate 10 on both sides of the gate electrode 16, the source/drain diffused layers 24 each formed of a shallow impurity diffused region 20 forming the extension region of the extension source/drain structure and a deep impurity diffused region 22 are formed. On the gate electrode 16, the metal silicide film 116a of the nickel platinum monosilicide film is formed. On the source/drain diffused layers 24, the metal silicide films 116b of the nickel platinum monosilicide film are formed. Thus, on the silicon substrate 10, the MOS transistor 26 including the gate electrode 16 and the source/drain diffused layers 24 is formed.

When the MOS transistor 26 is a PMOS transistor, $Si_{1-X}Ge_X$ films may be formed in the source/drain diffused layers 24, as in the method of manufacturing the semiconductor device according to the second embodiment. When the MOS transistor 26 is an NMOS transistor, $Si_{1-X}C_X$ films may be formed in the source/drain diffused layers 24, as in the method of manufacturing the semiconductor device according to the third embodiment.

Figure 41B:
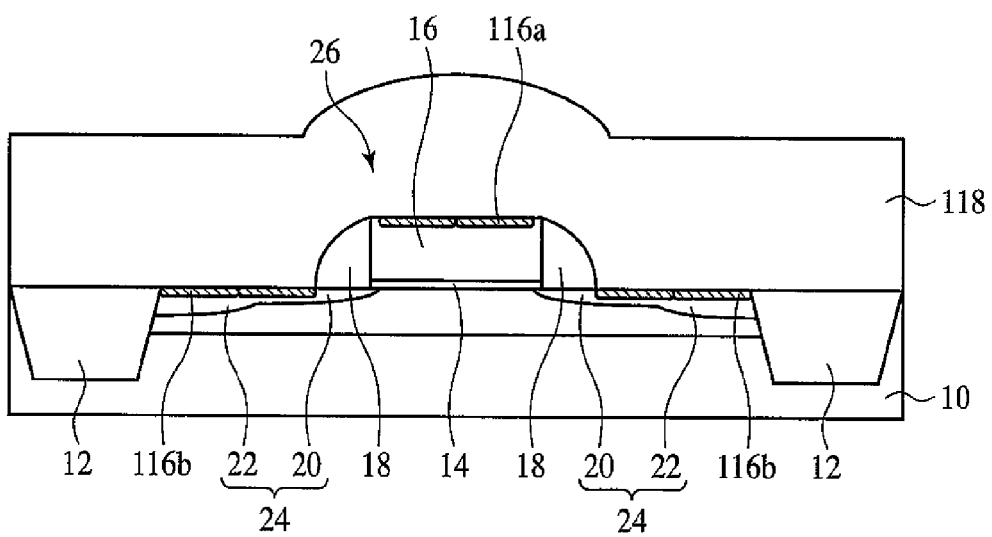

Then, an inter-layer insulating film 118 is formed on the entire surface by, e.g., CVD (see FIG. 41B).

Figure 41C:
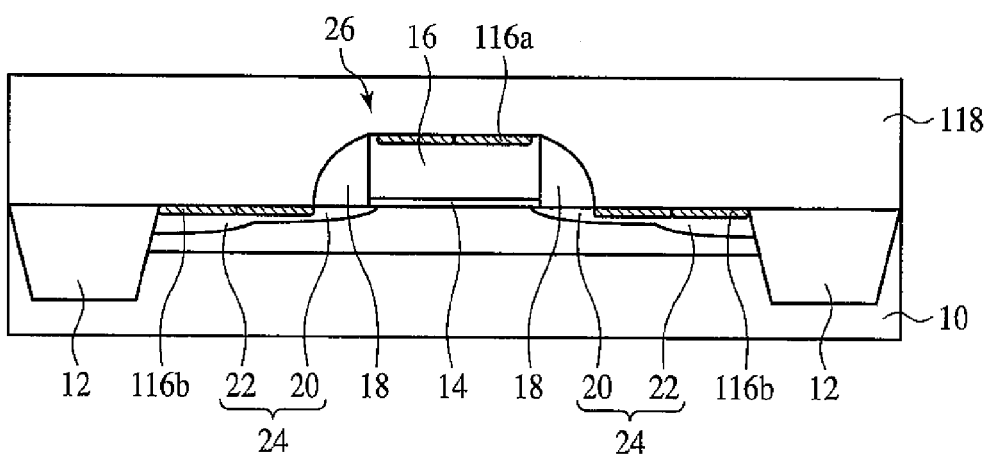

Next, the inter-layer insulating film 118 is planarized by, e.g., CMP (see FIG. 41C).

Next, a photoresist film 120 is formed on the inter-layer insulating film 118. Then, the photoresist film 120 is patterned by photolithography. Thus, a photoresist mask 120 for forming contact holes is formed (see FIG. 42A).

Figure 42A:
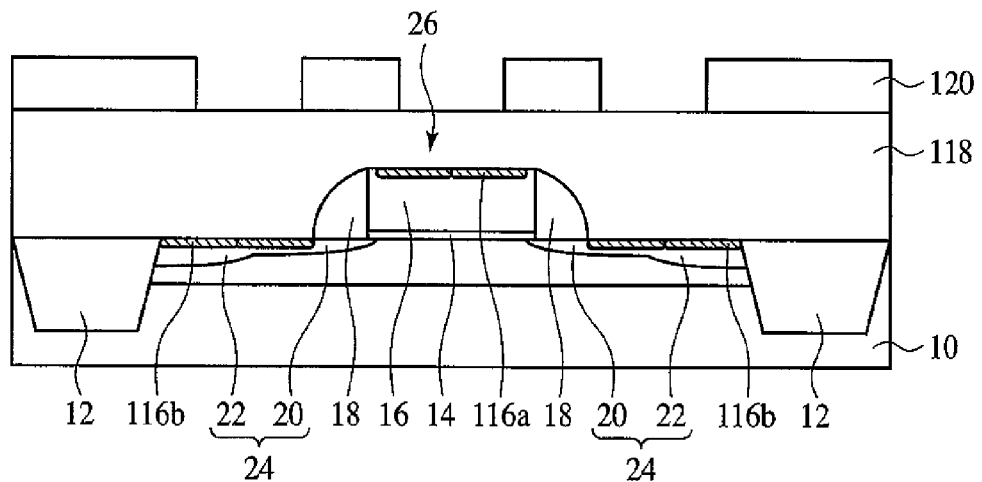
Figure 42B:
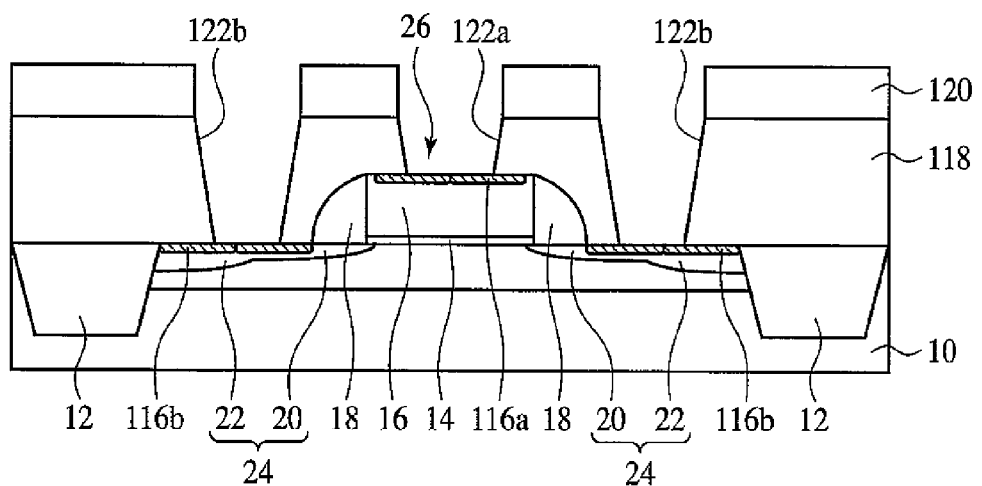

Next, with the photoresist film 120 as the mask, the inter-layer insulating film 118 is dry etched to thereby form in the inter-layer insulating film 118 a contact hole 122a down to the metal silicide film 116a and contact holes 122b down to the metal silicide films 116b (see FIG. 42B).

Figure 42C:
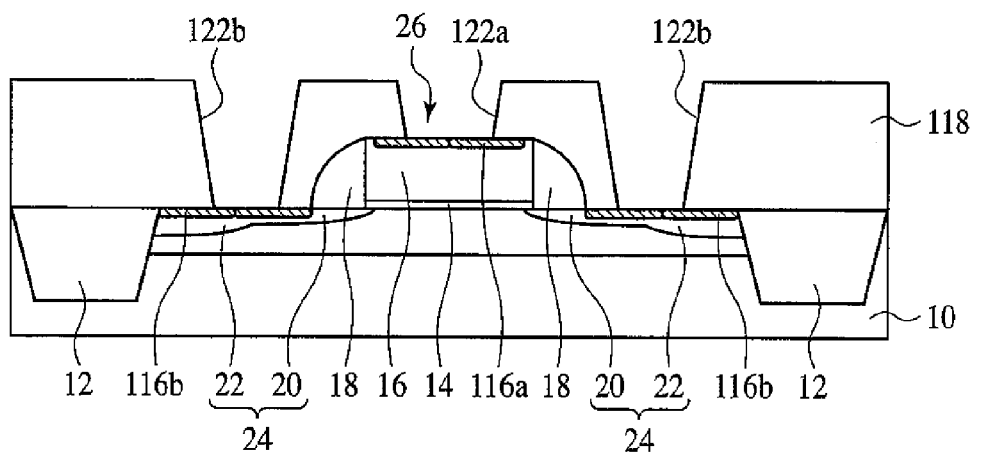

After the contact holes 122a, 122b have been formed, the photoresist film 120 used as the mask is removed (see FIG. 42C).

Figure 43A:
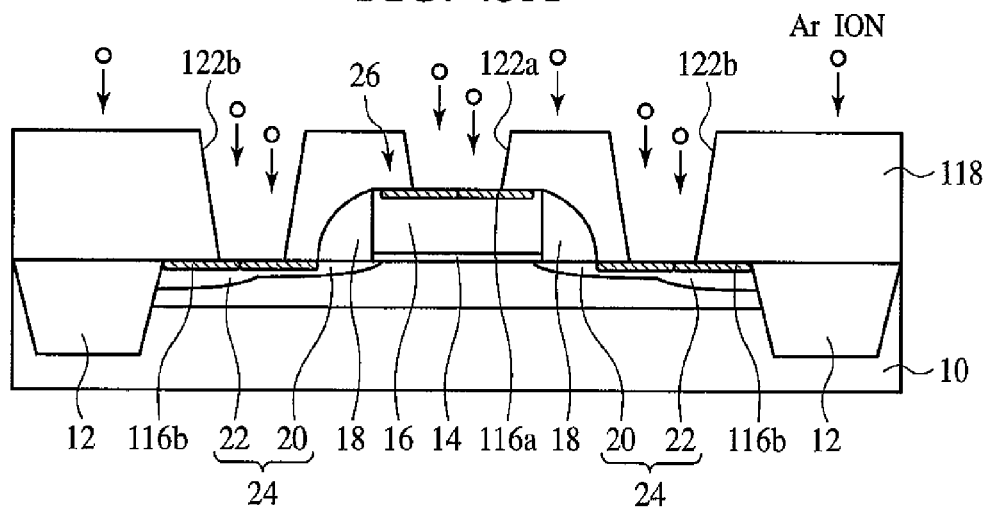

Then, the natural oxide film formed on the surface of the metal silicide film 116a, 116b is removed by, e.g., sputtering using Ar gas plasma (see FIG. 43A). The processing for removing the natural oxide film formed on the surface of the metal silicide film 116a, 116b is not essentially sputtering using Ar gas plasma. The natural oxide film may be removed by sputtering using plasma of the mixed gas of Ar gas and hydrogen ($H_2$) gas. By chemical processing using plasma of nitrogen trifluoride ($NF_3$) gas or plasma of $H_2$ gas, the natural oxide film may be reduced off.

Figure 43B:
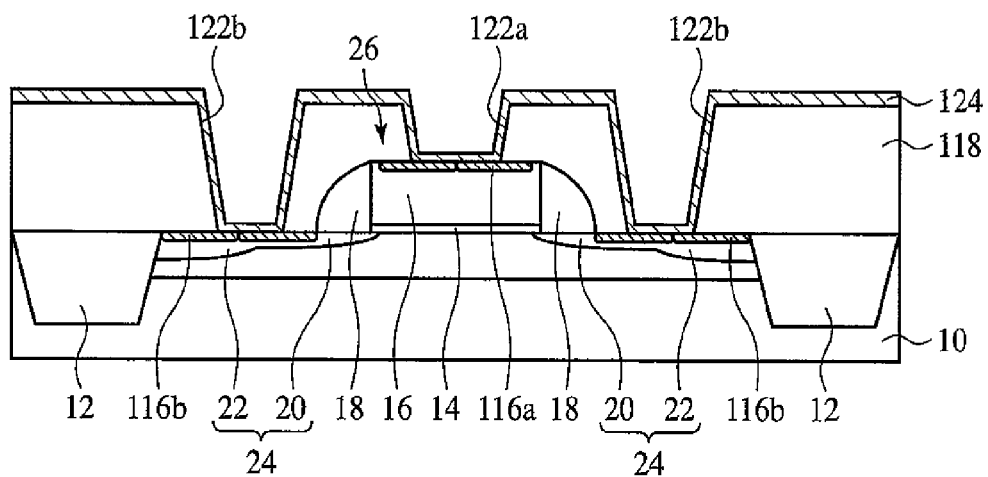

Then, on the inter-layer insulating film 118 and on the inside walls and the bottom surfaces of the contact holes 122a, 122b, the Ti film 124 is deposited by plasma CVD using $TiCl_4$ gas as the raw material gas (FIG. 43B). The film thickness of the Ti film 124 is, e.g., 1-10 nm. The conditions for forming the Ti film 124 are, $TiCl_4$ gas, $H_2$ gas and an inert gas as the raw material gas and below 650° C. including 650° C. film forming temperature, i.e., the substrate temperature, e.g., 150-650° C.

Next, the substrate is unloaded out of the film forming apparatus where the Ti film 124 has been formed by plasma CVD to be loaded into another film forming apparatus where the TiN film 126 is to be formed by MOCVD which will be described later (see FIG. 44A). In the meantime, the Ti film 124 is exposed to the atmospheric air, and a natural oxide film is formed on the surface of the Ti film 124.

As described above, it is usual to form the Ti film 124 to be formed by plasma CVD and the TiN film 126 to be formed by MOCVD in film forming apparatuses different from each other. Consequently, the Ti film 124 is exposed to the atmospheric air, and the natural oxide film is formed on the surface. Then, the following processing is made as the pre-processing for forming the TiN film 126 on the Ti film 124.

Figure 43C:
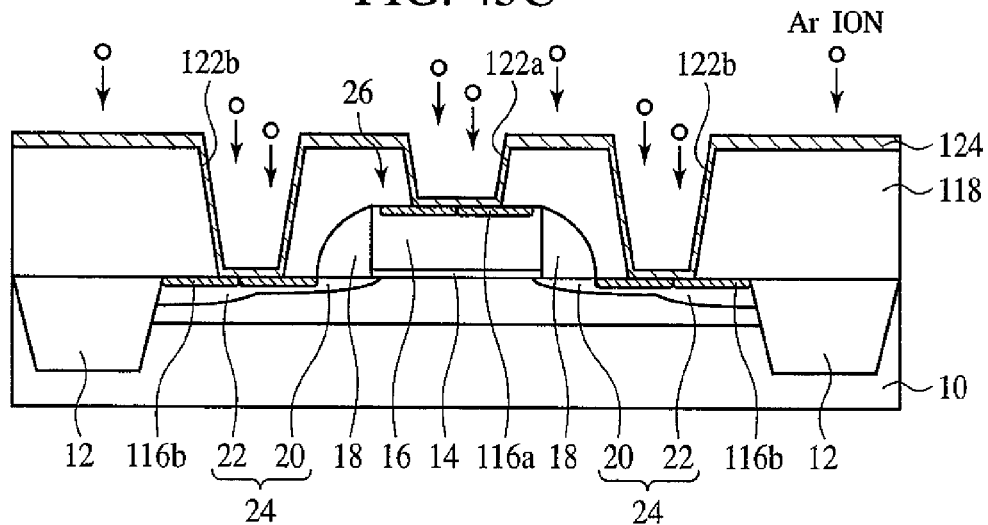

That is, the natural oxide film formed on the surface of the Ti film 124 is removed by, e.g., sputtering using Ar gas plasma (FIG. 43C). The processing for removing the natural oxide film formed on the surface of the Ti film 124 is not limited to sputtering using Ar gas plasma. The natural oxide film may be removed by sputtering using plasma of the mixed gas of Ar gas and $H_2$ gas. The natural oxide film may be reduced off by the chemical processing using $NF_3$ gas plasma or $H_2$ gas plasmas. The natural oxide film may be removed by making thermal processing of, e.g., 300-450° C. in the atmosphere of the gas containing $H_2$ gas or ammonia ($NH_3$) gas.

When the Ti film 124 to be formed by plasma CVD and the TiN film 126 to be formed by MOCVD can be formed in the same film forming apparatus, the above-described pre-processing is unnecessary.

Figure 44A:
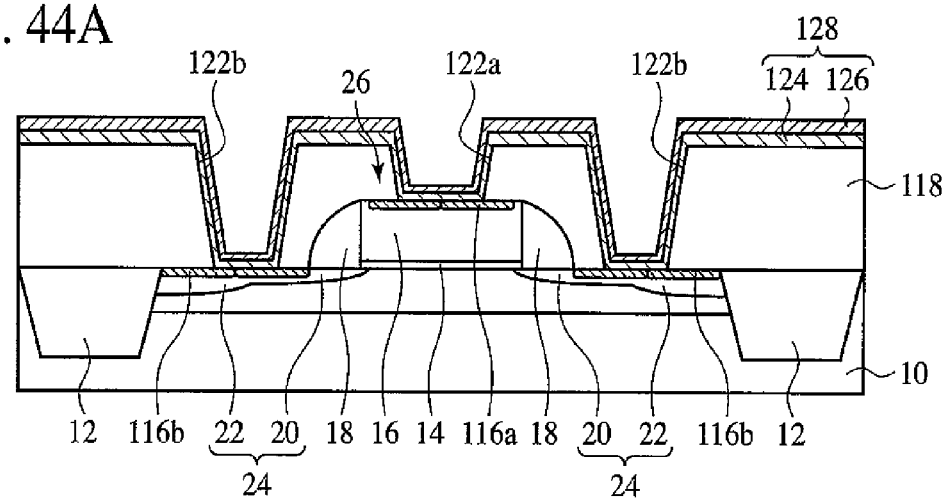

Then, on the Ti film 124, the TiN film 126 is deposited by MOCVD (see FIG. 44A). The film thickness of the TiN film 126 is, e.g., 1-10 nm. The conditions for forming the TiN film 126 are, e.g., tetrakis(dimethylamino)titanium (TDMAT) as the raw material gas and below 450° C. including 450° C. film forming temperature, i.e., the substrate temperature, e.g., 300-450° C.

The TiN film 126 may be formed by repeating the step of depositing a TiN film of, e.g., a 0.2-5 nm-thickness by MOCVD and the step of removing by plasma processing the compound containing carbon in the deposited TiN film. In this case, the conditions for forming the TiN film are the same as, e.g., those described above. The plasma processing for removing the compound containing carbon uses plasma of a gas of at least one or more of, e.g., Ar gas, nitrogen ($N_2$) gas, $H_2$ gas, helium (He) gas and $NH_3$ gas.

Thus, a barrier metal 128 of the Ti film 124 and the TiN film 126 sequentially laid the latter on the former is formed (see FIG. 44A). That is, in the present embodiment, the barrier metal 128 of the combination of the $TiCl_4$-CVD Ti film 124 and the MOCVD-TiN film 126 is formed. The barrier metal 128 stabilizes the contact resistance between contact plugs 132a, 132b which will be described later and the metal silicide films 116a, 116b. The barrier metal 128 also suppresses the reaction between the metal silicide films 116a, 116b and a W film 130 which will be described later and suppresses the diffusion of the W of the W film 130. Furthermore, the barrier metal 128 also functions as an adhesion layer for improving the adhesion between the W film 130 and the metal silicide films 116a, 116b.

Figure 44B:
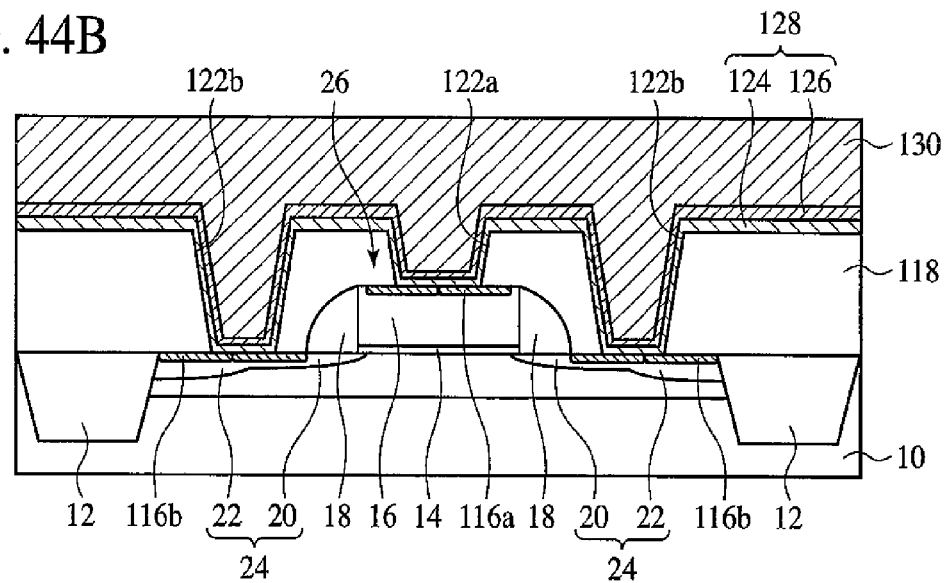
Figure 44C:
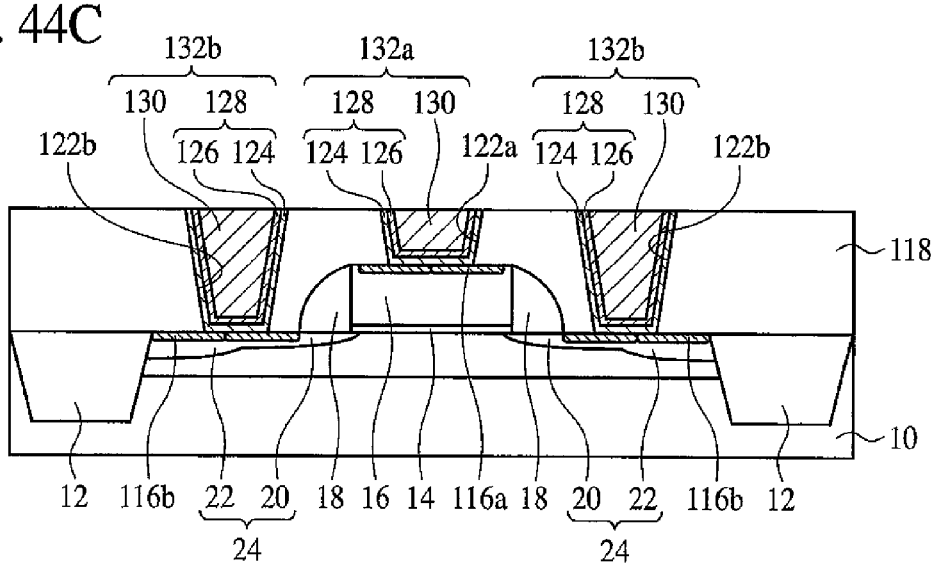

Then, on the barrier metal 128, the W film 130 is deposited by, e.g., thermal CVD (see FIG. 44B). The film thickness of the W film 130 is, e.g., 100-300 nm. The conditions for forming the W film 130 are, tungsten hexafluoride ($WF_6$), silane ($SiH_4$) gas and $H_2$ gas as the raw material gas and below 500° C. including 500° C. film forming temperature, i.e., the substrate temperature, e.g., 200-500° C.

Then, the W film 130 and the barrier metal 128 are polished by, e.g., CMP until the surface of the inter-layer insulating film 118 is exposed. Thus, the contact plugs 132a, 132b formed of the barrier metal 128 and the W film 130 are buried in the contact holes 122a, 122b (see FIG. 44C). The contact plugs 132a, 132b are connected respectively to the metal silicide films 116a, 116b.

As described above, the method of manufacturing the semiconductor device according to the present embodiment is characterized mainly in that the Ti film 124 is deposited by plasma CVD using $TiCl_4$ gas as the raw material gas, and the TiN film 126 is deposited by MOCVD, whereby the barrier metal 128 of the Ti film 124 and the TiN film 126 is formed.

The film forming temperature for forming the Ti film 124 by plasma CVD using $TiCl_4$ gas as the raw material gas is below 650° C. including 650° C. The film forming temperature for forming the TiN film 126 by MOCVD is below 450° C. including 450° C. Accordingly, in the present embodiment, when the barrier metal 128 is formed, the maximum temperature up to which the metal silicide film 116a, 116b is heated can be below 650° C. including 650° C.

In the method of manufacturing the semiconductor device according to the present embodiment, as described above, the barrier metal 128 is formed by the film forming process wherein the maximum temperature up to which the metal silicide film 116a, 116b is heated is below 650° C. including 650° C., based on the following evaluation of the thermal stability of nickel platinum monosilicide.

It is known that nickel platinum monosilicide, which is formed of nickel monosilicide with platinum added, has the thermal stability improved in comparison with nickel monosilicide without platinum added (refer to, e.g., Non-Patent Reference 1).

FIG. 45 is a graph of the measured thermal stability of nickel platinum monosilicide. The samples for measuring the thermal stability were prepared by depositing a 10 nm-thickness nickel platinum film and making thermal processing of 400° C. and 30 seconds in a nitrogen atmosphere to form a nickel platinum monosilicide film. Thermal processing were made on these samples by RTA in a nitrogen atmosphere at different thermal processing temperatures, and the sheet resistance was measured on the silicide film of the respective samples as thermally processed. The thermal processing temperature is taken on the horizontal axis of the graph, and the sheet resistance is taken on the vertical axis.

As evident from the graph of FIG. 45, when the thermal processing temperature is 650° C., a sheet resistance increase is observed, but the increase is still small. The sheet resistance increase at this time was 26%.

On the other hand, when the thermal processing temperature is 680° C., the sheet resistance largely increases. The sheet resistance increase at this time was 68%.

Accordingly, with the metal silicide film formed of nickel platinum monosilicide film, when the TiN film is formed by thermal CVD using $TiCl_4$ gas at 680° C. film forming temperature, the metal silicide film becomes highly resistive. Thus, with the barrier metal formed of the combination of the $TiCl_4$-CVD-Ti film and the $TiCl_4$-CVD-TiN film, the contact resistance increases.

In contrast to this, in the method of manufacturing the semiconductor device according to the present embodiment, the Ti film 124 is deposited by plasma CVD using $TiCl_4$ as the raw material gas, and the TiN film 126 is deposited by MOCVD, whereby when the barrier metal 128 is formed, the maximum temperature at which the metal silicide films 116*a*, 116*b* are heated can be below 650° C. including 650° C. Accordingly, the metal silicide films 116*a*, 116*b* is prevented from being high resistive. Thus, according to the present embodiment, when the contact plugs 132*a*, 132*b* connected to the metal silicide films 116*a*, 116*b* are formed, the contact resistance can be decreased.

(Evaluation Result)

The result of the evaluation of the method of manufacturing the semiconductor device according to the present embodiment will be explained with reference to FIG. 46.

The contact resistance was measured on Example 1, Control 1 and Control 2, which will be described below.

In Example 1, a contact plug was formed by the method of manufacturing the semiconductor device according to the present embodiment. That is, the barrier metal of the contact plug was formed of the combination of the $TiCl_4$-CVD-Ti film and the MOCVD-TiN film.

In Control 1, the barrier metal of the contact plug was formed of the combination of the PVD-Ti film and the MOCVD-TiN film.

In Control 2, the barrier metal of the contact plug was formed of the combination of $TiCl_4$-CVD-Ti film and $TiCl_4$-CVD-TiN film.

The samples used in the contact resistance measurement were prepared as follows. First, silicon substrates equivalent to the source/drain of the NMOS transistor and the source/drain of the PMOS transistor were prepared for each case. On such silicon substrate, a nickel platinum monosilicide film was formed by the silicidation process using a nickel platinum film, and then a contact plug connected to the nickel platinum monosilicide film was formed. The diameter of the contact plug was 90 nm. The contact plug was connected by a borderless contact.

FIG. 46A shows the results of the contact resistance measurement on the samples equivalent to the source/drain of the NMOS transistor. FIG. 46B shows the results of the contact resistance measurement on the samples equivalent to the source/drain of the PMOS transistor.

As evident from FIGS. 46A and 46B, Example 1 has lower contact resistances and the smaller contact resistance scatter of both the NMOS transistor source/drain and the PMOS transistor source/drain in comparison with those of Control 1 and Control 2.

As described above, according to the present embodiment, the Ti film 124 is deposited by plasma CVD using $TiCl_4$ gas as the raw material gas, and the TiN film 126 is deposited by MOCVD, whereby the barrier metal 128 is formed of the Ti film 124 and the TiN film 126 sequentially laid the latter on the former, which allows the maximum temperature at which the metal silicide films 116*a*, 116*b* are heated when the barrier metal 128 is formed to be below 650° C. including 650° C. Thus, according to the present embodiment, the contact resistance can be decreased, and the contact resistance scatter can be decreased.

Modified Embodiments

The present invention is not limited to the above-described embodiments and can cover other various modifications.

For example, in the first to the third embodiments described above, the thermal processing for the silicidation is made by RTA but is not limited to RTA. For example, as the thermal processing for the silicidation, furnace annealing, spike annealing, flash annealing or others may be made. When the two-step thermal processing is made, as the first thermal processing and the second thermal processing, suitable combinations of furnace annealing, spike annealing, flash annealing, etc. may be made.

In the first to the third embodiments described above, the NiPt film 28 is formed by sputtering but may not be formed essentially by RTA. The NiPt film 28 may be formed by vapor deposition such as, e.g., electron beam evaporation or others other than sputtering.

In the first to the sixth embodiments described above, the protective film 30 is formed on the NiPt film 28, but the protective film 30 may not be formed.

In the first to the third embodiments described above, the NiPt film 28 is formed directly on the gate electrodes 16, 16*n*, 16*p*, the source/drain diffused layers 24, 24*n*, 24*p*, the $Si_{1-X}Ge_X$ films 76*a*, 76*b* and the $Si_{1-X}C_X$ films 86*a*, 86*b*, but the NiPt film 28 may be formed on the gate electrode 16, etc. with a pure Ni film containing no Pt formed therebetween as the base of the NiPt film 28. The NiPt film 28 is formed via the pure Ni film containing no Pt, whereby the NiSi thermal stability improvement owing to the Pt addition is retained while the resistance increase due to the Pt addition can be suppressed.

The NiPt film 28 may contain at least one of titanium (Ti), hafnium (Hf), tantalum (Ta), zirconium (Zr), tungsten (W), cobalt (Co), chrome (Cr), palladium (Pd), vanadium (V), niobium (Nb), molybdenum (Mo) and rhenium (Re). The NiPt film 28 contains these metals, whereby the thermal stability of the nickel silicide film can be improved.

In the first to the third embodiments described above, the gate electrode and the source/drain diffused layers are silicided by using the NiPt film. However, the present invention is widely applicable to siliciding a semiconductor layer containing silicon by using the NiPt film and removing the unreacted NiPt film.

In the fourth to the seventh embodiments described above, the $Si_{1-X}Ge_X$ films 76b are formed in the source/drain diffused layers 24p of the PMOS transistor 26p. However, the $Si_{1-X}C_X$ films 86b may be formed in the source/drain diffused layers 24n of the NMOS transistor 26n in the same way as in the third embodiment.

In the fourth to the sixth embodiments described above, the silicidation is made by using the NiPt film 28, but the Ni alloy film used in the silicidation is not limited to the NiPt film 28. Ni alloy film, such as NiTa film, NiW film, NiRe film or others, is used in place of the NiPt film 28 to make the silicidation, and nickel alloy monosilicide film may be formed. The silicidation using such Ni alloy film can also improve the thermal stability of the formed silicide film. The composition ratio of the Ta of the NiTa film is, e.g., 1-10 atom %. The composition ratio of the W of the NiW film is, e.g., 1-10 atom %. The composition ratio of the Re of the NiRe film is, e.g., 1-10 atom %.

Also in the fourth, the fifth and the seventh embodiment described above, in the same way as in the sixth embodiment described above, the activation ratio of the dopant impurity implanted in the extension regions 20n, 20p may be increased by making the flash lamp annealing or laser annealing after forming the Ni(Pt)Si films 34a, 34b and the $Ni(Pt)Si_{1-X}Ge_X$ films 80a/80b.

Also in the fourth to the sixth embodiments described above, in place of the NiPt film 28 formed by sputtering, the metal layer film 112 is alloyed by flash lamp annealing or laser annealing to thereby form the NiPt film 114 in the same way as in the seventh embodiment described above.

In the eighth embodiment described above, nickel platinum monosilicide film is formed as the metal silicide films 116a, 116b by the silicidation process using nickel platinum film, but the metal silicide films 116a, 116b is not limited to nickel platinum monosilicide film. For example, as the metal silicide films 116a, 116b, nickel molybdenum monosilicide film, nickel rhenium monosilicide film, nickel tantalum monosilicide film, nickel tungsten monosilicide film, nickel platinum rhenium monosilicide film or nickel monosilicide film may be formed by the silicidation process using nickel alloy film or nickel film.

In the eighth embodiment described above, the TiN film 126 is formed by MOCVD using TDMAT gas as the raw material gas. The TiN film 126 may be formed by MOCVD using the gas of various organic titanium compounds in place of TDMAT as the raw material gas.

In the eight embodiment described above, the W film 130 is formed as the metal film forming the contact plugs 132a, 132b. In place of the W film 120, various metal films may be formed.

What is claimed is:

1. A method of manufacturing a semiconductor device comprising:
    forming a transistor including a gate electrode above a semiconductor substrate and a source/drain diffused layer in the semiconductor substrate;
    forming a nickel film containing no platinum over the semiconductor substrate, covering the gate electrode and the source/drain diffused layer;
    forming a nickel platinum film over the nickel film by sputtering using a nickel target with platinum;
    after forming the nickel platinum film making a first thermal processing to react the nickel film and the nickel platinum film with the source/drain diffused layer to form a nickel platinum silicide film; and
    removing an unreacted part of the nickel platinum film using a chemical liquid, the chemical liquid being an acid chemical liquid containing sulfuric acid and hydrogen peroxide, an acid chemical liquid containing hydrochloric acid and hydrogen peroxide, or an alkaline chemical liquid containing ammonia and hydrogen peroxide.

2. The method of manufacturing the semiconductor device according to claim 1, wherein
    a temperature of the chemical liquid is from 71° C. to 150° C.

3. The method of manufacturing the semiconductor device according to claim 1, further comprising after the removing the unreacted part of the nickel platinum film,
    making a second thermal processing.

4. The method of manufacturing the semiconductor device according to claim 1, wherein
    when the chemical liquid is the acid chemical liquid containing sulfuric acid and hydrogen peroxide, the chemical liquid is a chemical liquid of a mixture of sulfuric acid and hydrogen peroxide,
    when the chemical liquid is the acid chemical liquid containing hydrochloric acid and hydrogen peroxide, the chemical liquid is a chemical liquid of a mixture of hydrochloric acid, hydrogen peroxide and water, and
    when the chemical liquid is the alkaline chemical liquid containing ammonia and hydrogen peroxide, the chemical liquid is a chemical liquid of a mixture of ammonia, hydrogen peroxide and water.

5. The method of manufacturing the semiconductor device according to claim 4, wherein
    when the chemical liquid is the chemical liquid of the mixture of sulfuric acid and hydrogen peroxide, a weight % concentration of sulfuric acid of the chemical liquid is 50-95%, and a weight % concentration of hydrogen peroxide of the chemical liquid is 5-50%,
    when the chemical liquid is the chemical liquid of the mixture of hydrochloric acid, hydrogen peroxide and water, a weight % concentration of hydrochloric acid of the chemical liquid is 0.1-25%, and a weight % concentration of hydrogen peroxide of the chemical liquid is 0.1-25%, and a weight % concentration of water of the chemical liquid is 50-99.8%, and
    when the chemical liquid is the chemical liquid of the mixture of ammonia, hydrogen peroxide and water, a weight % concentration of ammonia of the chemical liquid is 0.1-25%, a weight % concentration of hydrogen peroxide of the chemical liquid is 0.1-25%, and a weight % concentration of water of the chemical liquid is 50-99.8%.

6. The method of manufacturing the semiconductor device according to claim 1, wherein
    the nickel platinum film contains platinum by 1-10 atom %.

7. The method of manufacturing the semiconductor device according to claim 1, wherein
    pH of the acid chemical liquid is 4 or below.

* * * * *